(12) United States Patent
Horne et al.

(10) Patent No.: US 7,521,097 B2
(45) Date of Patent: Apr. 21, 2009

(54) REACTIVE DEPOSITION FOR ELECTROCHEMICAL CELL PRODUCTION

(75) Inventors: Craig R. Horne, Sunnyvale, CA (US); William E. McGovern, LaFayette, CA (US); Robert B. Lynch, Livermore, CA (US); Ronald J. Mosso, Fremont, CA (US)

(73) Assignee: NanoGram Corporation, Milpitas, CA (US)

( * ) Notice: Subject to any disclaimer, the term of this patent is extended or adjusted under 35 U.S.C. 154(b) by 0 days.

(21) Appl. No.: 10/854,931

(22) Filed: May 27, 2004

(65) Prior Publication Data

US 2005/0016839 A1    Jan. 27, 2005

Related U.S. Application Data

(60) Provisional application No. 60/476,451, filed on Jun. 6, 2003, provisional application No. 60/479,698, filed on Jun. 19, 2003.

(51) Int. Cl.
  C23C 8/00     (2006.01)
  C23C 14/30    (2006.01)
  B05D 5/12     (2006.01)
  H01M 8/00     (2006.01)

(52) U.S. Cl. .............. 427/585; 427/596; 427/115; 427/248.1; 429/12; 429/122

(58) Field of Classification Search ......... 427/585, 427/596, 115, 248.1; 429/12, 34, 40, 122, 429/209
See application file for complete search history.

(56) References Cited

U.S. PATENT DOCUMENTS 3,806,570 A    4/1974  Flamenbaum et al.
3,883,336 A    5/1975  Randall
3,923,484 A    12/1975 Randall
3,932,162 A    1/1976  Blankenship
3,934,061 A    1/1976  Keck et al.
4,011,067 A    3/1977  Carey (Continued)

FOREIGN PATENT DOCUMENTS

WO    WO 99/61244    2/1999

(Continued)

OTHER PUBLICATIONS

"Crystalline" as defined by www.dictionary.com, p. 1 of 1.*

(Continued)

Primary Examiner—Timothy H Meeks
Assistant Examiner—David Turocy
(74) Attorney, Agent, or Firm—Dardi & Associates, PLLC; Peter S. Dardi

(57) ABSTRACT

Light reactive deposition can be adapted effectively for the deposition of one or more electrochemical cell components. In particular, electrodes, electrolytes, electrical interconnects can be deposited form a reactive flow. In some embodiments, the reactive flow comprises a reactant stream that intersects a light beam to drive a reaction within a light reactive zone to produce product that is deposited on a substrate. The approach is extremely versatile for the production of a range of compositions that are useful in electrochemical cells and fuel cell, in particular. The properties of the materials, including the density and porosity can be adjusted based on the deposition properties and any subsequent processing including, for example, heat treatments.

10 Claims, 16 Drawing Sheets

U.S. PATENT DOCUMENTS

| | | | |
|---|---|---|---|
| 4,038,370 A | 7/1977 | Tokimoto et al. | |
| 4,113,844 A | 9/1978 | Tokimoto et al. | |
| 4,140,912 A | 2/1979 | Bressan et al. | |
| 4,388,098 A * | 6/1983 | Takahashi et al. | 65/157 |
| 4,476,198 A | 10/1984 | Ackerman et al. | |
| 4,510,212 A | 4/1985 | Fraioli | |
| 4,567,117 A | 1/1986 | Patel et al. | |
| 4,581,248 A | 4/1986 | Roche | |
| 4,681,640 A | 7/1987 | Stanley | |
| 4,735,677 A | 4/1988 | Kawachi et al. | |
| 4,761,349 A | 8/1988 | McPheeters et al. | |
| 4,782,787 A | 11/1988 | Roche | |
| 4,814,289 A | 3/1989 | Baeurle | |
| 4,868,005 A | 9/1989 | Ehrlich et al. | |
| 4,991,000 A * | 2/1991 | Bone et al. | 257/686 |
| 5,060,595 A | 10/1991 | Ziv et al. | |
| 5,085,166 A | 2/1992 | Oka et al. | |
| 5,108,952 A | 4/1992 | Matsuhashi | |
| 5,174,826 A | 12/1992 | Mannava et al. | |
| 5,230,849 A * | 7/1993 | Hsu | 264/104 |
| 5,246,745 A | 9/1993 | Baum et al. | |
| 5,276,012 A | 1/1994 | Ushida et al. | |
| 5,306,447 A | 4/1994 | Marcus et al. | |
| 5,385,594 A | 1/1995 | Kanamori et al. | |
| 5,441,822 A | 8/1995 | Yamashita et al. | |
| 5,496,655 A * | 3/1996 | Lessing | 429/34 |
| 5,503,703 A * | 4/1996 | Dahotre et al. | 156/272.8 |
| 5,514,350 A | 5/1996 | Kear et al. | |
| 5,551,966 A | 9/1996 | Hirose et al. | |
| 5,556,442 A | 9/1996 | Kanamori et al. | |
| 5,622,750 A | 4/1997 | Kilian et al. | |
| 5,652,021 A | 7/1997 | Hunt et al. | |
| 5,744,777 A | 4/1998 | Bernecki et al. | |
| 5,753,385 A * | 5/1998 | Jankowski et al. | 429/44 |
| 5,858,465 A | 1/1999 | Hunt et al. | |
| 5,863,604 A | 1/1999 | Hunt et al. | |
| 5,874,134 A | 2/1999 | Rao et al. | |
| 5,885,904 A | 3/1999 | Mehta et al. | |
| 5,938,979 A | 8/1999 | Kambe et al. | |
| 5,958,348 A | 9/1999 | Bi et al. | |
| 5,997,956 A | 12/1999 | Hunt et al. | |
| 5,998,054 A * | 12/1999 | Jones et al. | 429/34 |
| 6,007,945 A | 12/1999 | Jacobs et al. | |
| 6,011,981 A | 1/2000 | Alvarez et al. | |
| 6,013,318 A | 1/2000 | Hunt et al. | |
| 6,032,871 A | 3/2000 | Borner et al. | |
| 6,074,888 A | 6/2000 | Tran et al. | |
| 6,097,144 A | 8/2000 | Lehman | |
| 6,193,936 B1 | 2/2001 | Gardner et al. | |
| 6,254,928 B1 | 7/2001 | Doan | |
| 6,280,802 B1 | 8/2001 | Akedo et al. | |
| 6,322,920 B1 * | 11/2001 | Tomson | 429/34 |
| 6,379,485 B1 | 4/2002 | Borglum | |
| 6,558,831 B1 | 5/2003 | Doshi et al. | |
| 6,703,152 B2 | 3/2004 | Komiya et al. | |
| 6,723,435 B1 | 4/2004 | Horne et al. | |
| 2001/0051118 A1 | 12/2001 | Mosso et al. | |
| 2002/0045082 A1* | 4/2002 | Marsh | 429/30 |
| 2002/0192137 A1* | 12/2002 | Chaloner-Gill et al. | 423/306 |
| 2003/0022052 A1* | 1/2003 | Kearl | 429/34 |
| 2003/0072989 A1 | 4/2003 | Lee et al. | |
| 2003/0117691 A1 | 6/2003 | Bi et al. | |
| 2003/0118841 A1 | 6/2003 | Horne et al. | |
| 2003/0203205 A1 | 10/2003 | Bi | |
| 2003/0228415 A1 | 12/2003 | Bi et al. | |
| 2004/0038808 A1 | 2/2004 | Hampden-Smith et al. | |
| 2005/0042152 A1 | 2/2005 | Gardner et al. | |

FOREIGN PATENT DOCUMENTS

| | | |
|---|---|---|
| WO | WO 99/23189 | 5/1999 |
| WO | WO 02/32588 | 4/2002 |
| WO | WO 02/32588 A1 * | 4/2002 |
| WO | 02089233 A2 | 11/2002 |

OTHER PUBLICATIONS

Anderson et al., Solid oxide fuel cells, Ch 7, Sec 7.3 (2003).

Barbarossa et al., High-silica cascaded three-waveguide couplers for wideband filtering by Flame Hydrolysis on SI, SPIE vol. 1583 Integrated Optical Circuits (1991) pp. 122-128.

Barbarossa et al., High-silica low-loss three waveguide couplers on Si by Flame Hydrolysis Deposition, SPIE vol. 1513 Glasses for Optoelectronics II (1991) pp. 37-43.

Barbarossa et al., Optical damage threshold of $P_2O_5$ and $GeO_2$-$P_2O_5$-doped silica waveguides, SPIE vol. 1794 Integrated Optical Circuits II (1992) pp. 185-190.

Barbarossa et al., Effect of temperature gradient on sintering kinetics of doped silica waveguides by flame hydrolysis deposition, SPIE vol. 1794 Integrated Optical Circuits II (1992) pp. 191-197.

Besling et al., Laser-Induced Chemical Vapor Deposition of Nanostructured Silicon Carbonitride Thin Films, 1997, pp. 544-553, Laboratory for Applied Inorganic Chemistry, Delft University of Technology, Julianalaan 136, 2628 BL Delft, The Netherlands.

Bi et al., U.S. Appl. No. 09/715,935, filed Nov. 17, 2000, entitled "Coating Formation by Reactive Deposition".

Bilenchi et al., $CO_2$ Laser-Assisted Deposition of Boron and Phosphorus-Doped Hydrogenated Amorphous Silicon, American Institute of Physics 1985, pp. 279-281.

Bilenchi et al., Hydrogenated Amorphous Silicon Growth by $CO_2$ Laser Photodissociation of Silane, American Institute of Physics 1982, pp. 6479-6481.

Bornard et al., $LiNbO_3$ Thin Films Deposited on Si Substrates: a Morphological Development Study, Materials Chemistry and Physics, pp. 571-577, Elsevier Science B.V. 2002.

Bryan et al, U.S. Appl. No. 10/219,019, filed Aug. 14, 2002, entitled "Reactive deposition for the formation of chip capacitors".

Carrillo et al., Application of mist pyrolysis method to preparation of $Ni/ZrO_2$ anode catalyst for SOFC type reactor, Materials Research Bulletin 36 (2001) 1017-1027.

Center for Nano Particle Control; Web Site Mansoo Choi, Associate Professor of Mechanized Engineering, Seoul National University, Jun. 2000.

Choy et al., The development of intermediate-temperature solid oxide fuel cells for the next millennium, Journal of Power Sources 71 (1998) 361-369.

Choy, Innovative processing of films and nanocrystalline powders, Process Principles and Applications of Novel and Cost-Effective ESAVD Based Methods, (2002) 32-67.

Ichinose et al., Deposition of $LaMO_3$ (M=Co, Cr, Al) films by spray pyrolysis in inductively coupled plasma, Journal of Crystal Growth, pp. 59-64, Elsevier Science B.V. 1994.

Ichinose et al., Deposition of $LaMO_3$ (M=Co, Cr, Al)-Oriented films by spray combustion flame technique, Jpn. J. Appl. Phys. vol. 33 (1994), pp. 5907-5910.

Jervis, Metal Film Deposition by Gas-Phase Laser Pyrolysis of Nickel Tetracarbonyl, American Institute of Physics 1985, pp. 1400-1401.

Karthikeyan et al., Plasma spray synthesis of nanomaterial powders and deposits, Materials Science and Engineering A238 (1997) 275-286.

Kim et al., Deposition of MgO Thin Films by Modified Electrostatic Spray Pyrolysis Method, Thin Solid Films 376 (2000), pp. 110-114, Elsevier Science S.A. 2000.

Krumdieck et al., YSZ layers by pulsed-MOCVD on solid oxide fuel cell electrodes, Surface and Coatings Technology 167 (2003) 226-233.

Lebedev et al., Laser distillation-deposition synthesis of silica glasses with variable concentration of oxygen deficient centers., SPIE vol. 2498. pp. 6-71 (1995).

Liang et al., Laser synthesize silicon-based and ferro-based nano powders, SPIE vol. 3862 pp. 17-21. (1999).

Liu et al., Novel nanostructured electrodes for solid oxide fuel cells fabricated by combustion chemical vapor deposition (CVD), Advanced Materials, vol. 16 (3), Feb. 2004, pp. 256-260.

Magee et al., Laser-Induced Conversion of Molecular Precursors to Thin Films and Deposited Layers, American Chemical Society 1990, pp. 232-235.

Maric et al., Electrolyte Materials for Intermediate Temperature Fuel Cells Produced via Combustion Chemical Vapor Condensation, Electrochemical and Solid-State Letters, 6 (5) 2003, pp. A91-A95.

Matsuzaki et al., Growth of yttria stabilized zirconia thin films by metallo-organic, ultrasonic spray pyrolysis, Thin Solid Films 340 (1999) 72-76.

Maxwell, Photosensitivity & rare-earth doping in flame hydrolysis deposited planar silica waveguides, SPIE vol. 2695 pp. 16-29. (1996).

Meunier et al., Hydrogenated Amorphous Silicon Produced by Laser Induced Chemical Vapor Deposition of Silane, American Institute of Physics 1983, pp. 273-275.

Meunier et al., Laser-Induced Chemical Vapor Deposition of Hydrogenated Amorphous Silicon. I. Gas-Phase Process Model, American Institute of Physics 1987, pp. 2812-2821.

Meunier et al., Laser-Induced Chemical Vapor Deposition of Hydrogenated Silicon. II. Film Properties, American Institute of Physics 1987, pp. 2822-2829.

Muller et al., Development of a multilayer anode for solid oxide fuel cells, Solid State Ionics 152-153 (2002) 537-542.

Nguyen et al., Deposition and characterization of nanocrystalline tetragonal zirconia films using electrostatic spray deposition, Solid State Ionics 138 (2001) 191-197.

Oljaca et al., Deposition of $Ba_xSr_{1-x}TiO_3$ in Atmospheric Pressure Flame: Combustion Monitoring and Optimization of Thin Film Properties, Surface Engineering, vol. 19, No. 1, 2003, pp. 51-57.

Perednis et al., Solid oxide fuel cells with electrolytes prepared via spray pyrolysis, Solid State Ionics 166 (2004) 229-239.

Perednis, Thin film deposition by spray pyrolysis and application in solid oxide fuel cells, Diss. Eth No. 15190 (2003) 1-168.

Rabii et al. Recent advances in the fabrication of hollow glass waveguides, SPIE vol. 3262 pp. 103-107. (1998).

Reitz et al., U.S. Appl. No. 09/433,202, filed Nov. 4, 1999, entitled "Particle Dispersions".

Sun et al., Building passive components with silica waveguides, SPIE vol. 3795 pp. 313-319. (Jul. 1999).

Suzuki et al., Thin films of chromium oxide compounds formed by the spray-icp technique, Journal of Crystal Growth 99 (1990) 611-615.

Taniguchi et al., Electrostatic spray deposition of $Gd_{0.1}Ce_{0.9}O_{1.95}$ and $La_{0.9}Sr_{0.1}Ga_{0.8}Mg_{0.2}O_{2.87}$ thin films, Solid State Ionics 160 (2003) 271-279.

Vukasinovic et al., Closed Loop Controlled Deposition of $Ba_xSr_{1-x}TiO_3$ Thin Films in Spray Flames, Surface Engineering, vol. 19, No. 3, 2003, pp. 179-184.

Will et al., Fabrication of thin electrolytes for second-generation solid oxide fuel cells, Solid State Ionics 131 (2000) 79-96.

Xu et al., Process of yttria stabilized zirconia thin films by liquid fuel combustion chemical vapor deposition, Mat. Res. Soc. Symp. Proc., vol. 672 (2001).

Yamane et al., Yttria stabilized zirconia transparent films prepared by chemical vapor deposition, Journal of Crystal Growth 94 (1989) 880-884.

"A New Ceramic Coating Technique for SOFC Using the ETL Laser Spraying Process", Tsukamoto, et al., Solid State Ionics, 40/41 (1990), 1003-1006.

Supplementary European search report (PCT/US2004/017793) dated Sep. 4, 2008.

* cited by examiner

REACTIVE DEPOSITION FOR ELECTROCHEMICAL CELL PRODUCTION

CROSS REFERENCE TO RELATED APPLICATIONS

This application claims priority to copending U.S. Provisional Patent Application Ser. No. 60/476,451 to Horne, filed on Jun. 6, 2003,entitled "Improved Material Preparation Approaches For Fuel Cells," incorporated herein by reference, and copending U.S. Provisional Patent Application Ser. No. 60/479,698 to Horne filed on Jun. 19, 2003,entitled "Material Processing For Tubular Ceramic Fuel Cells And Metallic Interconnects," incorporated herein by reference.

FIELD OF THE INVENTION

This invention relates to approaches for the formation of electrochemical cells, in particular fuel cells. In particular, the invention relates to reactive deposition approaches for the formation of electrochemical cell structures. The invention further relates to improved structures for electrochemical cells.

BACKGROUND OF THE INVENTION

Electrochemical cells in general involve reduction-oxidation reactions in separated half-cells that are appropriately connected for ionic flow as well as electrical flow across an external circuit. Batteries and fuel cell produce useful work in the form of the electrical flow across a load generated from the reduction-oxidation reactions. In other electrochemical cells, a load is applied to the cell to induce desired chemical reactions at the electrodes to form desired chemical products. Fuel cells differ from batteries in that both the reducing agent and the oxidizing agent can be replenished without dismantling the cell. Fuel cells and in some cases batteries can comprise individual cells stacked in series to increase the resulting voltage. Adjacent cells connected in series can have an electrically conductive plate, e.g., a bipolar plate or electrical interconnect, linking adjacent cells. Since the reactants of a fuel cell can be replenished, appropriate flow paths can be integrated into the cell.

Several types of fuel cells have gained recognition as distinct classes of fuel cells that are distinguishable from each other due to the nature of their construction and the materials used in their construction. Particular fuel cell designs introduce specific challenges in material performances. Common features generally found in different fuel cell designs involve the flow of fuel and oxidizing agent for long-term performance with appropriate design consideration for heat management, electrical connection and ionic flow. Different fuel cell designs differ from each other in the construction of the electrodes and/or electrolyte, which separates the electrodes, and in some cases the particular fuel. Many fuel cell designs operate with hydrogen gas, $H_2$, although some fuel cells can operate with other fuels, such as methanol or methane.

Several types of hydrogen fuel-based fuel cell differ in the electrolyte within the fuel cell. For example, proton exchange membrane fuel cells have a separator that conducts effectively only protons, i.e., hydrogen cations, to maintain electrical neutrality. Phosphoric acid fuel cells use phosphoric acid as the electrolyte, which also conducts protons. Molten carbonate fuel cells use molten mixed carbonate salts as the electrolyte in which the carbonate ions are transported through the electrolyte to maintain electrical neutrality. Solid oxide fuel cells use a ceramic separator, such as yttrium-stabilized zirconia, which transport oxygen ions. The conventional operating temperatures generally are dependent on the electrolyte material, with proton exchange membrane fuel cells operating at temperatures on the order of 80° C., phosphoric acid fuel cells operating at temperatures on the order of 190° C., molten carbonate fuel cells operating at temperatures on the order of 650° C. and solid oxide fuel cells operating at temperatures on the order of 650° C. to 1000° C. The fuel suitable for a fuel cell generally depends on the catalyst material, electrolyte composition, operating temperature and other performance properties.

In addition to hydrogen based fuel cells, direct methanol fuel cells operate with methanol directly used as the fuel. These cells can operate alternatively with either liquid methanol or vapor methanol. These cells generally are formed with polymer separators and liquid ionic electrolytes. Catalyst particles are generally included in the anodes and cathodes, respectively.

SUMMARY OF THE INVENTION

In a first aspect, the invention pertains to a method for the production of an electrolytic cell component, the method comprising performing sequential reactive deposition for the formation of a plurality of layers wherein at least one layer comprises an electrically conductive material.

In another aspect, the invention pertains to a method for forming an electrolytic cell component, the method comprising impregnating a powder coating with a polymer to form a polymer membrane wherein the polymer is ion conducting.

In a further aspect, the invention pertains to a method for coating a rod shaped substrate, the method comprising rotating the rod within a product flow from a reactive flow.

In addition, the invention pertains to a polymer electrode membrane comprising a powder coating and an ion conducting polymer.

In other aspects, the invention pertains to a power cell comprising a powder coating with primary particle size that varies along the thickness of the coating wherein the powder coating comprises an electrically conductive material.

Moreover, the invention pertains to a fuel cell comprising an electrode with a powder coating comprising a catalyst material wherein the powder coating has a higher concentration of catalyst downstream in the reactant flow.

Furthermore, the invention pertains to a method for forming an electrical interconnect, the method comprising depositing an electrically conductive coating onto a metallic structure with flow channel wherein the deposition is performed from a reactive flow.

In additional aspects, the invention pertains to a method for forming an electrochemical cell, the method comprising performing the sequential reactive deposition of an electrode and a separator.

Additionally, the invention pertains to a method for forming a fuel cell component, the method comprising contacting a cell assembly with a solvent to dissolve a soluble material and to form reactant flow channels to an electrode.

Also, the invention pertain to a method for forming a component for an electrochemical cell, the method comprising depositing an electrically conductive material on a curved surface.

BRIEF DESCRIPTION OF THE DRAWINGS

FIG. 18 is a top view of the reactant inlet nozzle for the reaction chamber of FIG. 13.

DETAILED DESCRIPTION OF THE INVENTION

Figure 1:
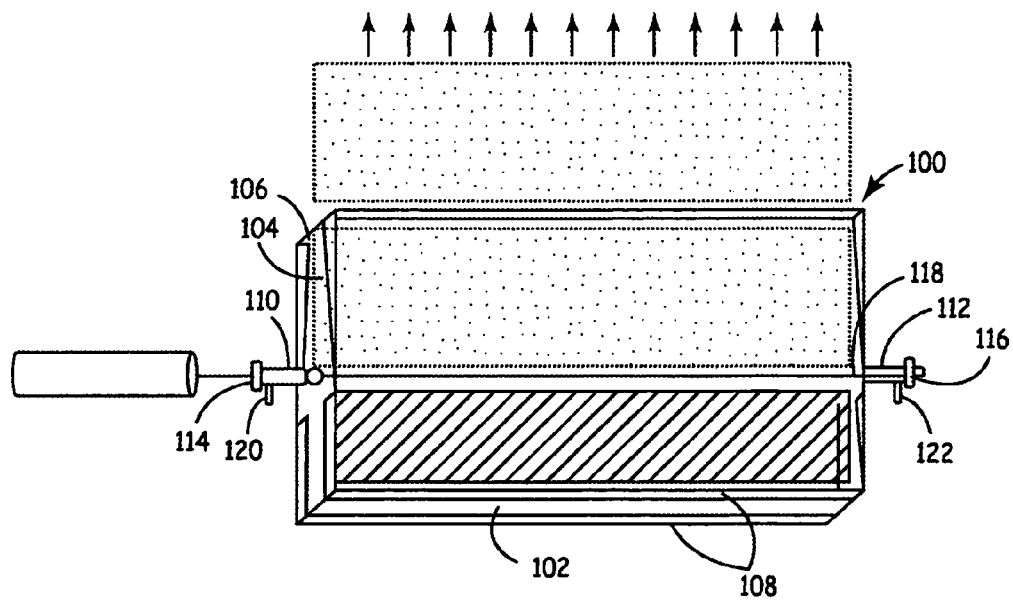
FIG. 1 is a side perspective view of a reaction chamber for performing laser pyrolysis synthesis of powders at high production rates.

Improved processing approaches for performing reactive deposition of materials can be adapted advantageously for the formation of electrochemical cells, especially fuel cells, or components thereof with improved material properties. In particular, techniques can be adapted for fuel cell application for the high rate deposition of layered materials or corresponding patterned layered materials. Individual layers or patterned layers of materials can be deposited to form individual fuel cell components, such as coatings, electrical interconnects or seals, and/or multiple layers can be deposited to form one or more components or portions thereof. The deposition approaches generally are based on light reactive deposition, which involves depositing materials from a reactive flow. These improved approaches have considerable versatility in tuning the composition and can reproducibly produce high quality layers/structures with selected characteristics. The efficient production of highly reproducible structures allows for the construction of long lasting electrochemical cells with consistent and reproducible performance.

Electrochemical cells have an anode and a cathode for performing oxidation and reduction half reactions, respectively. A separator/electrolyte is placed between the cathode and anode to provide ionic conductivity but electrical insulation. Electrons flow from the anode toward the cathode as a result of an electromotive force. An external load can be applied to drive a particular reaction within the cell. In contrast, in a battery or fuel cell, the reactions within the cell generate an external load that can be used to perform work. If cells are stacked in series, an electrical conductor is placed between adjacent cells to prevent flow of reactants or electrolyte between adjacent cells, but allow for electrical flow such that the voltage of the adjacent cells is additive. Generally, the approaches described herein can be used to deposit a component of the cell or portion thereof, the entire cell or a series of cells. To simplify the discussion herein, the description below focuses on fuel cells, although a person of ordinary skill in the art can similarly apply the described approaches for batteries, other electrochemical cells and components thereof.

A process has been developed involving reactive deposition driven by a light beam (e.g., a laser beam), to form coatings with material characteristics that are tightly controlled. The coating can be used to form particular structures with either a simple or complex configuration. In one embodiment, reactive deposition driven by a light beam (e.g., a laser beam) involves a reactor with a flowing reactant stream that intersects an electromagnetic radiation beam proximate a reaction zone to form a product stream configured for the deposition of product particles onto a surface following formation of the particles in the flow. The particles are deposited in the form of a powder coating, i.e. a collection of unfused particles or a network of fused or partly fused particles in which at least some characteristics of the initial primary particles are reflected within the coating. Light reactive deposition incorporates features of laser pyrolysis, a light reactive process for driving the reaction of a flowing reactant stream to form submicron powders, into a direct coating process. In laser pyrolysis, particle formation incorporates an intense electromagnetic radiation, e.g., light, beam to drive a reaction in a flow for the production of submicron particles in a monodispersed powder form.

In laser pyrolysis, the reactant stream is reacted by an intense light beam, such as a laser beam, which heats the reactants at a very rapid rate. While a laser beam is a convenient energy source, other intense radiation (e.g., light) sources can be used in laser pyrolysis. Laser pyrolysis can provide for formation of phases of materials that are difficult to form under thermodynamic equilibrium conditions. As the reactant stream leaves the light beam, the product particles are rapidly quenched. The reaction takes place in a confined reaction zone at the intersection of the light beam and the reactant stream. For the production of complex materials, such as materials with three or more elements and/or doped materials, the present approaches have the advantage that the composition of the materials can be adjusted over desirable ranges.

Submicron inorganic particles with various stoichiometries, non-stoichiometric compositions and crystal structures, comprising amorphous structures, have been produced by laser pyrolysis, alone or with additional processing. Specifically, amorphous and crystalline submicron and nanoscale particles can be produced with complex compositions using laser pyrolysis. Similarly, using light driven reaction approaches a variety of new materials can be produced.

Reactant delivery approaches developed for laser pyrolysis can be adapted for light reactive deposition. In particular, a wide range of reaction precursors can be used in gaseous/vapor and/or aerosol form, and a wide range of highly uniform product particles can be efficiently produced for the deposition in the form of a coating, such as a powder coating. Specifically, light reactive deposition can be used to form highly uniform coatings of materials, optionally comprising dopant(s)/additive(s) and/or complex composition(s). The coating formed by light reactive deposition can be a collection of particles on a surface or a powder coating, depending on the deposition conditions. For convenience, this application refers interchangeably to light-driven pyrolysis and laser pyrolysis. For convenience, this application also refers interchangeably to light reactive deposition and laser reactive deposition. In other words, as used herein, laser pyrolysis and light reactive deposition refer generally to all electromagnetic radiation based particle synthesis and electomagnetic radiation based coating approaches, respectively, unless explicitly indicated otherwise.

In some embodiments, the reactor apparatus, e.g., a light reactive deposition apparatus, includes an extended reactant inlet such that a stream of particles is generated within a flowing sheet forming a reactant/product stream. Generally, the reactant flow is oriented to intersect the radiation such that most or all of the reactant flow intersects with the radiation such that high yields are obtained. Using an extended reactant inlet, a line or stripe of particles at a high throughput can be, at least in part, simultaneously deposited onto a substrate. It has been discovered how to obtain high reactant throughput such that a high particle production rate can be maintained without sacrificing control of the product particle properties and/or corresponding uniformity of the deposited powder coating. For coating deposition, by depositing a line or stripe of particles, the coating process can be performed more rapidly.

More specifically, in a reactor with an elongated reactant inlet, particle production rates are readily achievable in the range(s) of at least about 1 gram per hour (g/h) and in other embodiments in the range(s) of at least about 100 g/h. These rates can be used to achieve particles with a wide range of compositions and with high particle uniformity. Specifically, particles within the flow can be formed with a distribution of particle diameters that is highly peaked at or near the average such that the distribution of a majority of the particles is narrow and that has a cut off in the tail of the distribution such that effectively no particles have a diameter larger than a cut off value of a low multiple of the average diameter. Corresponding high coating rates also can be achieved. The uniformity of the particles in the flow can result in desirable properties for the corresponding coating formed from the particles.

Light reactive deposition has considerable advantages for the production of particles for coating substrate surfaces. First, light reactive deposition can be used in the production of a large range of product particles. Thus, the composition of the corresponding coating can be adjusted based on the features of the light reactive deposition approach. Furthermore, light reactive deposition can produce very small particles with a high production rate and high uniformity.

Submicron inorganic particle coatings with various stoichiometries and/or non-stoichiometric compositions can be produced by light reactive deposition. Similarly, deposited materials can be formed with various crystal structure(s), including, for example, amorphous structures. Specifically, light reactive deposition can be used to form highly uniform coatings of glasses, i.e., amorphous materials, and crystalline materials (either single crystalline or polycrystalline), optionally with additive/dopants comprising, for example, complex blends of stoichiometric and/or additive/dopant components.

Depending on the particular component to be formed, suitable materials for incorporation into a fuel cell can be, for example, catalytic/electrocatalytic, inert, electrically conductive, ion conductive, electrically insulating, or suitable combinations thereof. Suitable inert materials and electrically insulating materials include, for example, metal oxides or other suitable metal compositions or combinations thereof. Suitable catalysts can be, for example, metals, metal alloys, metal oxides, metal nitrides, metal carbides, oxynitrides, oxycarbides and combinations thereof. Suitable electrically conductive materials include, for example, metals, metal alloys, carbon materials and combinations thereof. Suitable ionically conductive materials include, for example, doped $BaCeO_3$, doped $SrCeO_3$, yttria stabilized zirconia, scandia stabilized zirconia, $La_{1-x}Sr_xGa_{1-y}Mg_y$, with x and y between about 0.1 and about 0.3, glasses, such as $P_2O_5$—$TiO_2$—$SiO_2$ glasses, and carbonates.

A basic feature of successful application of laser pyrolysis/light reactive deposition for the production of particles and corresponding coatings with desired compositions is generation of a reactant stream containing an appropriate precursor composition. In particular, for the formation of doped materials by light reactive deposition, the reactant stream can comprise host glass precursors or crystal precursors and dopant precursors. The reactant stream includes appropriate relative amounts of precursor compositions to produce the materials with the desired compositions and/or dopant concentrations. Also, unless the precursors are an appropriate radiation absorber, an additional radiation absorber can be added to the reactant stream to absorb radiation/light energy for transfer to other compounds in the reactant stream. Other additional reactants can be used to adjust the oxidizing/reducing environment in the reactant stream.

By adapting the properties of laser pyrolysis, light reactive deposition is able to deposit highly uniform, very small particles in a coating. Due to the uniformity and small size of the powders, light reactive deposition can be used to form uniform and smooth coating surfaces. The desirable qualities of the particles are a result of driving the reaction with an intense light beam, which results in the extremely rapid heating and cooling. Appropriate controls of the deposition process can result in high uniformity of coating thickness, whether or not densified, across the surface of a substrate and with respect to average coating thickness between substrates coated under the equivalent conditions.

Multiple layers can be formed by additional sweeps of the substrate through the product particle stream. Since each coating layer can have high uniformity and smoothness, a large number of layers can be stacked while maintaining appropriate control on the layered structure such that structural features can be formed throughout the layered structure without structural variation adversely affecting performance of the resulting structures. Composition can be varied between layers, i.e., perpendicular to the plane of the structure, and/or portions of layers, within the plane of the structure, to form desired structures. Thus, using light reactive deposition possibly with other patterning approaches, it is possible to form complex structures with intricate variation of materials with selectively varying compositions.

To form a densified layer, a powder coating layer deposited by light reactive deposition can be consolidated or sintered. For convenience, the term consolidated is used herein to described densification of an amorphous or crystalline material. To consolidate the materials, the powders are heated to a temperature above their flow temperature. At these temperatures, the powders densify and upon cooling form a layer of densified material. Suitable densities for some fuel cell embodiments are described below. In general, a desired density may depend on the suitable gas porosity. By controlling the composition and/or dopants of the deposited particles, the composition of a subsequently densified material can be controlled to be a desired composition. Generally, amorphous particles can be consolidated to form a glass material, and crystalline particles can be consolidated to form a crystalline material. However, in some embodiments, appropriate heating and quenching rates can be used to consolidate an amorphous material into a crystalline layer, either single crystalline or polycrystalline, (generally slow quenching rates) and a crystalline powder into a glass layer (generally a rapid quench).

Efficient approaches have been developed for the patterning of compositions for the formation of desired structures, as described in detail below. Patterning of materials with respect to composition or other property can be performed during deposition and/or following deposition, for example, by etching the coated substrate using photolitography and/or other etching approaches.

Central to the formation of more complex structural components for an electrochemical cell is the variation of the material properties at different physical locations. For example, variation in electrical conductivity, porosity, ionic conductivity and/or catalytic ability generally is used to distinguish functional components. Material properties can be varied by changes in chemical composition and/or by changes in physical properties, such as density or particle size. As described herein, complex structures are described that involve composition variations in three dimensions organized within a plurality of layers. By stacking many layers with a plurality of layers having composition variation within appropriate plane(s), structures can be formed with a plurality of planes comprising integrated components of an electrochemical structure.

In general, the use of the processing approaches described herein can be effectively used to form individual structures of a fuel cell or fuel cell stack, an entire fuel cell stack or various portions of a fuel cell stack. For example, the approaches described herein can be used to form a coating on component that is then assembled into a fuel cell. In other embodiments, the approaches can be used to form a plurality of layers, such as electrodes, separators/electrolytes, electrical connections/bipolar plates/interconnects, etc. The patterning of layers can be used to form flow channels, electrical connection, seals and other desired structures.

In some embodiments, the formation of the three dimensional structures described herein generally is based on the deposition of a plurality of layers, each of which may or may not be contoured or patterned to form a particular structure within a specific layer. For example, different functional structures, such as electrodes, electrolytes/separators or electrical connections, by varying deposited material in the z-plane, i.e., the plane perpendicular to the coated substrate plane. Alternatively or in addition, a plurality of structures can be formed within a single layer by selectively depositing desired materials over only a portion of a layer or by appropriately etching or otherwise contouring the materials to form isolated domains within the layer, i.e., within the x-y plane of the substrate.

Layers generally can be applied sequentially, although near-simultaneous or even simultaneous application at displaced locations can also occur. With embodiments based on particle deposition, one or several passes of the product particle stream over the substrate surface can be used to form a single layer. The composition of the product particles may or may not be varied within a single pass or between passes. In other words, several passes can be used to form a single layer with a particular composition to obtain a layer with a desired thickness. Generally, particle compositions vary at least between portions of adjacent layers, although significant sections of adjacent layers can have identical compositions. By depositing layers with uniform structures and desired composition variation, complex structures spanning many layers can be formed. Similarly, particle sizes can be varied or density can be varied to impose different porosities or other properties to the material. Some specific desirable structures are described below.

In general, the composition along the x-y plane at a particular level or layer within the three dimensional structure can be varied during the deposition process or following deposition by patterning the materials, either before, during or after consolidation. To form patterned structures following deposition, patterning approaches, such as lithography and photolithography, along with etching, such as chemical etching or radiation-based etching, can be used to form desired patterns in one or more layers. This patterning generally is performed on a structure prior to deposition of additional material.

Using the deposition approaches described herein, the composition of product particles deposited on the substrate can be changed during the deposition process to deposit particles with a particular composition at selected locations on the substrate to vary the resulting composition of the material along the x-y plane. Using light reactive deposition, the product composition can be varied by adjusting the reactants that react to form the product particle or by varying the reaction conditions. The reactant flow can comprise vapor and/or aerosol reactants, which can be varied to alter the composition of the products. The reaction conditions can also affect the resulting product particles. For example, the reaction chamber pressure, flow rates, radiation intensity, radiation energy/wavelength, concentration of inert diluent gas in the reaction stream, temperature of the reactant flow can affect the composition, particle size and other properties of the product particles.

While product particle composition changes can be introduced by changing the reactant flow composition or the reaction conditions while sweeping a substrate through the product stream, it may be desirable, especially when more significant compositional changes are imposed to stop the deposition between the different deposition steps involving the different compositions. For example, to coat one portion of a substrate with a first composition and the remaining portions with another composition, the substrate can be swept through the product stream to deposit the first composition to a specified point at which the deposition is terminated. The substrate is then translated the remaining distance without any coating being performed. The composition of the product is then changed, by changing the reactant flow or reaction conditions, and the substrate is swept, after a short period of time for the product flow to stabilize, in the opposite direction to coat the second composition in a complementary pattern to the first composition. A small gap can be left between the coatings of the first composition and the second composition to reduce the presence of a boundary zone with a mixed composition. The small gap can fill in during the consolidation step to form a smooth surface with a relatively sharp boundary between the two materials.

This process can be generalized for the deposition of more than two compositions and/or more elaborate patterns on the substrate. In the more elaborate processes, a shutter can be used to block deposition while the product flow is stabilized and/or while the substrate is being positioned. A precision controlled stage/conveyor can precisely position and sweep the substrate for the deposition of a particular composition. The shutter can be rapidly opened and closed to control the deposition. Gaps may or may not be used to slightly space the different location of the compositions within the pattern.

In other embodiments, a discrete mask is used to control the deposition of particles. A discrete mask can provide an efficient and precise approach for the patterning of particles. With chemical vapor deposition and physical vapor deposition, a layer of material is built up from an atomic or molecular level, which requires binding of the mask at an atomic or molecular level to prevent migration of the material being deposited under the mask to blocked regions. Thus, the "masks" are a coating on the surface without an independent, self-supporting structure corresponding to the mask, and the "mask" is chemically or physically bonded to the surface with atomic level contact along the "mask". In contrast, with particle deposition, the particles generally can be at least macromolecular in size with diameters of about 3 nanometers (nm) or more such that a mask with a flat surface placed against another flat surface provides sufficient contact to prevent significant particle migration past the mask. The discrete masks have an intact self-supporting structure that is not bonded to the surface such that the mask can be removed intact from the surface that is coated. Therefore, the discrete mask approach herein is different from previous masking approaches adapted from photolithography for vapor deposition approaches.

For these embodiments, the formation of the particle coating involves directing a product particle stream at the substrate shielded with the discrete mask. The discrete mask has openings at selected locations. The discrete mask blocks the surface except at the openings such that particles can deposit on the surface through the openings. Thus, the mask provides for patterning compositions on the surface by the selected placement of the openings. Suitable discrete masks comprise a mask with a slit that is narrower than the product particle flow such that the deposition process can be very precisely controlled. Movement of the slit can form a desired, precisely controlled pattern with one or more compositions. After use of a discrete mask, it can be removed and reused.

In some embodiments, a plurality of masks is used to deposit particles along a single layer. For example, following deposition of a pattern through a first mask, a second complementary mask can be used to deposit material over at least a portion of the surface left uncovered during deposition with the first mask. Further complementary masks can be used to form complex patterns while completing a single layer or portion thereof with a coating having varying chemical composition over the layer. Similarly, non-complimentary masks can be used to form non-planar structures that may or may not be subsequently leveled off. For example, flow channels can be formed as non-planar structures formed with one or more masks. Specifically, the mask can be used to block deposition along the flow channels with openings in the mask corresponding to walls along the flow paths. The contoured structure can be laminated to another structure to complete the flow path and bipolar plate/interconnect structure, or the flow channels can be filled in using a complementary mask with a material that can be subsequently removed.

Thus, light reactive deposition provides a range of approaches for adjusting the product composition in a controllable and reproducible way. Specifically, the deposition process itself can be controlled to deposit a range of materials at selected locations along a surface to form a pattern of compositions within a layer and/or a mask, e.g. a discrete mask, can be used to form elaborate patterning of compositions along a substrate surface layer.

Light reactive deposition provides a rapid approach for the formation of smooth layers of material. In addition, using light reactive deposition, patterning of a layer can be performed during the deposition process to produce a patterned layer without significant voids such that a smooth surface is formed upon which a subsequent layer can be applied. By assembling a structure in this way, a plurality of layers can be stacked without significant discontinuities within or between layers in the layered structure. With this capability, a larger number of layers can be stacked and patterned to introduce functionality.

The rapid rate of deposition using light reactive deposition provides considerable flexibility for the formation of complex structures. In particular, gradient transition layers can be formed that provide for gradual changes in composition of other property. Gradients can be useful to deposit catalytic material for more efficient operation.

A gradient transition layer can be formed as a plurality of thin layers with a step-wise composition change or as a layer with a continuous composition change. The step-wise composition change generally involves two or more layers that have sequential variation in composition from a first composition in a first layer adjacent the gradient transition layer to a second composition in a second layer adjacent the gradient transition layer opposite the first layer. A continuous change in composition can be accomplished in embodiments in which a layer or desired portion thereof is deposited at once with a defocused product stream and the composition of the product stream is changed continuously in time to form the composition gradient in the deposited layer.

The approaches described herein can be usefully employed for a range of productive stages for the production of a fuel cell. For example, a straightforward production contribution can result from applying a coating or partial layer to a fuel cell structure. In particular, a protective conductive coating can be applied to an electrically conductive plate for placement between two adjacent fuel cells. Through the use of a protective coating, a more inexpensive material, such as stainless steel, can be used for forming the bulk of the electrically conductive plate, e.g., bipolar plate or interconnect, without the deleterious effects of corrosion that can shorten the lifetime of the material and corresponding cell. Similarly, a sealant material, such as a borosilicate glass, a boroaluminosilicate glass, a calcium aluminate glass, or a glass ceramic composition, can be applied along a pattern on a component, e.g., an electrically conductive plate, to form a seal upon assembly of the cell. The pattern can be formed using the approaches described herein.

In some embodiments, a layer or portion of a layer can be formed using light reactive deposition in which the layer forms a component of the cell. For example, an electrode can be deposited through the deposition of catalytic material, electrically conductive material and optional inert materials. Similarly, an electrolyte/separator layer can be deposited using electrically insulating, ionically conductive materials. An interconnect can be formed by depositing an electrically conductive material, which can be patterned to form flow channels. In some embodiments, an interconnect/bipolar plate is coated using light reactive deposition following machining to form the flow channels. For example, a relatively inexpensive stainless steel bipolar plate can be coated using light reactive deposition with a corrosion resistant noble metal or conductive carbon. In some embodiments, the noble metal is only placed at contact positions on the end of fingers projecting along the flow path channels or other appropriate locations for contact with the electrode. Generally, an interconnect/bipolar plate is contoured with flow channels on both opposite faces for connecting respectively, with an adjacent anode and cathode. Generally, the flow channel run perpendicular to each other, although other geometries can be used.

In further embodiments, multiple layers can be deposited to form a plurality of functional components or portions thereof. For example, an entire cell assembly can be deposited comprising an anode, an electrolyte/separator and a cathode. These can be sequentially deposited with a selected thickness. Using the approaches described herein, the layers can be formed with excellent uniformity at selected thickness including, for example, relatively thin dimensions. The electrode assemblies can then be assembled into a fuel cell stack. The desired layers can be deposited on a substrate to be incorporated into the structure or the deposited materials can be separated from the substrate, for example using a release layer, as described further below.

In other embodiments, an entire fuel cell stack or portion thereof can be deposited with a sequential build up of the structure. The patterning approaches described herein can be used to form features of the structure that are not planar. A three dimensional structure can be formed with a plurality of electrodes, electrolytes/separators, electrically conductive plates which can be deposited, for example, on a current collector or on a substrate that is subsequently removed. Flow channels can be formed by depositing a material that can be later removed, such as through the deposition of a soluble material and subsequent contact of the structure with an appropriate solvent.

In some embodiments, it may be desirable to form gradients in composition and/or particle size. For example, the fuel cell stack can be conceptually oriented with a z-axis aligned along the stack, generally normal to a face of an electrode. The gradients can be established in the direction along the z-axis to place catalyst in most effective locations further from the flow of the reactants and closer to the separator/electrolyte layer. In some embodiments, a reformation catalyst can be placed in the electrode close to the flow of reactants and away from the electrolyte layer. Similarly, gradients can be established in the x-y plane to have a higher catalyst concentration closer to the reactant outlet where reactant concentrations are reduced to have more uniform current generation across the face of the electrode. The approaches described herein can be used to pattern the compositional structure along the z-axis or in the x-y plane to form the desired gradients.

As described above, the deposition techniques generally are effective for the deposition of powder coatings. In some embodiments relating to proton exchange membrane fuel cells or direct methanol fuel cells, it may be desirable to impregnate the resulting structure with a polymer. The polymer can be introduced into the porous powder coating structure using a solvent that is subsequently removed, by performing the polymerization in the presence of the structure, using a polymer melt or other convenient polymer processing approach. The polymer can stabilize the structure and/or provide for ion transportation through the resulting layer. In general, the polymer can be advantageously deposited in an electrode in an electrolyte/separator layer or a combination thereof.

In some embodiments, it may be desirable to consolidate some or all of the materials deposited to form a densified material. As described above, the densification generally is performed with controlled heating of the composition. The flow temperatures generally depend to some extent on the particle size since smaller particles in the submicron range generally exhibit flow at lower temperatures than corresponding larger particles with the same composition. The layers can be consolidated after formation of a particular layer or portion thereof, or a plurality of layers can be consolidated together. By selecting materials with appropriate flow temperatures, the structure can be heated to consolidate one or more layers to form densified materials while other layers can remain as a powder coating. Release layers can be formed with materials that do not densify due to composition or particle size at temperatures that consolidate other layers, although other approaches for releasing a deposited structure from a substrate are described below.

In some embodiments of solid oxide fuel cells, the electrodes have a non-planar structure. For example, a corrugated electrode structure is described further below. In particular, the electrodes can be formed on a rod with an inner electrode and an outer concentric electrolyte. The further outer electrode can be similarly concentric or it can have another shape with the rod embedded within the outer electrode. A ceramic electrolyte layer and/or an electrode layer can be deposited onto a rod using a rod shaped substrate and rotating the rod within the reactive flow. Other specific processing approaches for particular fuel cell applications are described further below.

The approaches described herein provide a versatile approach for the deposition of materials that are difficult to form using other approaches. A range of material compositions can be formed with selected properties with respect to electrochemical cell function as well as processing properties, such as melting point. The processing approaches herein can be highly reproducible between different products and highly uniform across the dimensions of a single product or layer. Due to the great versatility of the approaches described herein, the processes may or may not be incorporated with one or more conventional processing steps to balance quality, uniformity and durability of the resulting products with efficiency and cost factors. Thus, an overall processing scheme can be selected to obtain the best overall balance of economic factors.

Particle Synthesis Within a Reactant Flow

Laser pyrolysis has been demonstrated to be a valuable tool for the production of submicron/nanoscale particles with a wide range of particle compositions and structures alone or with additional processing. Using light reactive deposition, the particles can be deposited onto a substrate as a coating. The reactant delivery approaches described in detail below can be adapted for producing powder coatings in flowing reactant systems, for example, with a radiation source, e.g., a light source.

Flowing reactant systems generally comprise a reactant delivery apparatus that directs a flow through a reaction chamber. The reaction of the reactant flow takes place in the reaction chamber. The reaction zone may or may not be localized in a narrow region within the reaction chamber. The use of a radiation, e.g., light, beam, to drive the reaction can result in a localized reaction zone that leads to high uniformity of the particles. Beyond the reaction zone, the flow comprises product particles, unreacted reactants, reaction byproducts and inert gases. The flow can continue to a deposition surface at which at least a portion of the product particles are harvested from the flow as a powder coating. Continuous supply of reactants to the flow and removal of product particles from the flow during the course of the reaction characterizes the reaction process within the flowing reactant system, although the reaction and/or the deposition can be interrupted at appropriate intervals, for example, to position substrates, alter reactant compositions or for other processing considerations and the like.

Light reactive deposition can incorporate some of the particle production features of laser pyrolysis for the production of coatings. In particular, the versatility of forming particles with a range of particle compositions and structures can be adapted for the formation of particle coatings by light reactive deposition with a comparable range in particle compositions. In general, product particles within a flowing reactant system can be deposited onto a substrate as a coating within the reaction chamber, or directed to a separate coating chamber for deposition onto a substrate, or directed to a collector for collection as a powder.

Laser pyrolysis has become the standard terminology for flowing chemical reactions driven by an intense radiation, e.g., light, with rapid quenching of product after leaving a narrow reaction region defined by the radiation. The name, however, is a misnomer in the sense that radiation from non-laser sources, such as a strong, incoherent light or other radiation beam, can replace the laser. Also, the reaction is not a pyrolysis in the sense of a thermal pyrolysis. The laser pyrolysis reaction is not solely thermally driven by the exothermic combustion of the reactants. In fact, in some embodiments, laser pyrolysis reactions can be conducted under conditions where no visible light emissions are observed from the reaction, in stark contrast with pyrolytic flames. Light reactive deposition involves comparable processes as laser pyrolysis for the particle production, although some characteristics of the flow may be altered to accommodate the coating process.

The reaction conditions can determine the qualities of the particles produced by light reactive deposition, as in laser pyrolysis. The reaction conditions for light reactive deposition can be controlled relatively precisely in order to produce particles and corresponding powder coatings with desired properties. In particular, the particle properties influence the properties of the powder coating formed from the particles, although other factors, such as reaction gas mixture, temperature of the substrate and distance of the substrate from the reaction zone also influence the powder coating properties.

For example, the reaction chamber pressure, flow rates, composition and concentration of reactants, radiation intensity, radiation energy/wavelength, type and concentration of inert diluent gas or gases in the reaction stream, temperature of the reactant flow can affect the composition and other properties of the product particles, for example, by altering the time of flight of the reactants/products in the reaction zone and the quench rate. Thus, in a particular embodiment, one or more of the specific reaction conditions can be controlled. The appropriate reaction conditions to produce a certain type of particles generally depend on the design of the particular apparatus. Some general observations on the relationship between reaction conditions and the resulting particles can be made.

Increasing the light power results in increased reaction temperatures in the reaction region as well as a faster quenching rate. A rapid quenching rate tends to favor production of higher energy phases, which may not be obtained with processes near thermal equilibrium. Similarly, increasing the chamber pressure also tends to favor the production of higher energy phases. Also, increasing the concentration of the reactant serving as the oxygen source or other secondary reactant source in the reactant stream favors the production of particles with increased amounts of oxygen or other secondary reactant.

Reactant velocity of the reactant gas stream is inversely related to particle size so that increasing the reactant velocity tends to result in smaller particle sizes. A significant factor in determining particle size is the concentration of product composition condensing into product particles. Reducing the concentration of condensing product compositions generally reduces the particle size. The concentration of condensing product can be controlled by dilution with non-condensing, e.g., inert, compositions or by changing the pressure with a fixed ratio of condensing product to non-condensing compositions, with a reduction in pressure generally leading to reduced concentration and a corresponding reduction in particle size and vice versa, or by combinations thereof, or by any other suitable means.

Light power also influences particle size with increased light power favoring smaller particle formation, especially for higher melting temperature materials. Also, the growth dynamics of the particles have a significant influence on the size of the resulting particles. In other words, different forms of a product composition have a tendency to form different size particles from other phases under relatively similar conditions. Similarly, under conditions at which populations of particles with different compositions are formed, each population of particles generally has its own characteristic narrow distribution of particle sizes.

Materials of interest include amorphous materials, crystalline materials and combinations thereof. Amorphous materials possess short-range order that can be very similar to that found in crystalline materials. In crystalline materials, the short-range order comprises the building blocks of the long-range order that distinguishes crystalline and amorphous materials. In other words, translational symmetry of the short-range order building blocks found in amorphous materials creates long-range order that defines a crystalline lattice. In general, the crystalline form is a lower energy state than the analogous amorphous form. This provides a driving force towards formation of long-range order. In other words, given sufficient atomic mobility and time, long-range order can form.

In laser pyrolysis, a wide range of inorganic materials can be formed in the reactive process. Based on kinetic principles, higher quench rates favor amorphous particle formation while slower quench rates favor crystalline particle formation as there is time for long-range order to develop. Faster quenches can be accomplished with a faster reactant stream velocity through the reaction zone. In addition, some precursors may favor the production of amorphous particles while other precursors favor the production of crystalline particles of similar or equivalent stoichiometry. Specifically, amorphous particles can be consolidated/densified under appropriate conditions to form amorphous layers, such as glasses, which can be useful to form tight seals or ionically conducting membranes. Amorphous particles are more easily consolidated into an amorphous/glass layer since amorphous particles do not have a long-range order that is disrupted to form a glass layer. The formation of amorphous oxides is described further in U.S. Pat. No. 6,106,798 to Kambe et al., entitled "Vanadium Oxide Nanoparticles," incorporated herein by reference. Also, crystalline materials are of interest. Crystalline particles can be consolidated into single crystalline or polycrystalline materials. While it may be easier to consolidate amorphous particles into glasses and crystalline particles into crystalline layers, crystalline particles can be consolidated into amorphous layers under appropriate consolidation conditions such as heating the particles to a temperature above the melting temperature followed by quenching at a rate that prevents long-range order formation. Amorphous particles can be consolidated into crystalline layers under appropriate consolidation conditions including the heating and cooling at rates that provide time for long-range order to develop. Mixtures of crystalline particles within an amorphous matrix can also be formed, such as glass ceramics in which the crystals are nucleated during cooling of the material. In general, having crystalline materials embedded in the amorphous matrix can influence mechanical strength, the glass transition temperature and the coefficient of thermal expansion. In general, the coeffceints of thermal expansion within the assembled layered structure can be similar to prevent cracking.

To form a desired composition in the reaction process, one or more precursors supply the one or more metal/metalloid elements that form the desired composition. The reactant stream generally would include the desired metal and, additionally or alternatively, metalloid elements to form the host material and, optionally, dopant(s)/additive(s) in appropriate proportions to produce product particles with a desired composition. The composition of the reactant stream can be adjusted along with the reaction condition(s) to generate desired product particles with respect to composition and structure. Based on the particular reactants and reaction conditions, the product particles may not have the same proportions of metal/metalloid elements as the reactant stream since the elements may have different efficiencies of incorporation into the particles, i.e., yields with respect to unreacted materials. However, the amount of incorporation of each element is a function of the amount of that element in the reactant flow, and the efficiency of incorporation can be empirically evaluated based on the teachings herein to obtain desired compositions. The designs of the reactant nozzles for radiation driven reactions described herein are designed for high yields with high reactant flows. Furthermore, additional appropriate precursor(s) can supply any desired dopant/additive element(s).

Metalloids are elements that exhibit chemical properties intermediate between or inclusive of metals and nonmetals. Metalloid elements comprise silicon, boron, arsenic, antimony, and tellurium. Astatine perhaps can be considered a metalloid also, but it is highly radioactive with the longest lived isotopes having a half life of about 8 hours. Elements from the groups Ib, IIb, IIIb, IVb, Vb, VIb, VIIb and VIIIb are referred to as transition metals. In addition to the alkali metals of group I, the alkali earth metals of group II and the transition metals, other metals include, for example, aluminum, gallium, indium, thallium, germanium, tin, lead, bismuth and polonium. The non-metal/metalloid elements include hydrogen, the noble gases, carbon, nitrogen, oxygen, fluorine, sulfur, chlorine, selenium, bromine, and iodine.

Laser pyrolysis has been performed generally with gas/vapor phase reactants. Many precursor compositions, such as metal/metalloid precursor compositions, can be delivered into the reaction chamber as a gas/vapor. Appropriate precursor compositions for gaseous delivery generally include compositions with reasonable vapor pressures, i.e., vapor pressures sufficient to get desired amounts of precursor gas/vapor into the reactant stream. The vessel holding liquid or solid precursor compositions can be heated (cooled) to increase (decrease) the vapor pressure of the precursor, if desired. Solid precursors generally are heated to produce a sufficient vapor pressure. A carrier gas can be bubbled through a liquid precursor to facilitate delivery of a desired amount of precursor vapor. Similarly, a carrier gas can be passed over the solid precursor to facilitate delivery of the precursor vapor. Alternatively or additionally, a liquid precursor can be directed to a flash evaporator to supply a composition at a selected vapor pressure. The use of a flash evaporator to control the flow of non-gaseous precursors provide a high level of control on the precursor delivery into the reaction chamber.

However, the use of exclusively gas/vapor phase reactants can be challenging with respect to the types of precursor compositions that can be used conveniently. Thus, techniques have been developed to introduce aerosols containing precursors, such as metal/metalloid precursors, into laser pyrolysis chambers. Improved aerosol delivery apparatuses for flowing reaction systems are described further in U.S. Pat. No. 6,193,936 to Gardner et al., entitled "Reactant Delivery Apparatuses," incorporated herein by reference. These reactant delivery systems can be adapted for light reactive deposition. In some embodiments, the aerosol is entrained in a gas flow, which can comprise an inert gas(es) and/or a gaseous reactant(s).

Using aerosol delivery apparatuses, solid precursor compositions can be delivered by dissolving the compositions in a solvent. Alternatively, powdered precursor compositions can be dispersed in a liquid/solvent for aerosol delivery. Liquid precursor compositions can be delivered as an aerosol from a neat liquid, a multiple liquid dispersion or a liquid solution. Aerosol reactants can be used to obtain a significant reactant throughput. A solvent/dispersant can be selected to achieve desired properties of the resulting solution/dispersion. Suitable solvents/dispersants include water, methanol, ethanol, isopropyl alcohol, other organic solvents, metal/metalloid precursors themselves and mixtures thereof. The solvent should have a desired level of purity such that the resulting particles have a desired purity level. Some solvents, such as isopropyl alcohol, are significant absorbers of infrared light from a $CO_2$ laser such that no additional light absorbing composition may be needed within the reactant stream if a $CO_2$ laser is used as a light source.

The precursor compositions for aerosol delivery are dissolved in a solution generally with a concentration in the range(s) greater than about 0.1 molar. Generally, increasing the concentration of precursor in the solution increases the throughput of reactant through the reaction chamber. As the concentration increases, however, the solution can become more viscous such that the aerosol may have droplets with larger sizes than desired. Heating the solution can increase solubility and lower the viscosity to increase production rate without increasing aerosol droplet size. Thus, selection of solution concentration can involve a balance of factors in the selection of a suitable solution concentration.

If precursors are delivered as an aerosol with a solvent present, the solvent generally can be rapidly evaporated by the radiation (e,g., light) beam in the reaction chamber such that a gas phase reaction can take place. in addition, solvent generally can also evaporate prior to reaching the light beam during delivery. The resulting particles are not generally highly porous, in contrast to other approaches based on aerosols in which the solvent cannot be driven off rapidly. Thus, the fundamental features of the laser pyrolysis reaction can be unchanged by the presence of an aerosol. Nevertheless, the reaction conditions are affected the presence of the aerosol. The use of aerosol reactants for light reactive deposition is described further in copending and commonly assigned U.S. patent application Ser. No. 10/099,597, now U.S. Pat. No. 6,849,334 to Horne et at., entitled "Optical Materials And Optical Devices," incorporated herein by reference.

For embodiments involving a plurality of metal/metalloid elements, the metal/metalloid elements can be delivered all as vapor, all as aerosol or as any combination thereof. If a plurality of metal/metalloid elements is delivered as an aerosol, the precursors can be dissolved/dispersed within a single solvent/dispersant for delivery into the reactant flow as a single aerosol. Alternatively, the plurality of metal/metalloid elements can be delivered within a plurality of solutions/dispersions that are separately formed into an aerosol. The generation of a plurality of aerosols can be helpful if convenient precursors are not readily soluble/dispersible in a common solvent/dispersant. The plurality of aerosols can be introduced into a common gas flow for delivery into the reaction chamber through a common nozzle. Alternatively, a plurality of reactant inlets can be used for the separate delivery of aerosol and/or vapor reactants into the reaction chamber such that the reactants mix within the reaction chamber prior to entry into the reaction zone.

In addition, for the production of highly pure materials, it may be desirable to use a combination of vapor and aerosol reactants. In some embodiments, vapor/gas reactants generally can be supplied at higher purity than is readily available at low cost for aerosol delivered compositions. At the same time, some elements, especially rare earth dopant(s)/additive(s), alkali metals and alkali earth metals as well as some transition metals, cannot be conveniently delivered in vapor form. Thus, in some embodiments, a majority of the material for the product compositions can be delivered in vapor/gas form while other elements are delivered in the form of an aerosol. The vapor and aerosol can be combined for reaction, among other ways, following delivery through a single reactant inlet or a plurality of inlets.

The particles, in some embodiments, further comprise one or more non-(metal/metalloid) elements. For example, several compositions of interest are oxides. Thus, an oxygen source should also be present in the reactant stream. The oxygen source can be the metal/metalloid precursor itself if it comprises one or more oxygen atoms or a secondary reactant can supply the oxygen. The conditions in the reactor should be sufficiently oxidizing to produce the oxide materials.

In particular, secondary reactants can be used in some embodiments to alter the oxidizing/reducing conditions within the reaction chamber and/or to contribute non-metal/metalloid elements or a portion thereof to the reaction products. Suitable secondary reactants serving as an oxygen source for the formation of oxides include, for example, $O_2$, CO, $N_2O$, $H_2O$, $CO_2$, $O_3$ and the like and mixtures thereof.

Molecular oxygen can be supplied as air. In some embodiments, the metal/metalloid precursor compositions comprise oxygen such that all or a portion of the oxygen in product particles is contributed by the metal/metalloid precursors. Similarly, liquids used as a solvent/dispersant for aerosol delivery can similarly contribute secondary reactants, e.g., oxygen, to the reaction. In other words, if one or more metal/metalloid precursors comprise oxygen and/or if a solvent/dispersant comprises oxygen, a separate secondary reactant, e.g., a vapor reactant, may not be needed to supply oxygen for product particles.

In one embodiment, a secondary reactant composition should not react significantly with the metal/metalloid precursor(s) prior to entering the radiation reaction zone since this can result in the formation of larger particles and/or damage the inlet nozzle. Similarly, if a plurality of metal/metalloid precursors is used, these precursors should not significantly react prior to entering the radiation reaction zone. If the reactants are spontaneously reactive, a metal/metalloid precursor and the secondary reactant and/or different metal/metalloid precursors can be delivered in separate reactant inlets into the reaction chamber such that they are combined just prior to reaching the light beam.

Light reactive deposition can be performed with radiation at a variety of optical frequencies, using either a laser or other intense radiation source. Convenient light sources operate in the infrared portion of the electromagnetic spectrum, although other wavelengths can be used, such as the visible and ultraviolet regions of the spectrum. Excimer lasers can be used as ultraviolet sources. $CO_2$ lasers are particularly useful sources of infrared light. Infrared absorber(s) for inclusion in the reactant stream include, for example, $C_2H_4$, isopropyl alcohol, $NH_3$, $SF_6$, $SiH_4$ and $O_3$. $O_3$ and isopropyl alcohol can act as both an infrared absorber and as an oxygen source. The radiation absorber(s), such as the infrared absorber(s), can absorb energy from the radiation beam and distribute the energy to the other reactants to drive the pyrolysis.

Generally, the energy absorbed from the radiation beam, e.g., light beam, increases the temperature at a tremendous rate, many times the rate that heat generally would be produced by exothermic reactions under controlled condition(s). While the process generally involves nonequilibrium conditions, the temperature can be described approximately based on the energy in the absorbing region. The light reactive deposition process, similar to the laser pyrolysis process, is qualitatively different from the process in a combustion reactor where an energy source initiates a reaction, but the reaction is driven by energy given off by an exothermic reaction. Thus, while the light driven process for particle collection is referred to as laser pyrolysis, it is not a traditional pyrolysis since the reaction is not driven by energy given off by the reaction but by energy absorbed from a radiation beam. In particular, spontaneous reaction of the reactants generally does not proceed significantly, if at all, back down the reactant flow toward the nozzle from the intersection of the radiation beam with the reactant stream. If necessary, the flow can be modified such that the reaction zone remains confined.

An inert shielding gas can be used to reduce the amount of reactant and product molecules contacting the reactant chamber components. Inert gases can also be introduced into the reactant stream as a carrier gas and/or as a reaction moderator. Appropriate inert gases generally include, for example, Ar, He and $N_2$.

The particle production rate based on reactant delivery configurations described herein can yield particle production rates in the range(s) of at least about 0.1 g/h, in some embodiments at least about 10 g/h, in some embodiments at least about 50 g/h, in other embodiments in the range(s) of at least about 100 g/h, in further embodiments in the range(s) of at least about 250 g/h, in additional embodiments in the range(s) of at least about 1 kilogram per hour (kg/h) and in general up in the range(s) up to at least about 10 kg/h. A person of ordinary skill in the art will recognize that additional values of particle production rate within these specific values are contemplated and are within the present disclosure.

In general, these high production rates can be achieved while obtaining relatively high reaction yields, as evaluated by the portion of metal/metalloid nuclei in the flow that are incorporated into the product particles, a portion of which are incorporated into the powder coating. In general, the yield can be in the range(s) of at least about 30 percent based on the limiting reactant, in other embodiments in the range(s) of at least about 50 percent, in further embodiments in the range(s) of at least about 65 percent, in other embodiments in the range(s) of at least about 80 percent and in additional embodiments in the range(s) of at least about 95 percent based on the metal/metalloid nuclei in the reactant flow. A person of ordinary skill in the art will recognize that additional values of yield within these specific values are contemplated and are within the present disclosure.

Particle Deposition

In embodiments of particular interest, the powder coatings are formed by light reactive deposition. In light reactive deposition, a highly uniform flow of product particles is formed that are directed toward a substrate to be coated. The resulting particle coating can be formed into desired components of an electrochemical cell.

Light reactive deposition/radiation-based reactive deposition is a coating approach that uses an intense radiation source, e.g., light source, to drive synthesis of desired compositions from a flowing reactant stream. Light reactive deposition can result in deposition of powders, although hot particles deposited on the surface can partly fuse during the deposition process due to their temperature. Generally, particles in a product flow, as described herein, can be solid particles, liquid particles and softened particles that have not cooled sufficiently to completely solidify. Light reactive deposition involves a flowing reactant stream that intersects with the radiation beam at a reaction zone where reaction products form particles at least a portion of which are subsequently deposited onto a substrate. While the particles produced in laser pyrolysis are collected for subsequent use, in light reactive deposition, the resulting compositions are directed to a substrate surface where a coating is formed.

The characteristics of laser pyrolysis that can lead to the production of highly uniform particles can be correspondingly implemented in the production of coatings with high uniformity with additional attention to features relating to coating formation. In particular, a well-defined laser reaction zone result in particles with uniform size and composition that result in uniform coating properties. The shape of the laser beam can be controlled to produce particles under very uniform heating, nucleation and quenching conditions. The uniform particle size results in uniform packing and more controlled melting such that the resulting consolidated film has uniform and reproducible thickness. A uniformity in composition of the particles results in improved uniformity and reproducibility of component performance. The use of a flash evaporator for reactant delivery can improve the uniformity of chemical delivery, which further improves the uniformity of the chemical composition of the particles. Furthermore, in contrast with other methods that require the scanning of a substrate in two dimensions to form a layer, an elongated reactant inlet provides for the deposition of a uniform coating layer with one or few passes through the product stream such that a large number of stripes do not have to be stitched together.

In light reactive deposition, the coating of the substrate can be performed in a coating chamber separate from the reaction chamber or the coating can be performed within the reaction chamber. In either of these configurations, the reactant delivery system can be configured for the production of particles with various compositions. Thus, a wide range of coatings can be formed for further processing into desired materials.

If the coating is performed in a coating chamber separate from the reaction chamber, the reaction chamber is essentially the same as the reaction chamber for performing laser pyrolysis, although the reactant throughput and the reactant stream size may be designed to be appropriate for the coating process. For these embodiments, the coating chamber and a conduit connecting the coating chamber with the reaction chamber replace the collection system of the laser pyrolysis system. If the coating is performed within the reaction chamber, a substrate intercepts flow from the reaction zone, directly capturing the particles onto its surface.

A laser pyrolysis apparatus design incorporating an elongated reactant inlet has been developed that facilitates production of commercial quantities of particles. Specifically, the reaction chamber and reactant inlet are elongated significantly along the light beam to provide for an increase in the throughput of reactants and products. By orienting the light beam along the elongated reactant stream, a sheet of product particles is generated. This design has been described in U.S. Pat. No. 5,958,348 to Bi et al., entitled "Efficient Production of Particles by Chemical Reaction," incorporated herein by reference.

Additional embodiments and other appropriate features for commercial capacity laser pyrolysis apparatuses are described in copending U.S. patent application Ser. No. 09/362,631 to Mosso et al., entitled "Particle Production Apparatus," incorporated herein by reference. The delivery of gaseous/vapor reactants and/or aerosol reactants, as described further below, can be adapted for the elongated reaction chamber design. These designs for commercial production of powders by laser pyrolysis can be adapted for rapid coating of materials by light reactive deposition for electrochemical cell production.

The size of the elongated reactant inlet can be selected based on the size of the substrate to be coated. In some embodiments, the reactant inlet is somewhat larger than the diameter or other dimension across the substrate, such as a width, such that the entire substrate can be coated in one pass through the product stream. In other embodiments, the substrate is placed far enough away from the reactant inlet that the product particle stream spreads significantly prior to reaching the substrate such that a larger area of the substrate is simultaneously coated.

In general, the particle production apparatus with the elongated reactant inlet is designed to reduce contamination of the chamber walls, to increase the production capacity and to make efficient use of resources. Due to the chamber design, the elongated reaction chamber can provide for an increased throughput of reactants and products without compromising other performance properties during deposition. The dead volume of the chamber can become contaminated with unreacted compounds and/or reaction products. Furthermore, an appropriate flow of shielding gas can confine the reactants and products within a flow stream through the reaction chamber. The high throughput of reactants makes efficient use of the radiation (e.g., light) energy.

With light reactive deposition, the rate of production and/or deposition of the particles can be varied substantially, depending on a number of factors (e.g., the starting materials being utilized, the desired reaction product, the reaction conditions, the deposition efficiency, and the like, and combinations thereof). Thus, in some embodiments, based on reactant delivery configurations described herein the rate of particle production can vary in the range(s) from about 1 grams per hour of reaction product to about 100 kilograms per hour of desired reaction product. Specifically, using apparatuses described herein, coating can be accomplished at particle production rates in the range(s) of up to at least about 100 kilograms per hour (kg/hr), in other embodiments in the range(s) of at least about 1 kg/hr, in further embodiments with lower production rates in the range(s) of at least about 250 grams per hour (g/hr) and in additional embodiments in the range(s) of at least about 50 g/hr. A person of ordinary skill in the art will recognize that production rates intermediate between these explicit production rates are contemplated and are within the present disclosure. Exemplary rates of particle production (in units of grams produced per hour) include in the range(s) of not less than about 1, 5, 10, 50, 100, 250, 500, 1000, 2500, 5000, 10000 or 100000.

Not all of the particles generated are deposited on the substrate. In general the deposition efficiency depends on the relative speed of the substrate through the product stream with the particles, for embodiments based on moving the substrate through a sheet of product particles. Other factors affecting deposition efficiency include, for example, the particle composition, substrate orientation, particle temperature and substrate temperature. At moderate relative rates of substrate motion, coating efficiencies in the range(s) of not less than about 15 to about 20 percent have been achieved, i.e. about 15 to about 20 percent of the produced particles are deposited on the substrate surface. Routine optimization can increase this deposition efficiency further. At slower relative motion of the substrate through the product particle stream, deposition efficiencies in the range(s) of at least about 40 percent have been achieved and can be as high as 80 percent or more. In some embodiments, the rates of particle production are in the range(s) such that at least about 5 grams per hour, or alternatively or in addition, in the range(s) of at least about 25 grams per hour, of reaction product are deposited on the substrate. In general, with the achievable particle production rates and deposition efficiencies, deposition rates can be obtained in the range(s) of at least about 5 g/hr, in other embodiments in the range(s) of at least about 25 g/hr, in further embodiments in the range(s) of at least from about 100 g/hr to about 5 kg/hr and in still other embodiment in the range(s) from about 250 g/hr to about 2.5 kg/hr. A person of ordinary skill in the art will recognize that deposition rates between these explicit rates are contemplated and are within the present disclosure. Exemplary rates of particle deposition (in units of grams deposited per hour) include in the range(s) of not less than about 0.1, 0.5, 1, 5, 10, 25, 50, 100, 250, 500, 1000, 2500, or 5000.

Alternatively or in addition, the invention provides that the rate of the movement of the substrate and the particle flow relative to each other can vary substantially, depending on the desired specifications for the coated substrate. Thus, in one embodiment, the rate can be measured on an absolute scale, and can vary in the range(s) of at least about 0.001 inches per second, in other embodiments at least about 0.05 inches per second, in further embodiments, from about 1 inch per second to about 12 inches per second, or even more. A person of ordinary skill in the art will recognize that additional ranges and subranges within these explicit ranges are contemplated and are encompassed within the present disclosure. Further, in another embodiment, the rate can be measured on a scale relative to the substrate being coated, and can vary in the range(s) from about 0.05 substrates per minute to about 1 substrate per second.

For suitable platen/substrate sizes, at least a substantial portion of the substrate surface can be coated with a sufficient thickness to form a consolidated material at a rate in the range(s) of 2 microns per minute, in other embodiments in the range(s) of at least about 5 microns per minute, in some embodiments in the range(s) at least about 20 microns per minute, and in further embodiments in the range(s) at least about 100 microns per minute, in which the thickness refers to a powder coating sufficiently thick to form a consolidated material at the specified thickness. A person or ordinary skill in the art will recognize that additional ranges within these explicit ranges are contemplated and are within the present disclosure.

For appropriate embodiments using a sheet of product particles, the rate of relative substrate motion generally is a function of the selected deposition rate and the desired coating thickness as limited by the movement the substrate at the desired rate while obtaining desired coating uniformity. In embodiments in which the substrate is swept through the product particle stream, the substrate can be moved relative to a fixed nozzle, or the nozzle can be moved relative to a fixed substrate. Due to the high deposition rates achievable with light reactive deposition, extremely fast coating rates are easily achievable. A person of ordinary skill in the art can calculate with simple geometric principles any one of the following variables based on one or more of the other variables from the group of a coating rate, the deposition rate, the desired thickness and the density of powder on the substrate.

In particular, apparatus designs based on an actuator arm moving a substrate through the product particle stream within a reaction chamber, as described herein, can straightforwardly move a substrate at rates to coat an entire eight-inch by eight inch substrate in about 1 second or less. Generally, in embodiments of particular interest that take advantage of the rapid rates achievable, substrates are coated at rates in the range(s) of at least about 1 centimeters per second (cm/s), in further embodiments in the range(s) from about 2 cm/s to about 50 cm/s, and in other embodiments in the range(s) from about 5 cm/s to about 30 cm/s. A person of ordinary skill in the art will recognize that coating rates intermediate between these explicit rates are contemplated and are within the present disclosure.

Furthermore, the rapid production rate can be advantageously used to form a plurality of particle coatings with or without consolidation between coatings. Note that with respect to the deposition process, the layers referred to are coating layers. A functional layer can comprise one or a plurality of coating layers. Each coating can cover an entire layer or a portion of a layer. Compositions can be changed within a layer or between layers. When changing compositions significantly between layers, it may be desirable to wait a few seconds for the product stream to stabilize.

The design of the elongated reaction chamber 100 for generating a sheet of product particles is shown schematically in FIG. 1. A reactant inlet 102 leads to main chamber 104. Reactant inlet 102 conforms generally to the shape of main chamber 104. Main chamber 104 comprises an outlet 106 along the reactant/product stream for removal of particulate products, any unreacted gases and inert gases. Shielding gas inlets 108 are located on both sides of reactant inlet 102. Shielding gas inlets are used to form a blanket of inert gases on the sides of the reactant stream to inhibit contact between the chamber walls and the reactants or products. The dimensions of elongated reaction chamber 104 and reactant inlet 102 can be designed for highly efficiency particle production. Reasonable dimensions for reactant inlet 102 for the production of nanoparticles, when used with a $CO_2$ laser with a power in the several kilowatt range, are from about 5 mm to about 1 meter.

Tubular sections 110, 112 extend from the main chamber 104. Tubular sections 110, 112 hold windows 114, 116, respectively, to define a light beam path 118 through the reaction chamber 100. Tubular sections 110, 112 can comprise inert gas inlets 120, 122 for the introduction of inert gas into tubular sections 110, 112.

Outlet 106 can lead to a conduit directed to a coating chamber. The reaction zone is located within the reaction chamber. A change in dimension does not necessarily demarcate a transition from the reaction chamber to a conduit to the coating chamber for appropriate embodiments. The conduit can but does not necessarily involve a change in direction of the flow. Alternatively or additionally, a substrate can intercept the product flow to coat the substrate within the reactant chamber.

Figure 2:
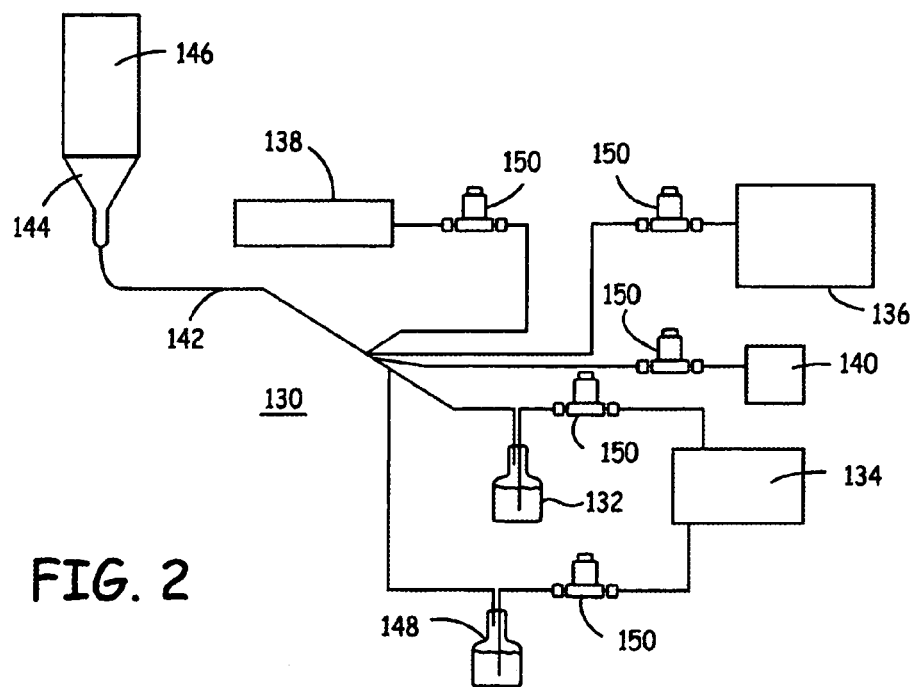
FIG. 2 is a schematic representation of a reactant delivery system for the delivery of vapor/gas reactants to a flowing reaction system, such as the laser pyrolysis reactor of FIG. 1.

Reactant inlet 102 is generally connected to a reactant delivery system. Referring to FIG. 2, an embodiment 130 of a reactant delivery apparatus comprises a source 132 of a precursor compound, which can be a liquid, solid or gas. For liquid or solid reactants, an optional carrier gas from one or more carrier gas sources 134 can be introduced into precursor source 132 to facilitate delivery of the reactant. Precursor source 132 can be a liquid holding container, a solid precursor delivery apparatus or other suitable container. The carrier gas from carrier gas source 134 can be, for example, an infrared absorber, an inert gas or mixtures thereof. In alternative embodiments, precursor source 132 is a flash evaporator that can deliver a selected vapor pressure of precursor without necessarily using a carrier gas. A flash evaporator can deliver a selected partial pressure of a precursor vapor into the reaction chamber, and other components leading to the reaction chamber can be heated, if appropriate, to reduce or eliminate condensation of the vapor prior to entry into the reaction chamber. Thus, a plurality of flash evaporators can be used to deliver precisely a plurality of vapor reactants into the reaction chamber.

The gases/vapors from precursor source 132 can be mixed with gases from infrared absorber source 136, inert gas source 138 and/or gaseous reactant source 140 by combining the gases/vapors in a single portion of tubing 142. The gases/vapors are combined a sufficient distance from the reaction chamber such that the gases/vapors become well mixed prior to their entrance into the reaction chamber. The combined gas/vapor in tube 142 passes through a duct 144 into channel 146, which is in fluid communication with a reactant inlet, such as 102 in FIG. 1.

An additional reactant precursor can be supplied as a vapor/gas from second reactant source 148, which can be a liquid reactant delivery apparatus, a solid reactant delivery apparatus, a flash evaporator, a gas cylinder or other suitable container or containers. As shown in FIG. 2, second reactant source 148 delivers an additional reactant to duct 144 by way of tube 142. Alternatively, second reactant source can deliver the second reactant into a second duct such that the two reactants are delivered separately into the reaction chamber where the reactants combine at or near the reaction zone. Thus, for the formation of complex materials and/or doped materials, a significant number of reactant sources and, optionally, separate reactant ducts can be used for reactant/precursor delivery. For example, as many as 25 reactant sources and/or ducts are contemplated, although in principle, even larger numbers could be used. Mass flow controllers 150 can be used to regulate the flow of gases/vapors within the reactant delivery system of FIG. 2. Additional reactants/precursors can be provided similarly for the synthesis of complex materials.

As noted above, the reactant stream can comprise one or more aerosols. The aerosols can be formed within the reaction chamber or outside of the reaction chamber prior to injection into the reaction chamber. If the aerosols are produced prior to injection into the reaction chamber, the aerosols can be introduced through reactant inlets comparable to those used for gaseous reactants, such as reactant inlet 102 in FIG. 1. For the formation of complex material, additional aerosol generators and/or vapor/gas sources can be combined to supply the desired composition within the reactant stream.

Figure 3:
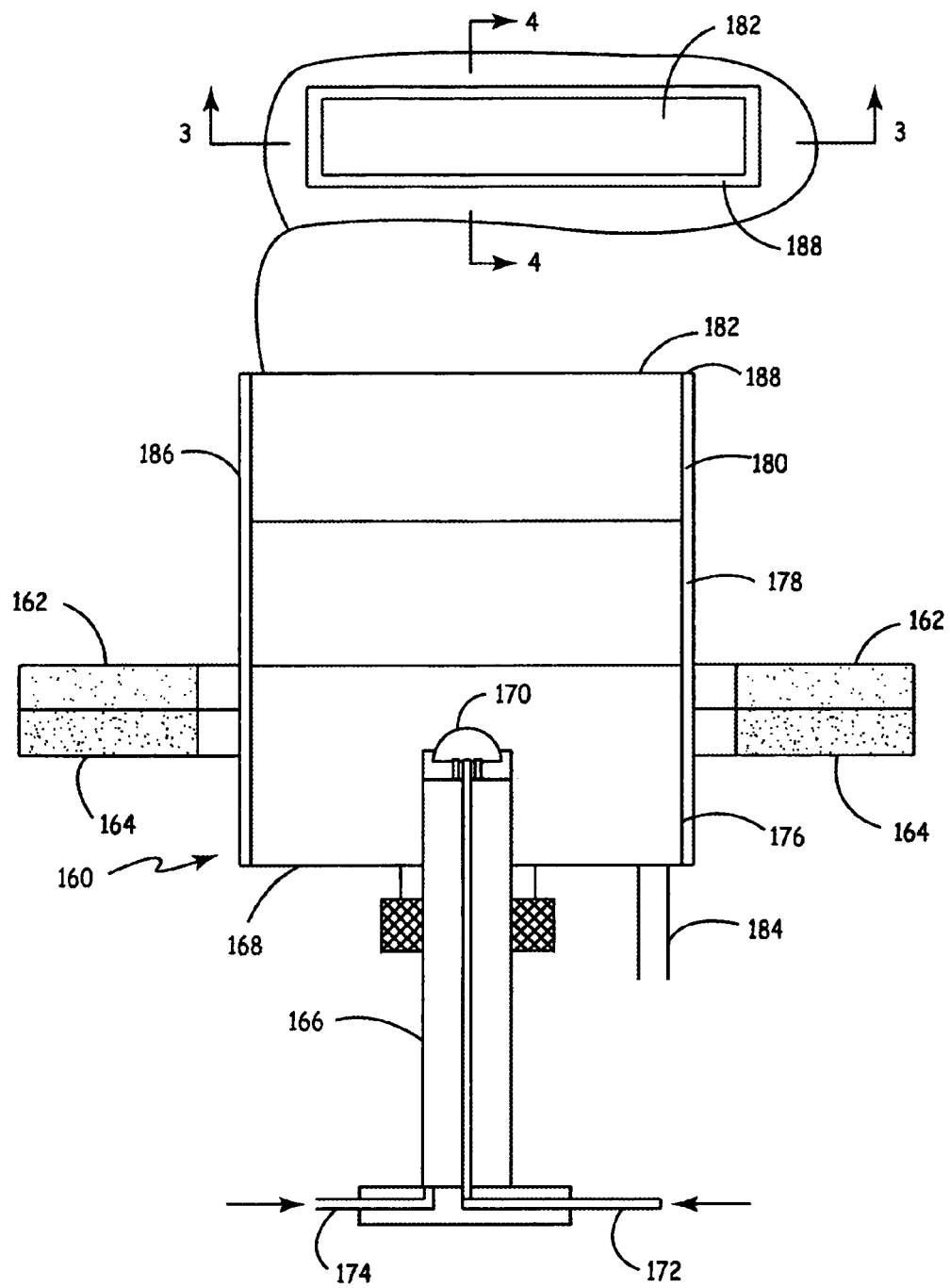
FIG. 3 is a sectional side view of a reactant inlet nozzle with an aerosol generator for the delivery of aerosol and gas/vapor compositions into a reaction chamber, wherein the cross section is taken along line 3-3 of the insert. The insert shows a top view of an elongated reactant inlet.
Figure 4:
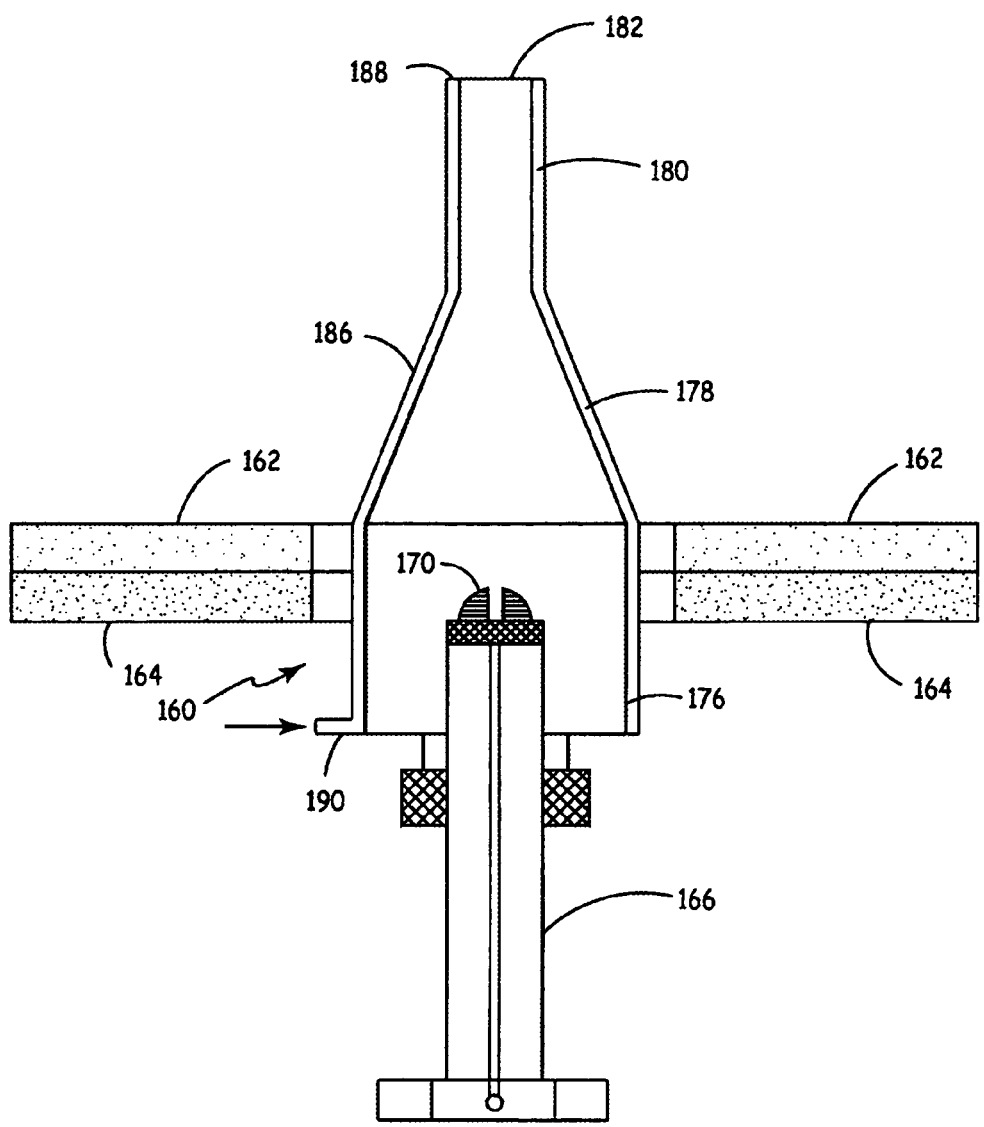
FIG. 4 is a sectional side view of the reactant inlet nozzle of FIG. 3 taken along the line 4-4 of the insert in FIG. 3.

An embodiment of a reactant delivery nozzle configured to deliver an aerosol reactant is shown in FIGS. 3 and 4. Inlet nozzle 160 connects with a reaction chamber at its lower surface 162. Inlet nozzle 160 comprises a plate 164 that bolts into lower surface 162 to secure inlet nozzle 160 to the reaction chamber. Inlet nozzle 160 comprises an inner nozzle 166 and an outer nozzle 168. Inner nozzle 166 can have, for example, a twin orifice internal mix atomizer 170 at the top of the nozzle. Suitable gas atomizers are available from Spraying Systems, Wheaton, Ill. The twin orifice internal mix atomizer 170 has a fan shape to produce a thin sheet of aerosol and gaseous compositions. Liquid is fed to the atomizer through tube 172, and gases for introduction into the reaction chamber are fed to the atomizer through tube 174. Interaction of the gas with the liquid assists with droplet formation.

Outer nozzle 168 comprises a chamber section 176, a funnel section 178 and a delivery section 180. Chamber section 176 holds the atomizer of inner nozzle 166. Funnel section 178 directs the aerosol and gaseous compositions into delivery section 180. Delivery section 180 leads to a rectangular reactant opening 182, shown in the insert of FIG. 3. Reactant opening 182 forms a reactant inlet into a reaction chamber for laser pyrolysis or light reactive deposition. Outer nozzle 168 comprises a drain 184 to remove any liquid that collects in the outer nozzle. Outer nozzle 168 is covered by an outer wall 186 that forms a shielding gas opening 188 surrounding reactant opening 182. Inert shielding gas is introduced through tube 190. Additional embodiments for the introduction of an aerosol with one or more aerosol generators into an elongated reaction chamber is described in U.S. Pat. No. 6,193,936 to Gardner et al., entitled "Reactant Delivery Apparatuses," incorporated herein by reference.

A secondary reactant compound such as an oxygen source, if present, should not react significantly with the metal precursor prior to entering the reaction zone since this generally would result in the formation of large particles. However, reacting precursors can be delivered into the reactant chamber through separate nozzles and/or separate inlets on a particular nozzle such that the reactant do not combine until they are near the reaction zone.

Light reactive deposition can be performed with a variety of optical frequencies, using either a laser or other strong focused radiation source, such as an arc lamp. Some desirable light sources operate in the infrared portion of the electromagnetic spectrum. $CO_2$ lasers are particularly convenient sources of light. Infrared absorbers for inclusion in the reactant stream comprise, for example, $C_2H_4$, water, isopropyl alcohol, $NH_3$, $SF_6$, $SiH_4$ and $O_3$. $O_3$, isopropyl alcohol and water can act as both an infrared absorber and as an oxygen source. The radiation absorber, such as the infrared absorber, absorbs energy from the radiation beam and distributes the energy to the other reactants to drive the resulting photothermal reaction.

Generally, the energy absorbed from the light beam increases the temperature at a tremendous rate, many times the rate that heat generally would be produced by exothermic reactions under controlled condition. While the process generally involves nonequilibrium conditions, the temperature can be described approximately based on the energy in the absorbing region. In light reactive deposition, the reaction process is qualitatively different from the process in a combustion reactor where an energy source initiates a reaction, but the reaction is driven by energy given off by an exothermic reaction. In a combustion reactor, there is generally no well-defined reaction zone with a boundary. The reaction zone is large, and the residence time of the reactants is long. Lower thermal gradients are generally present in the combustion reactor.

In contrast, the laser/light driven reactions have extremely high heating and quenching rates. The product compositions and particle properties generally depend on the radiation power in the reactions zone and the quantity of radiation absorbers in the flow. By controlling the composition of the reactant flow and the light intensity in the reaction zone, the reaction product can be reproducibly controlled. The effective temperature in the reaction zone can be controlled over a wide range, for example, in the range(s) from about room temperature (e.g., 20° C.) to about 3000° C. In light reactive deposition, the reaction zone is primarily at the overlap of the light beam and the reactant stream, although the reaction zone may extend, for example, a few millimeters beyond the light beam, depending on the precise character of the reaction. After leaving the reaction zone in a radiation/light driven reactor, the particles may still be somewhat fluid/soft due to their temperature even if the reaction has terminated.

Laser pyrolysis apparatuses can be adapted for light reactive deposition. The nature of the adaptation depends on whether or not the coating is performed in the reaction chamber or within a separate coating chamber. In any of the embodiments, the reactant delivery inlet into the reaction chamber generally is configured to deliver a reactant stream with dimensions that results in a product stream with desired dimensions for the deposition process. For example, in some embodiments, the reactant inlet has a length approximately the same size or slightly larger than the diameter of a substrate such that the substrate can be coated along an entire dimension of the substrate with one pass through the product stream without wasting excessive amount of product.

Figure 5:
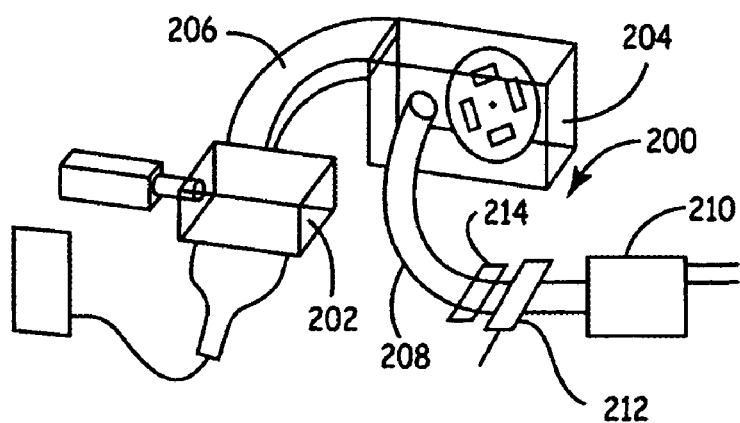
FIG. 5 is a schematic diagram of a light reactive deposition apparatus formed with a particle production apparatus connected to a separate coating chamber through a conduit.

The outlet of a laser pyrolysis apparatus can be adapted for the coating of substrates within a separate coating chamber. A coating apparatus with separate reaction chamber and coating chamber is shown schematically in FIG. 5. The coating apparatus 200 comprises a reaction chamber 202, a coating chamber 204, a conduit 206 connecting reaction chamber 202 with coating chamber 204, an exhaust conduit 208 leading from coating chamber 204 and a pump 210 connected to exhaust conduit 208. A valve 212 can be used to control the flow to pump 210. Valve 212 can be, for example, a manual needle valve or an automatic throttle valve. Valve 212 can be used to control the pumping rate and the corresponding chamber pressures. A collection system, filter, scrubber or the like 214 can be placed between the coating chamber 204 and pump 210 to remove particles that did not get coated onto the substrate surface.

Figure 6:
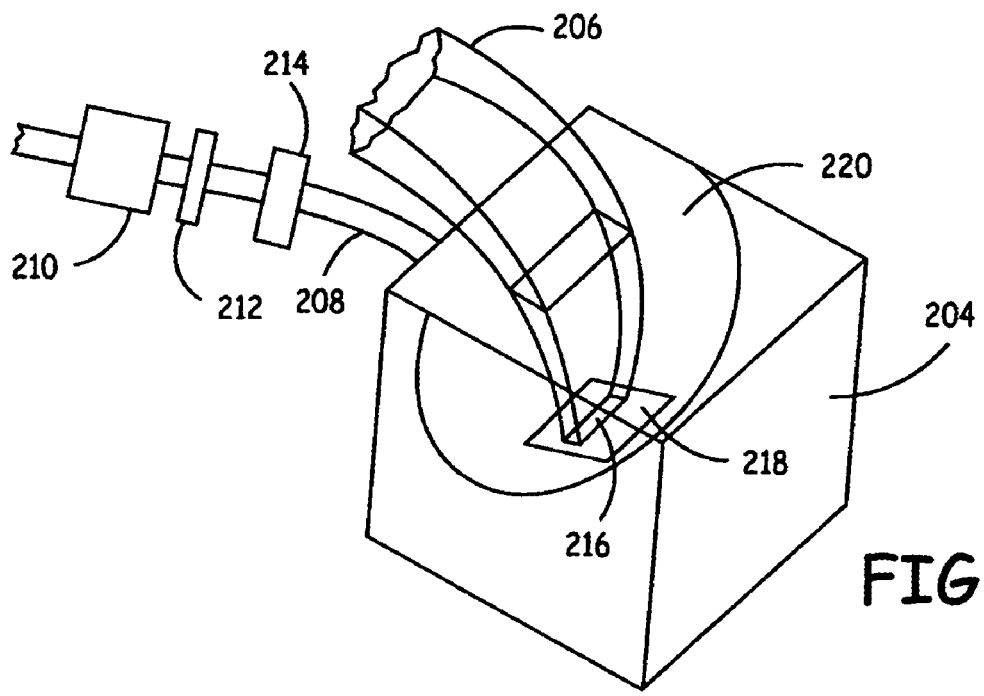
FIG. 6 is a perspective view of a coating chamber where the walls of the chamber are transparent to permit viewing of the internal components.

Referring to FIG. 6, conduit 206 from the particle production apparatus 202 leads to coating chamber 204. Conduit 206 terminates at opening 216 within chamber 204. In some embodiments, conduit opening 216 is located near the surface of substrate 218 such that the momentum of the particle stream directs the particles directly onto the surface of substrate 218. Substrate 218 can be mounted on a stage or other platform 220 to position substrate 218 relative to opening 216.

Figure 7:
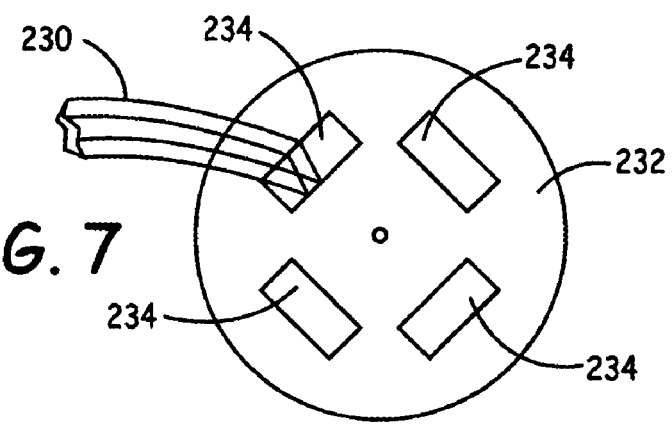
FIG. 7 is perspective view of a particle nozzle directed at a substrate mounted on a rotating stage.

An embodiment of a stage to position a substrate relative to the conduit from the particle production apparatus is shown in FIG. 7. A particle nozzle 230 directs particles toward a rotating stage 232. As shown in FIG. 7, four substrates 234 are mounted on stage 232. More or fewer substrates can be mounted on a moveable stage with corresponding modifications to the stage and size of the chamber. A motor is used to rotate stage 232. Other designs for a stage, conveyor or the like can be used to sweep the substrate through the product particle flow.

Movement of stage 232 sweeps the particle stream across a surface of one particular substrate 234 within the path of nozzle 230. Stage 232 can be used to pass sequential substrates through the product stream for one or more coating applications to each substrate. Stage 232 can comprise thermal control features that provide for the control of the temperature of the substrates on stage 232. Alternative designs involve the linear movement of a stage or other motions. In other embodiments, the particle stream is unfocused such that an entire substrate or the desired portions thereof is simultaneously coated without moving the substrate relative to the product flow.

If the coating is performed within the reaction chamber, the substrate is mounted to receive product compositions flowing from the reaction zone. The compositions/particles may not be fully solidified into solid particles, although quenching may be fast enough to form solid particles. Whether or not the compositions are solidified into solid particles, the particles can be highly uniform. The distance from the reaction zone to the substrate can be selected to yield desired coating results. In some embodiments, the substrate is mounted near the reaction zone. In general, the substrate/platen is placed in the range(s) from about 1 millimeter (mm) to about 1 meter coaxial to the reactant flow vector measured from the radiation beam edge, i.e., the downstream locus of points where the radiation intensity is a factor of $1/e^2$ of the maximum beam intensity, in other embodiments in the range(s) from about 2 mm to 50 centimeters (cm), and in further embodiments in the range(s) from about 3 mm to about 30 cm, although in some circumstances it is conceived that distances less than 1 mm and/or greater than 1 meter can have utility. A person of ordinary skill in the art will understand that additional ranges within the explicit ranges of substrate distances are conceived and are within the present disclosure. If the substrate is closer to the reaction zone, the coating process is more dynamic since the well defined product flow can be directed to desired substrate locations. However, if the substrate is placed farther away from the reaction zone, the coating process is more static in the sense that a more diffuse cloud of product particles is directed at the substrate.

Figure 8:
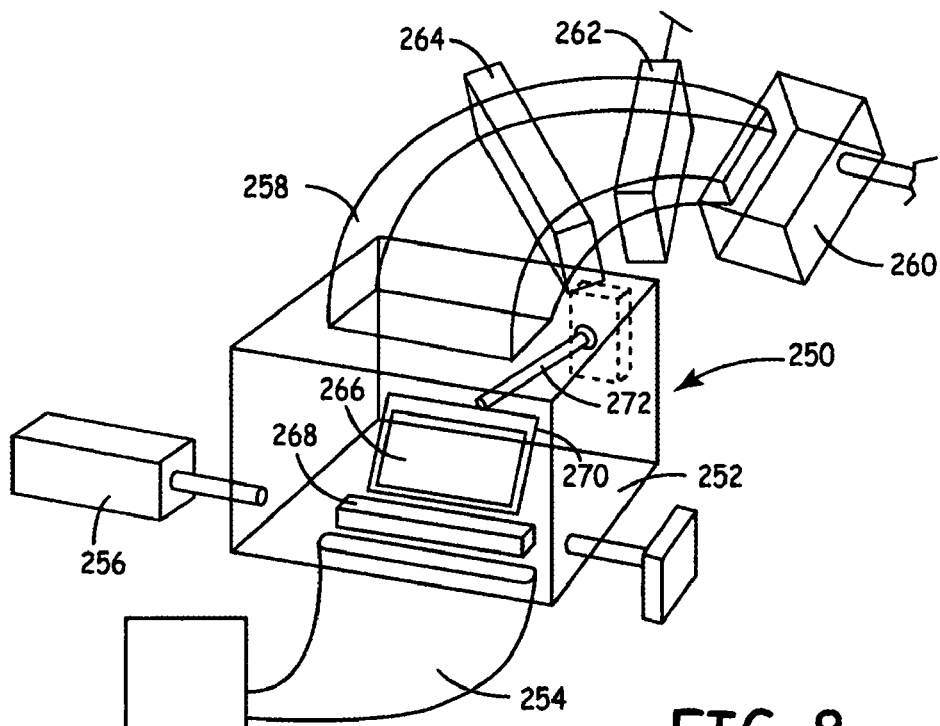
FIG. 8 is a schematic diagram of a light reactive deposition apparatus in which a particle coating is applied to a substrate within the particle production chamber.

An apparatus 250 to perform substrate coating within the reaction chamber is shown schematically in FIG. 8. The reaction/coating chamber 252 is connected to a reactant supply system 254, a radiation source 252 and an exhaust 258. Exhaust 258 can be connected to a pump 260, although the pressure from the reactant stream itself can maintain flow through the system. A valve 262 can be used to control the flow to pump 260. Valve 262 can be used to adjust the pumping rate and the corresponding chamber pressures. A collection system, filter, scrubber or the like 264 can be placed between chamber 252 and pump 260 to remove particles that did not get coated onto the substrate surface.

Substrate 266 can contact flow from a reaction zone 268 to coat the substrate with product particles/powders. Substrate 266 can be mounted on a stage, conveyor, or the like 270 to sweep substrate 266 through the flow. Specifically, stage 270 can be connected to an actuator arm 272 or other motorized apparatus to move stage 270 to sweep the substrate through the product stream. Various configurations can be used to sweep the coating across the substrate surface as the product leaves the reaction zone. A shown in FIG. 8, actuator arm 272 translates stage 270 to sweep substrate 266 through the product stream.

Figure 9:
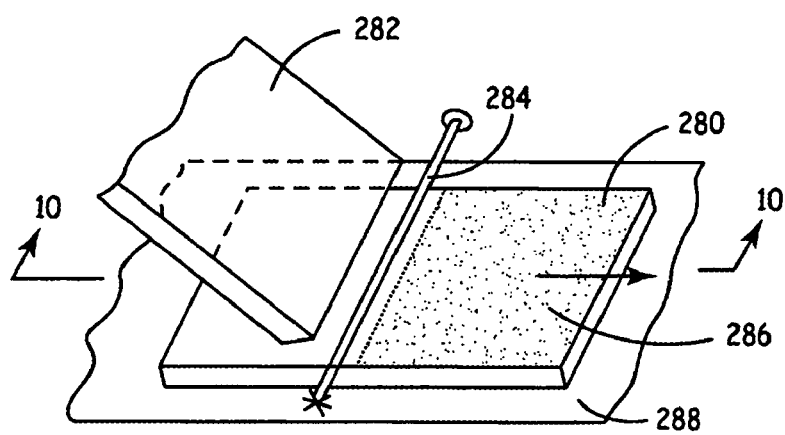
FIG. 9 is a perspective view of a reactant nozzle delivering reactants to a reaction zone positioned near a substrate.
Figure 10:
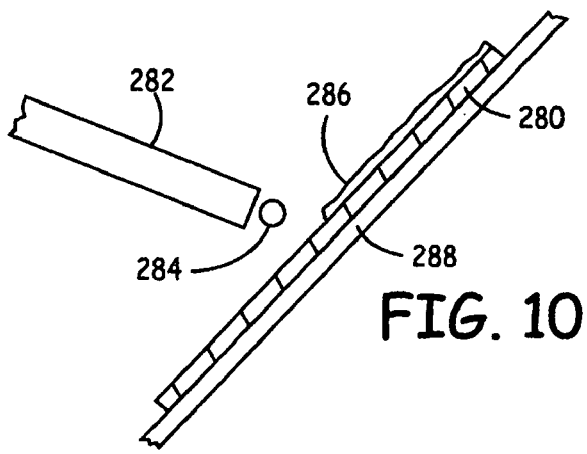
FIG. 10 is a sectional view of the apparatus of FIG. 9 taken along line 10-10.

A similar embodiment is shown in an expanded view in FIGS. 9 and 10. A substrate 280 moves relative to a reactant nozzle 282, as indicated by the right directed arrow. Reactant nozzle 282 is located just above substrate 280. An optical path 284 is defined by suitable optical elements that direct a light beam along path 284. Optical path 284 is located between nozzle 282 and substrate 280 to define a reaction zone just above the surface of substrate 280. The hot particles tend to attract to the cooler substrate surface.

Referring to FIGS. 9 and 10, a particle coating 286 is formed as the substrate is scanned past the reaction zone. In general, substrate 280 can be carried on a conveyor/stage 288. Conveyor/stage 288 can be connected to an actuator arm, as shown in FIG. 8. In alternative embodiments, rollers and a motor, a continuous belt conveyor, or any of a variety of design, comprising known designs, for translating a substrate can be used to carry the substrate.

In some embodiments, the position of conveyor 288 can be adjusted to alter the distance from substrate 286 to the reaction zone. Changes in the distance from substrate to the reaction zone correspondingly alter the temperature of the particles striking the substrate. The temperature of the particles striking the substrate generally alters the properties of the resulting coating and the requirements for subsequent processing, such as a subsequent heat processing consolidation of the coating. The distance between the substrate and the reaction zone can be adjusted empirically to produce desired coating properties. In addition, the stage/conveyor supporting the substrate can comprise thermal control features such that the temperature of the substrate can be adjusted to higher or lower temperatures, as desired.

For any of the coating configurations, the intersection of the flow with the substrate deflects the trajectory of the flow. Thus, it may be desirable to alter the position of the reaction chamber outlet to account for the change in direction of the flow due to the substrate. For example, it may be desirable to alter the chamber design to direct the reflected flow to the outlet and/or to change the position of the outlet accordingly. One particular example of an alternative flow configuration is shown in the embodiment below.

Figure 11:
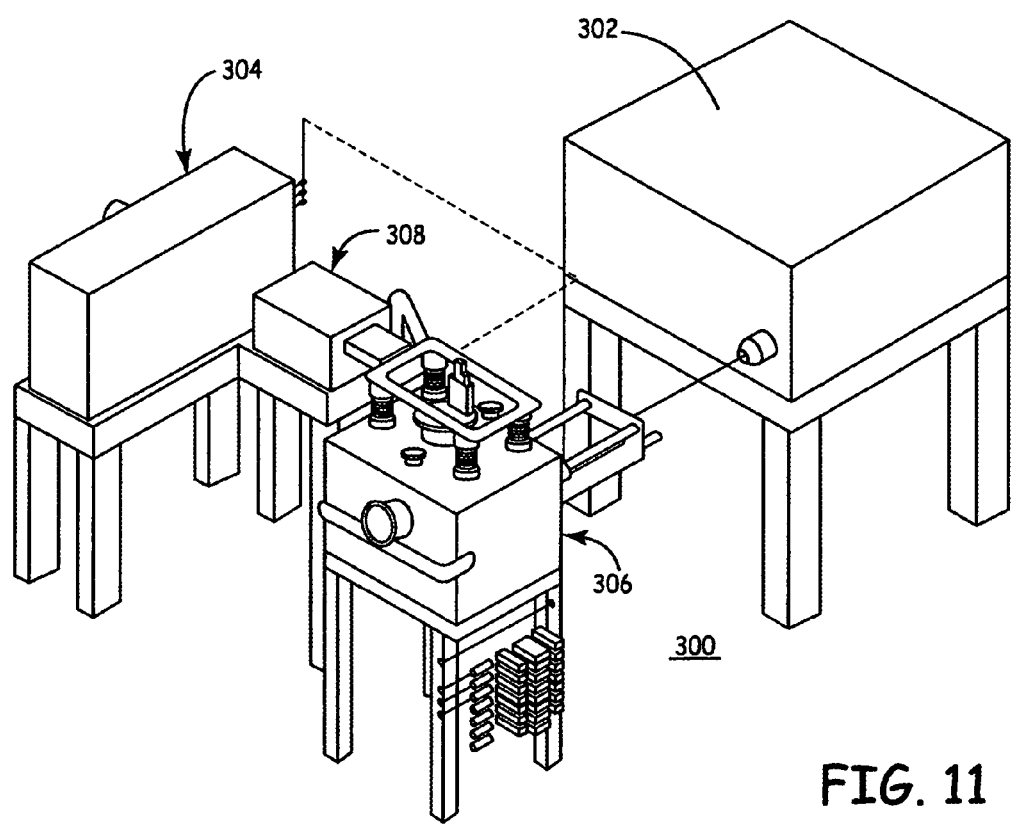
FIG. 11 is a perspective view of an embodiment of a light reactive deposition apparatus.

A specific embodiment of a light reactive deposition apparatus is shown in FIG. 11. Apparatus 300 comprises a $CO_2$ laser light source 302, a reactant delivery system 304, a reaction chamber 306, and exhaust system 308. In this embodiment, reactant delivery system 304 is configured specifically for the delivery of vapor/gaseous reactants. The specific diagram is shown with some specific reactants for forming doped silica glasses, although other reactants can be further included or substituted based on the disclosure herein.

Figure 12:
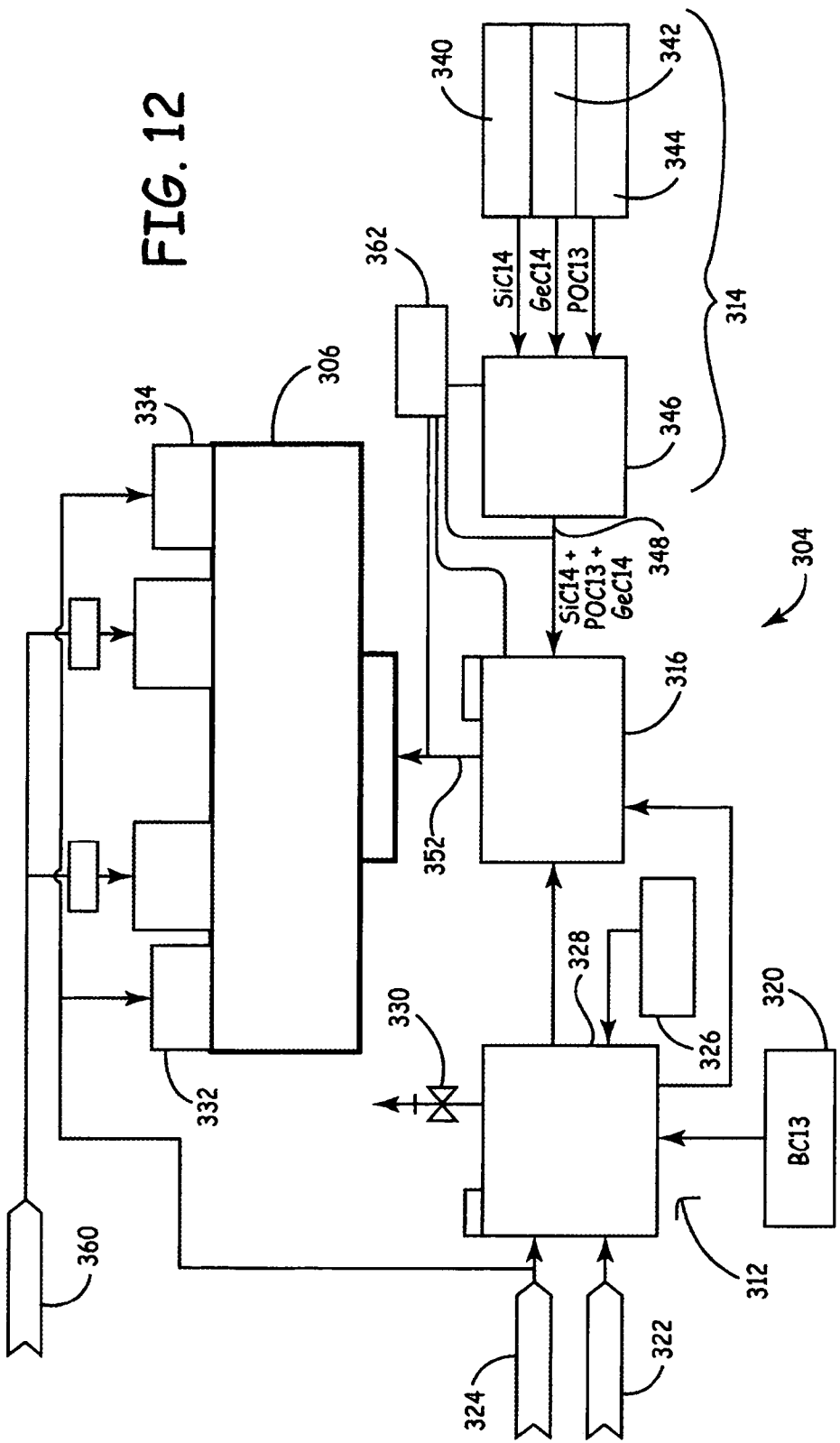
FIG. 12 is schematic diagram of the reactant delivery system of the apparatus in FIG. 11.

Reactant delivery system 304 is shown schematically in FIG. 12. As shown in FIG. 12, reactant delivery system 304 comprises a gas delivery subsystem 312 and a vapor delivery subsystem 314 that join a mixing subsystem 316. Gas delivery subsystem 312 can comprise one or more gas sources, such as a gas cylinder or the like for the delivery of gases into the reaction chamber. As shown in FIG. 12, gas delivery subsystem 312 comprises boron precursor source 320, an oxygen source precursor 322, an inert gas source 324, and a light absorbing gas source 326. The gases combine in a gas manifold 328 where the gases can mix. Gas manifold can have a pressure relief valve 330 for safety. Inert gas source 324 can be also used to supply inert gas within the chamber adjacent the windows/lenses 332, 334 used to direct light from an external light source into chamber 306.

Vapor delivery subsystem 314 comprises a plurality of flash evaporators 340, 342, 344. Each flash evaporator can be connected to a liquid reservoir to supply liquid precursor in suitable quantities. Suitable flash evaporators are available from, for example, MKS Equipment or can be produced from readily available components. As shown in FIG. 12, flash evaporators 340, 342, 344 respectively supply a silicon precursor, a germanium precursor and a phosphorous precursor. The flash evaporators can be programmed to deliver a selected partial pressure of the particular precursor. The vapors from the flash evaporator are directed to a manifold 346 that directs the vapors to a common feed line 348. The vapor precursors mix within common feed line 348.

The gas components from gas delivery subsystem 312 and vapor components from vapor delivery subsystem 314 are combined within mixing subsystem 316. Mixing subsystem 316 is a manifold that combines the flow from gas delivery subsystem 312 and vapor delivery subsystem 316. In the mixing subsystem 316, the inputs are oriented to improve mixing of the combined flows of different vapors and gases at different pressures. The mixing block has a slanted termination to reduce backflow into lower pressure sources. A conduit 352 leads from mixing system 350 to reaction chamber 304.

A separate shielding gas system 360 can be used to delivery inert shielding gas to a moving nozzle assembly in reaction chamber 304, although inert gas source 324 can be used to supply inert gas to an external section of the moving nozzle. The shielding gas from the external sections of the nozzle serve as a guide for the reactant precursor stream into the light reaction zone.

A heat controller 362 can be used to control the heat through conduction heaters or the like throughout the vapor delivery subsystem, mixing system 350 and conduit 352 to reduce or eliminate any condensation of precursor vapors. A suitable heat controller is model CN132 from Omega Engineering (Stamford, Conn.). Overall precursor flow is controlled/monitored by a DX5 controller from United Instruments (Westbury, N.Y.). The DX5 instrument can be interfaced with mass flow controllers (Mykrolis Corp., Billerica, Mass.) controlling the flow of one or more vapor/gas precursors. The automation of the system is integrated by a controller from Brooks-PRI Automation (Chelmsford, Mass.).

Figure 13:
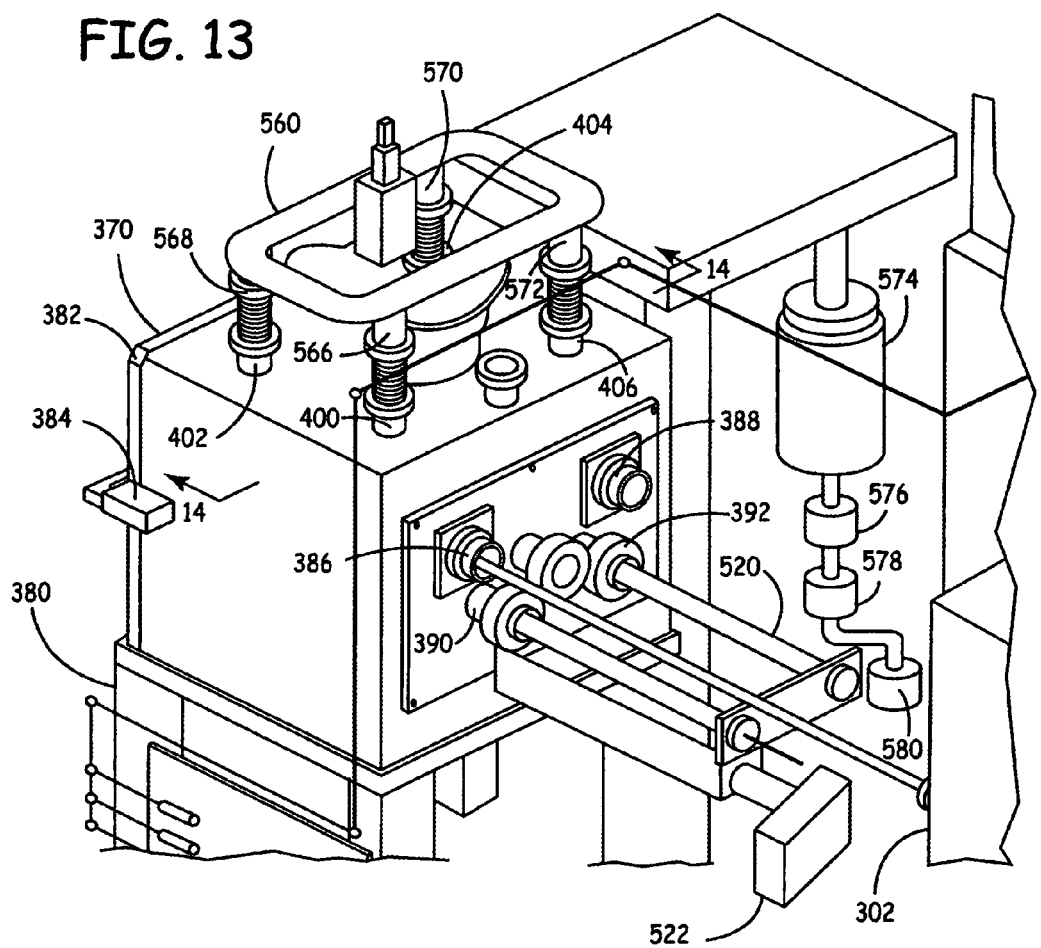
FIG. 13 is an expanded view of the reaction chamber of the apparatus of FIG. 11.

Reaction chamber 306 comprises a chamber structure 370, a wafer/substrate mount 372 and a moving nozzle system 374. Referring to FIG. 13, chamber structure 370 rests on a stand 380. Chamber structure 370 comprises a hatch 382 that secures closed with a latch 384. Chamber structure 370 also comprises a window 386 that is positioned to receive light from laser 302, and a window 388 for exiting light, which can be connected to a power meter (not shown). Window 386 can include a lens, such as a cylindrical lens. Chamber structure 370 interfaces with moving nozzle system 374 through sealed ports 390, 392. Chamber structure 370 interfaces with exhaust system 306 through four vents 400, 402, 404, 406.

Figure 14:
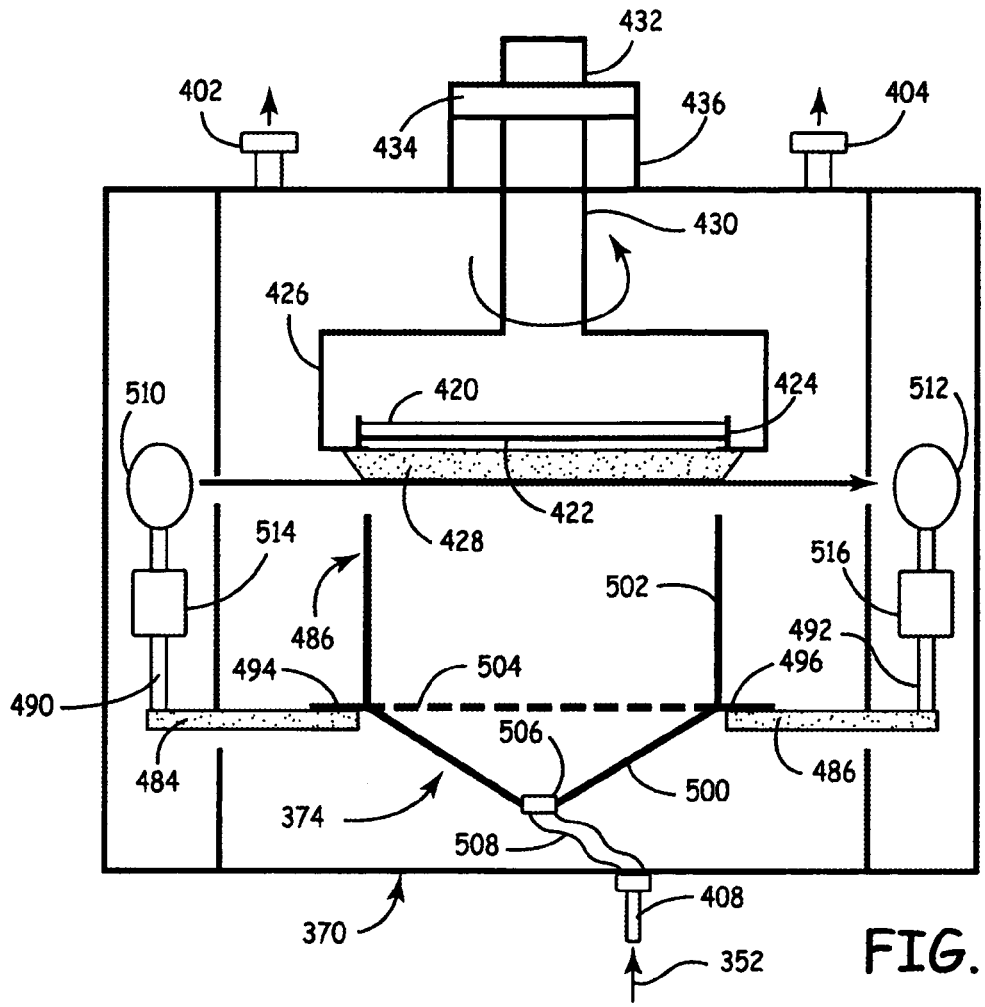
FIG. 14 is sectional view of the reaction chamber of FIG. 13 taken along line 14-14 of FIG. 13.
Figure 15:
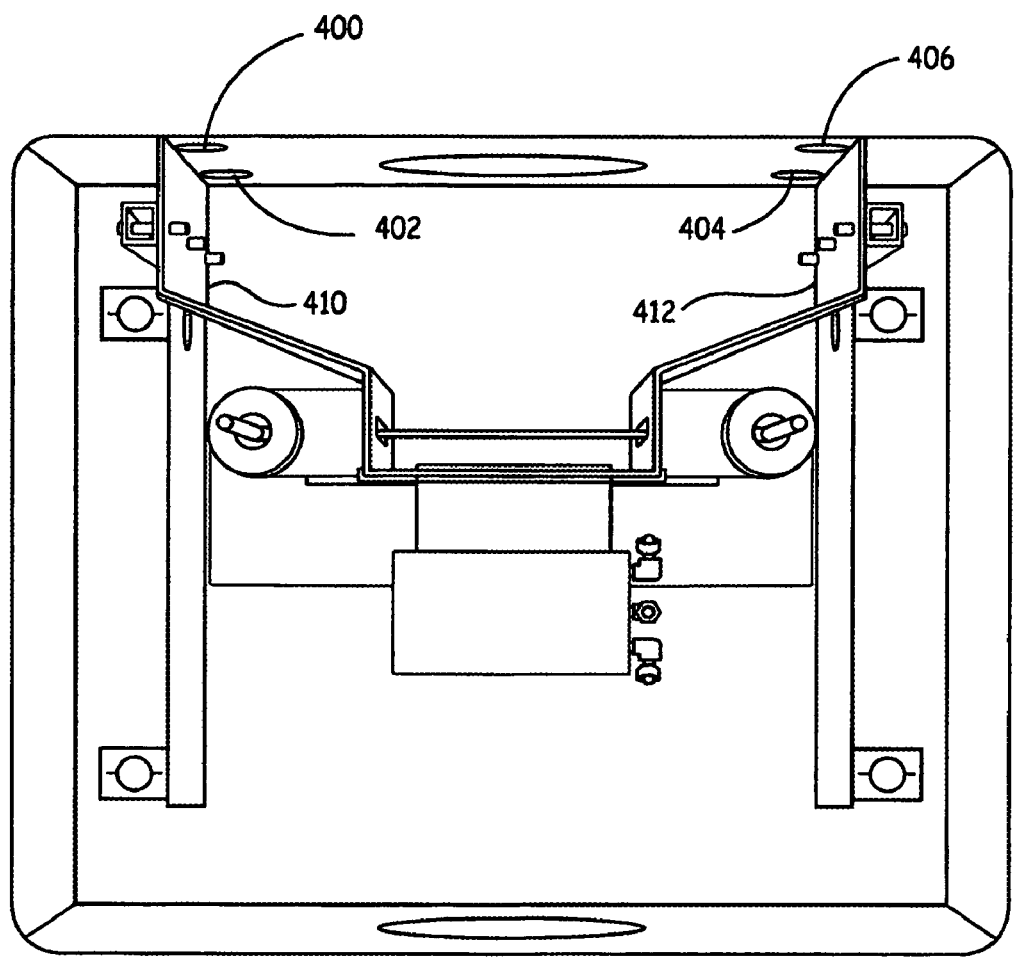
FIG. 15 is an alternative sectional view of the reaction chamber of FIG. 13 with the substrate holder portions removed and the baffle system visible.

Referring to FIG. 14, chamber structure 370 further comprises a reactant port 408 that connects reactant delivery system 302 at conduit 352 with moving nozzle system 374. Referring to FIG. 15, baffles 410, 412 guide flow to vents 400, 402, 404, 406.

Figure 16:
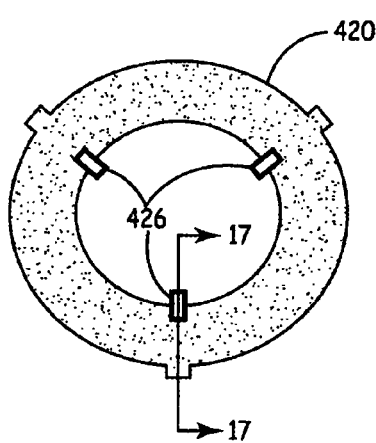
FIG. 16 is a top view of a substrate holder.
Figure 17:
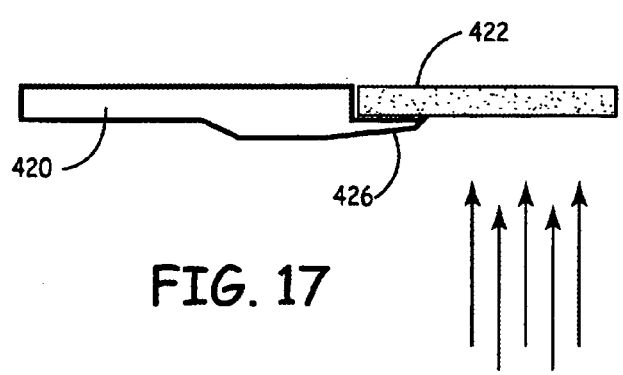
FIG. 17 is a sectional view of the substrate holder of FIG. 16 with a substrate with the section taken along line 17-17 of FIG. 16.

Substrate mount 372 comprises a substrate holder 420 that is supported with substrate 422 in brackets 424 within aluminum substrate mount 426. Referring to FIG. 16, substrate holder 420 is shown separated from the apparatus. Substrate holder 420 includes three pins 426 to hold the substrate, although a different number of pins can be used as desired. A sectional view is shown in FIG. 17 depicting the support of a substrate 422 by a pin 426. The flow of particles during the coating process is shown with arrows. Away from pins 426, substrate holder 420 and substrate 422 form an approximately flat continuous surface with a small gap such that edge effects of the coating deposition along the edge of the substrate are reduced or eliminated. Suitable materials for the formation of the substrate holder include, for example, aluminun oxide or molybdenum.

A two position shutter 428 can be selectively opened and closed to expose (open) or shield (closed) substrate 422. Aluminum substrate mount 426 comprises a shaft 430 that connects to a DC motor 432 through an o-ring seal 434 that is supported by mount 436 connected to chamber structure 370. With this structure, substrate 422 can be rotated. For example, the substrate can be rotated, e.g., 90 degrees or 180 degrees, between coating runs, or if desired within a coating run, or continuously throughout a coating run. In some embodiments, suitable motors are capable of rotating the substrate at a rate of about several hundreds if revolutions per minute.

Moving nozzle system 374 comprises a moving mount 480 and drive system 482. Moving mount 480 comprises a mounting bracket 484, 496, nozzle 488 and minor mounts 490, 492. Mounting brackets 484, 486 connect nozzle 488 and mirror mounts 490, 492. Nozzle 488 connects with mounting brackets 484, 486 at flanges 494, 496. Nozzle 488 also comprises funnel section 500 and rectangular section 502 with a metal grid 504. Funnel section expands from an orifice 506 to rectangular section 502. A flexible tube 508 connects orifice 506 with reactant port 408, such that the nozzle remains connected to the reactant delivery system as the nozzle moves. In a particular embodiment, rectangular section has a rectangular cross section with dimensions of 0.08 inches×4.65 inches as shown schematically a top view in FIG. 18, although other ratios of lengths or widths can be used. Metal grid 504 divides the flow from funnel section 500 to provide a more uniform flow in rectangular section 502. Nozzle designs for flowing reactors are described further in copending and commonly assigned U.S. patent application Ser. No. 10/119,645, now U.S. Pat. No. 6,919,054 to Gardner et al., entitled "Reactant Nozzles Within Flowing Reactors," incorporated herein by reference. Referring to FIG. 14, mirror mounts 490, 492 extend respectively from mounting brackets 484, 486. Mirror mounts 490, 492 also comprise respectively minors 510, 512, which can be, for example, parabolic or cylindrically focusing copper mirrors. The mirrors are water cooled. The light path between mirrors 510, 512 is shown with an arrow in FIG. 14. Mirror mounts 490, 492 connect with drive system 482 at support brackets 514, 516.

Figure 19:
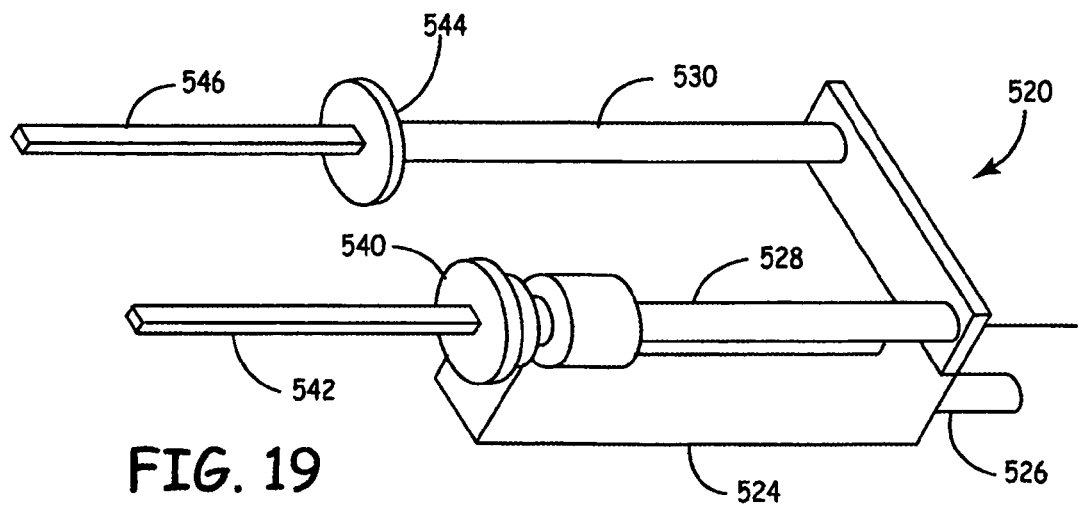
FIG. 19 is a perspective view of a dual linear manipulator, which is part of the drive system for the nozzle of the reaction chamber of FIG. 13, where the dual linear manipulator is separated from the reaction chamber for separate viewing.

Referring to FIG. 13, drive system 482 comprises a duel linear manipulator 520 and a motor 522. In one embodiment, the motor moves a magnet that couples to the manipulator arm such that it controls the movement of the manipulator arm. The movement of the manipulator arm results in the movement of the bracket/nozzle system. The velocity and acceleration throughout the motion can be precisely controlled. A suitable motor is a model P22NRXB-LNN-NF-00 from Pacific Scientific (Rockford, Ill.). Duel linear manipulator 520 comprises a motor interface bracket 524 with a motor interface rod 526. Motor interface bracket connects with a first shaft 528 and a second shaft 530, a shown in FIG. 19. First shaft 528 comprises stop 540 and a first support shaft 542, and second shaft 530 comprises a stop 544 and a second support shaft 546. Stops 540, 544 limit the motion of duel linear manipulator 520 when stops 540, 544 contact ports 390, 392. Support shafts 542, 546 slide through ports 390, 392, respectively, which are sealed with an o-ring. Furthermore, inert gas can be flowed from the back of the translator arm to purge the chamber and to keep the arms cleaner with respect to particles. Support shafts 542, 546 connect with moving nozzle system 374 at support brackets 514, 516, respectively, as shown in FIG. 14.

Support shafts support moving nozzle system 374. Furthermore, chamber 370 can comprise a support track to help support the moving nozzle system. For example, a guide rail can be included on each side of the chamber. The guide rails help to ensure uniformity during translation. In some embodiments, the arm comprises a flanged rulon bearing that roles over the guiding rail.

In one embodiment, exhaust system 308 comprises a conduit 560, as shown schematically in FIG. 13. Conduit 560 comprises channels 566, 568, 570, 572 that connect respectively with vents 400, 402, 404, 406. Exhaust system 308 further comprises a particle filter 574, two in-line Sodasorb® (W. R. Grace) chlorine traps 576, 578 and a pump 580. Conduit 560 connects with particle filter 574, and Sodasorb® traps 576, 578 are placed between particle filter 574 and pump 580 to prevent chlorine from damaging the pump. The line from second chlorine trap 578 can go directly to the pump. A suitable pump is a dry rotary pump from Edwards, such as model QDP80.

Figure 20:
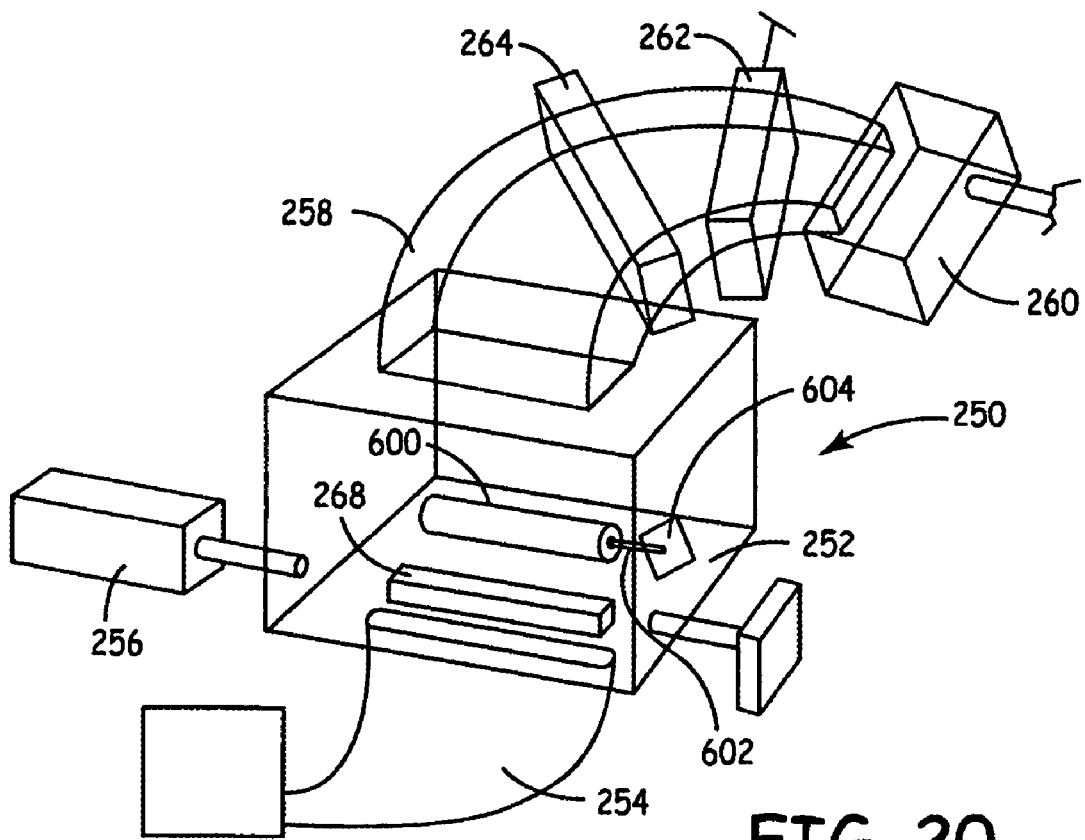
FIG. 20 is a schematic diagram of a light reactive deposition apparatus in which a particle coating is applied to a rod shaped substrate within the particle production chamber.

The apparatus of FIG. 8 can be adapted for the coating of rod shaped substrates. For example, referring to FIG. 20, a rod shaped substrate 600 is mounted within reaction chamber 252. Substrate 600 is supported by axel 602, which is connected to drive 604. Drive includes, for example, a suitable motor to turn axel 602. A direct drive or a drive with a suitable transmission can be used. A range of suitable motors is known in the art and are commercially available. Drive 604 can rotate substrate 600 to provide desired coating onto the outside of substrate 600. A person of ordinary skill in the art will recognize that additional embodiments suitable for rod shaped substrates can be constructed based on the disclosure herein. In anther embodiment, the substrate/platen is oriented with the axis facing the inlet nozzle. The inlet nozzle size and shape can be adjusted accordingly. The platen can be rotated to form a more uniform coating.

The temperature of the substrate during the deposition process can be adjusted to achieve particular objectives. For example, the substrate can be cooled during the deposition process since a relatively cool substrate can attract the particles to its surface through thermophoretic force. However, in some embodiments, the substrate is heated, for example to about 500° C., during the deposition process. In embodiments in which that the substrate is close enough to the reaction zone, the particle may be in a semi-molten state when they reach the substrate surface. Semi-molten particles may deform upon impact and may stick better due to the deformation. In addition, the particles tend to compact and fuse on a heated substrate such that a subsequent consolidation of the coating is facilitated if the coating were formed initially on a heated substrate.

The formation of coatings by light reactive deposition, especially for silicon glass deposition and optical devices, are described in general in copending U.S. patent application Ser. No. 09/715,935 to Bi et al., entitled "Coating Formation By Reactive Deposition," incorporated herein by reference, and in copending and U.S. patent application Ser. No. 10/414,443 filed on Apr. 15, 2003,entitled "Coating Formation By Reactive Deposition," incorporated herein by reference.

The well-defined reactant stream as a sheet of flow leading into the reaction zone tends to spread after the reaction zone due to heat from the reaction. If the substrate is swept relative to the reaction zone near the reaction zone, the spreading of the flow may not be significant. In some embodiments, it may be desirable to contact the substrate with the flow farther away from the reaction zone such that the flow has spread significantly and the entire substrate or desired portion thereof can be coated simultaneously without moving the substrate. The appropriate distance to obtain a uniform coating of particles depends on the substrate size and the reaction conditions. A typical distance of about 15 centimeters would be suitable for a platen/wafer with a 4-inch diameter. A general description of ranges of distances of the platen from the radiation beam is given above.

For these embodiment with simultaneous coating of the entire substrate surface, when the composition of the product particle flow is changed in time during the deposition process, the composition of the particles changes through the thickness of the coating. If the composition is changed continuously, a continuous composition gradient through the layer results. Alternatively or additionally, gradients can be formed within a layer or layers, such as parallel to a surface, for example, along one or more dimensions of x-y Cartesian coordinates relative to a z-axis that is normal to a substrate surface or a layered structure, if the structure is formed in layers.

Alternatively, the composition can be changed incrementally or discretely to produce layers with varying composition, which can involve a gradual change in composition between two compositions or discrete layers with discrete composition differences. The resulting transition material has a step-wise change in composition or morphology from a first composition/morphology to a second composition/morphology. Morphology can refer to properties of the material including, for example, primary particle size, phase of the composition, percent total porosity, percent open porosity, average pore size and pore size distribution. Generally, the first composition and second composition are the compositions of the adjacent layers (or adjacent compositions in the same layer) such that the transition material provides a gradual transition in composition between the two adjacent layers. While a transition material can have two layers, the transition material generally has at least three layers, in other embodiments at least 4 layers and in further embodiments in the range(s) from 5 layers to 100 layers. A person of ordinary skill in the art will recognize that additional range(s) within these specific ranges are contemplated and are within the present disclosure. The layers within the step-wise transition material may or may not have approximately equal thickness. Similarly, the step-wise change in composition may or may not take equivalent steps between layers of the transition material.

For the production of discrete structures on a substrate surface, the composition of the material generally is different at different locations along the plane of the substrate. To introduce the composition variation, the deposition process itself can be manipulated to produce specific structures. Alternatively, various patterning approaches can be used following the deposition for the formation of selected structures. Patterning following deposition of one or more coating layers is described further below.

Using the deposition approaches described herein, the composition of product particles deposited on the substrate can be changed during the deposition process to deposit particles with a particular composition at selected locations on the substrate to vary the resulting composition of the material along the x-y plane. For example, if the product particle compositions are changed while sweeping the substrate through the product particle stream, stripes or grids can be formed on the substrate surface with different particle compositions in different stripes or grid locations. Using light reactive deposition, the product composition can be varied by adjusting the reactants that react to form the product particle or by varying the reaction conditions. The reaction conditions can also affect the resulting product particle properties. For example, the reaction chamber pressure, flow rates, radiation intensity, radiation energy/wavelength, concentration of inert diluent gas in the reaction stream, temperature of the reactant flow can affect the composition and other properties of the product particles.

In some embodiments, the reactant flow can comprise vapor and/or aerosol reactants, which can be varied to alter the composition of the products. In particular, dopant concentrations can be changed by varying the composition and/or quantity of dopant elements in the flow.

While product particle composition changes can be introduced by changing the reactant flow composition or the reaction conditions while sweeping a substrate through the product stream, it may be desirable, especially when more significant compositional changes are imposed to stop the deposition between the different deposition steps involving the different compositions. For example, to coat one portion of a substrate with a first composition and the remaining portions with another composition, the substrate can be swept through the product stream to deposit the first composition to a specified point at which the deposition is terminated. The substrate is then translated the remaining distance without any coating being performed. The composition of the product is then changed, by changing the reactant flow or reaction conditions, and the substrate is swept, after a short period of time for the product flow to stabilize, in the opposite direction to coat the second composition in a complementary pattern to the first composition. Especially for glass compositions, a small gap can be left between the coatings of the first composition and the second composition to reduce the presence of a boundary zone with a mixed composition. The small gap can fill in during the consolidation step to form a smooth surface with a relatively sharp boundary between the two materials.

The deposition process can be generalized for the deposition of more than two compositions and/or more elaborate patterns on the substrate. In the more elaborate processes, a shutter can be used to block deposition while the product flow is stabilized and/or while the substrate is being positioned. A precision controlled stage/conveyor can precisely position and sweep the substrate for the deposition of a particular composition. The shutter can be rapidly opened and closed to control the deposition. Gaps may or may not be used to slightly space the different location of the compositions within the pattern.

In other embodiments, a discrete mask is used to control the deposition of particles. A discrete mask can provide an efficient and precise approach for the patterning of particles. With chemical vapor deposition and physical vapor deposition, a layer of material is built up from an atomic or molecular level, which can involve intimate binding of the mask to the underlying substrate at an atomic or molecular level to prevent migration of the material being deposited under the mask to blocked regions. Thus, the coated masks are a coating on the surface without an independent, self-supporting structure corresponding to the mask, and the coated mask is chemically or physically bonded to the surface with atomic level contact along the coated mask. In contrast, with particle deposition as described herein, the particles generally can be at least macromolecular in size with diameters in the range(s) of about 1 nanometer (nm) or more such that a mask with a flat surface placed against another flat surface provides sufficient contact to prevent significant particle migration past the mask. While coated masks can be effectively used in light reactive deposition, physical masks provide an efficient alternative to coated masks for patterning a surface. The physical masks have an intact self-supporting structure that is not bonded to the surface such that the mask can be removed intact from the surface that is coated. Therefore, the discrete mask approach herein is different from previous masking approaches adapted from photolithography for vapor deposition approaches.

In these embodiments, the formation of the particle coating correspondingly involves directing a product particle stream at the substrate shielded with the discrete mask. The discrete mask has a surface, generally a planar surface, with openings at selected locations. The discrete mask blocks the surface except at the openings such that particles can deposit on the surface through the openings. Thus, the mask provides for patterning compositions on the surface by the selected placement of the openings. In some embodiments, suitable discrete masks comprise a mask with a slit that is narrower than the product particle flow such that the deposition process can be very precisely controlled. Movement of the slit can form a desired, precisely controlled pattern with one or more compositions. After use of a discrete mask, it can be removed and reused.

In some embodiments, a plurality of masks can be used to deposit particles along a single layer. For example, following deposition of a pattern through a first mask, a second complementary mask can be used to deposit material over at least a portion of the surface left uncovered during deposition with the first mask. Further complementary masks can be used to form complex patterns while completing a single layer or portion thereof with a coating having varying chemical composition over the layer.

Thus, using light reactive deposition, a range of effective approaches are available to vary the chemical composition of materials within layers and in different layers to form three-dimensional structures with selected compositions and/or morphologies are selected locations within the material. In other words, the properties and/or composition of the materials can be varied along all thee axes, x, y and z, within the structure to firm desired structures. The patterning of compositions of materials during the deposition process is described in copending U.S. patent application Ser. No. 10/027,906, now U.S. Pat. No. 6,952,504 to Bi et al., entitled "Three Dimensional Engineering of Optical Structures," incorporated herein by reference.

The general process description above can be used to form various fell cell stacks and/or components thereof. A few more specific approaches are described in further detail to further elucidate the capabilities of the deposition approaches for fuel cell applications. In one embodiment for the formation of a proton exchange membrane fuel cell, a complete cell assembly can be formed based on light reactive deposition. Initially, a porous layer can be formed as a membrane support. The membrane support layer can be an inert material, such as $TiO_2$, tungsten oxide, $Al_2O_3$, or combinations thereof, or a ceramic proton conductor, such as doped $BaCeO_3$, $SrCeO_3$ or combinations thereof. Then, as an anode, a platinum-carbon composite is deposited on top of the membrane support layer. The elemental carbon can act as an electrical conductor. The platinum can be alloyed with Rh, Mo, W or other metal. In some embodiments, the platinum electrocatalyst can be replaced with WC or other nitride, carbide, oxynitride or oxycarbide electrocatalyst. A carbon gas diffusion layer, which is electrically conductive, can be deposited on top of the anode composite. The structure can then be removed from the platen/substrate. The membrane support can then be infiltrated with a proton conducting polymer through the exposed surface of the membrane support. The polymer infusion can be performed to avoid placement of polymer to block the gas diffusion layer. The process is repeated to form a cathode structure with an electrocatalyst, such as platinum, platinum alloy or doped transition metal oxide, such as Ni—MnO. To complete the cell assembly, the membrane supports for the anode structure and the cathode structure can be placed together and hot pressed to form a cell assembly. In an alternative embodiment, a polymer membrane is placed on the platen/substrate at the start of the deposition process such that the electrode is deposited onto the polymer membrane. In this embodiment, a membrane support is not formed.

For the formation of a molten carbonate fuel cell, the cathode can be deposited first. Specifically, elemental carbon can be co-deposited with NiO doped, for example, with Co, Li, Mo or combinations thereof, or with doped $LiCoO_2$ or doped $LiFeO_2$. To co-deposit these materials, the amount of $O_2$ and $C_2H_4$ in the react flow can be appropriately adjusted. The ethylene ($C_2H_4$) can be replaced with isopropyl alcohol, methane, or other carbon source, which may or may not be a light absorbed if sufficient other light absorbing compounds are present. A cathode/electrolyte layer is deposited with a mixture of cathode compositions and electrolyte compositions. Then, an electrolyte layer can be deposited with $LiAlO_2$, such as γ-phase $LiAlO_2$, matrix and a roughly eutectic blend of $Li_2CO_3$ and $K_2CO_3$. In some embodiments, the electrolyte comprises on the order of 40 weight percent $LiAlO_2$, and the eutectic blend of the carbonates has about 62 mole percent $Li_2CO_3$ and 38 mole percent $K_2CO_3$. The deposition of a submicron-particle powder blend of lithium aluminum oxide and lithium carbonate is described in the examples below. For the electrolyte layer, a lesser amount of ethylene $C_2H_4$ or other carbon source can be used. Next, an electrolyte-anode layer can be deposited with a blend of electrolyte and anode materials. Then, an anode layer can be deposited comprising carbon mixed with elemental nickel metal or nickel doped with Al, Cu, Cr, Mn, Mo, Ti, or combinations thereof. In alternative or additional embodiments, the anode can comprise doped $LiFeO_2$. This layer can be deposited with a $C_2H_4$ rich reactant mixture as a source of carbon. Once the cell assembly is deposited, it can be heated to melt the $Li_2CO_3/K_2CO_3$ eutectic blend and to pyrolize the carbon to form pores.

For the formation of a solid oxide fuel cell, a thick anode or a thick cathode generally can be used to support the cell. A cathode can be deposited initially onto a platen. The cathode generally comprises a catalyst material, such as strontium doped—$La_{1-x}Sr_xMnO_3$, x=0.1 to 0.15. Then, a cathode—electrolyte blended layer can be deposited over the cathode layer. The blended layer generally comprises an electrolyte composition, such as yttria stabilized zirconia. Next, a dense electrolyte layer is deposited, generally with a reactant stream with relatively less ethylene to eliminate elemental carbon deposition. The electrolyte layer can partially fill in pores within the previous layer. An electrolyte-anode blended layer can be deposited over the electrolyte layer. The catalyst for the anode layer generally is a metal composition, such as NiO, NiO doped with Fe, Mo, W, Co, Mn, Ti, Cr, Zr, Cu, V or the like, CuO, CuO doped with Fe, Mo, W, Cr, Ti, Zr, Ni, V or the like, or combinations thereof. The NiO and CuO are reduced in situ to form a metal catalyst and electrical conductor. CuO can be used further in combination with $CeO_3$. The anode can be stabilized with an ion conductor, for example, a stabilized zirconia, such as yttria stabilized, scandia stabilized, magnesium oxide stabilized or calcium oxide stabilized zirconia. Similarly, ceramic catalyst materials described elsewhere herein can be used as an alternative or in addition to the NiO or CuO. Then, an anode layer can be deposited with the anode catalyst and elemental carbon, which is subsequently pyrolized to introduce porosity. Optionally, the structure can be heated to densify and/or convert the electrode layers to the desired phase. The steps generally can be reversed to deposit the anode first. In alternative embodiment, the cell assemblies can be deposited onto a metal support rather than a platen from which it is subsequently removed. In general, a solid oxide fuel cell has a thick layer that functions as a support for the cell. The support layer can be the anode, cathode, electrolyte or metal interconnect. The thick layer generally is selected to have appropriate relatively high conductivity, whether ionic conductivity or electrical conductivity.

In some of these embodiments, the fuel cell structure is deposited onto a platen, i.e., substrate from which it is subsequently removed. As noted above, a release layer can be deposited to facilitate removal of the desired structure. The structure following removal can be polished to remove remnants of the release layer. In other approaches, a release layer is deposited that has a significantly different coefficient of thermal expansion such that heating or cooling fractures the release layer providing for the release of the structure. In other embodiments, the platen is coated with a highly crosslinked polymer such that the deposited structure will easily release form the material. In still further embodiments, the initial particle size of the deposited material is significantly larger than subsequent particles such that the larger particles do not stick well to the surface, and mechanical force releases the structure form the substrate.

Composition of Coatings

Adaptation of laser pyrolysis for the performance of light reactive deposition can be used to produce coatings of comparable compositions as the particles with selected compositions that can be produced by laser pyrolysis, which span a broad range of compositions. Specifically, the compositions can comprise one or more metal/metalloid elements forming a crystalline or amorphous material with an optional dopant or additive composition. In addition, dopant(s)/additive(s) can be used to alter the chemical and/or physical properties of the particles. Generally, the powders comprise fine or ultrafine particles with particle sizes in the submicron/nanometer range. The particles may or may not partly fuse or sinter during the deposition while forming a powder coating. To form a densified layer, a powder coating can be consolidated. Incorporation of the dopant(s)/additive(s) into the powder coating, during its formation or following its formation, results in a distribution of the dopant(s)/additive(s) through the densified material.

In general, the submicron/nanoscale particles, as a particle collection or a powder coating, can generally be characterized as comprising a composition including a number of different elements and present in varying relative proportions, where the number and the relative proportions can be selected as a function of the application for the particles. Typical numbers of different elements include, for example, numbers in the range(s) from about 1 element (an elemental material) to about 15 elements, with numbers of 1, 2, 3, 4, 5, 6, 7, 8, 9, 10, 11, 12, 13, 14, and 15 being contemplated. In some embodiments, some or all of the elements can be a metal/metalloid element. General numbers of relative proportions include, for example, values in the range(s) from about 1 to about 1,000, 000, with numbers of about 1, 10, 100, 1000, 10000, 100000, 1000000, and suitable sums thereof being contemplated. In addition, elemental materials are contemplated in which the element is in its elemental, un-ionized form, such as a metal/metalloid element, i.e., $M^0$.

Alternatively or additionally, such submicron/nanoscale particles can be characterized as having the following formula:

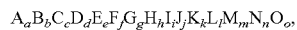

$$A_aB_bC_cD_dE_eF_fG_gH_hI_iJ_jK_kL_lM_mN_nO_o,$$

where each A, B, C, D, E, F, G, H, I, J, K, L, M, N, and O is independently present or absent and at least one of A, B, C, D, E, F, G, H, I, J, K, L, M, N, and O is present and is independently selected from the group consisting of elements of the periodic table of elements comprising Group 1A elements, Group 2A elements, Group 3B elements (including the lanthanide family of elements and the actinide family of elements), Group 4B elements, Group 5B elements, Group 6B elements, Group 7B elements, Group 8B elements, Group 1B elements, Group 2B elements, Group 3A elements, Group 4A elements, Group 5A elements, Group 6A elements, and Group 7A elements; and each a, b, c, d, e, f, g, h, i, j, k, l, m, n, and o is independently selected and stoichiometrically feasible from a value in the range(s) from about 1 to about 1,000,000, with numbers of about 1, 10, 100, 1000, 10000, 100000, 1000000, and suitable sums thereof being contemplated. The materials can be crystalline, amorphous or combinations thereof. In other words, the elements can be any element from the periodic table other than the noble gases. As described herein, all inorganic compositions are contemplated, as well as all subsets of inorganic compounds as distinct inventive groupings, such as all inorganic compounds or combinations thereof except for any particular composition, group of compositions, genus, subgenus, alone or together and the like.

While some compositions are described with respect to particular stoichiometries/compositions, stoichiometries generally are only approximate quantities. In particular, materials can have contaminants, defects and the like. Similarly, some amorphous materials can comprise essentially blends such that the relative amounts of different components are continuously adjustable over ranges in which the materials are miscible. In other embodiments, phase separated amorphous materials can be formed with differing compositions at different domains due to immiscibility of the materials at the average composition. Furthermore, for amorphous and crystalline materials in which elements of a corresponding compound has a plurality of oxidation states, the materials can comprise a plurality of oxidation states. Thus, when stoichiometries are described herein, the actual materials may comprise other stoichiometries of the same elements also, such as $SiO_2$ also include some SiO and the like.

In some embodiments, such as for materials suitable for electrochemical cells, powders can comprise as a host material, for example, metalloid particles, metal particles, and metal/metalloid compositions, such as, metal/metalloid oxides, metal/metalloid carbides, metal/metalloid nitrides, metal/metalloid phosphides, metal/metalloid sulfides, metal/metalloid phosphates and mixtures and combinations thereof. Especially in amorphous materials, great varieties of elemental compositions are possible within a particular material. While laser pyrolysis is versatile with respect to the production of particles, with a wide range of compositions, in one embodiment, certain host materials for the introduction of dopant(s)/additive(s) are desirable because of their particular ability to be processed into layers that are processible into desired materials. The approaches described herein for particle formation and coating formation are particularly suitable for formation of metal/metalloid oxide particles with or without dopant(s)/additive(s). Similarly, laser pyrolysis and light reactive deposition are suitable approaches for producing particle collections and powder coatings for the non-oxide materials, as described further below. A range of doped and un-doped metal/metalloid materials and compositions are suitable for incorporation into fuel cells. Some specific materials of interest are described further below.

In addition, particles and powder coatings can include one or more dopants/additives within an amorphous material and/or a crystalline material. Dopant(s)/additive(s), which can be complex blends of dopant/additive composition(s), generally are included in non-stoichiometric amounts. A dopant/additive is generally metal or metalloid element, although other dopant(s)/additive(s) of interest include fluorine, chlorine, nitrogen and/or carbon, which substitute for oxygen in oxides or other anions relative to metal/metalloid components. Since these anion dopant(s)/additive(s), like some cation dopants, tend to disrupt the oxygen bonded network of oxides, these tend to lower the flow temperature of oxide materials. The dopant(s)/additive(s) generally can, for example, replace other constituents within the material in order to maintain overall electrical neutrality. Dopant(s)/additive(s) can impart desirable properties to the resulting materials. The amount of dopant(s)/additive(s) can be selected to yield desired properties while maintaining appropriate chemical stability to the material. In crystalline materials, dopant/additive element(s) can replace host elements at lattice sites, dopant/additive element(s) can reside at previously unoccupied lattice sites and/or dopant/additive element(s) can be located at interstitial sites. Unlike dopant(s)/additive(s) within crystalline materials in which the crystal structure influences incorporation of the dopant(s)/additive(s), dopant(s)/additive(s) within amorphous materials can behave more as a composition dissolved within the host material to form a solid mixture. Thus, the overall composition of the material influences the chemical properties, including the processing parameters and stability, of the resulting combined materials. Solubility of dopant(s)/additive(s) within a host amorphous material can influence the amount of a particular dopant/additive that can be homogeneously integrated into a consolidated glass.

A dopant generally comprises in the range(s) less than about 15 mole percent of the metal/metalloid in the composition, in further embodiments in the range(s) less than about 10 mole percent, in some embodiments in the range(s) from about 0.001 mole percent to about 5 mole percent, and in other embodiments in the range(s) from about 0.025 to about 1 mole percent of the metal/metalloid in the composition. A person of ordinary skill in the art will recognize that the present disclosure similarly covers ranges within these specific ranges. Additive compositions are similar to dopant compositions except that they generally are included at higher amounts while still being a minority component of the composition, i.e., in the range(s) less than about 50 mole percent of the composition with any and all cut offs within this range being contemplated. For amorphous materials, additive(s) can be modifiers or intermediate compositions between glass formers and modifiers. Modifiers can disrupt the oxygen network within an oxide glass to modify the glass properties, such as flow temperature, coefficient of thermal expansion, and chemical durability. Thus, additive(s) can be useful for many of the same purposes as dopant(s). Doped and doping, for convenience, can refer to materials with dopants and/or additives and the process of incorporating dopants and/or additives, respectively. Suitable dopant(s)/additive(s) include, for example, selected metal(s) among other suitable element(s).

In some embodiments, powders and coatings can be formed with complex compositions comprising, for example, one or more metal/metalloid elements in a host material and, optionally, one or more selected dopants/additives in the host material. The doped materials can be formed by directly depositing particles to form a powder coating using light reactive deposition and subsequently consolidating the powder coating into a uniform layer of a glass, polycrystalline or crystalline material. Alternatively, any dopant(s)/additive(s) can be introduced to a powder coating following its formation for incorporation into a consolidated uniform material, as described further below.

Submicron/nanoscale particles deposited as a powder coating can be produced with complex compositions using light reactive deposition. Materials can be formed with desired compositions by appropriately introducing a reactant composition to form the desired host material. The elements that modify the composition, such as elements introduced in approximately stoichiometric amounts as well as dopant(s)/additive(s), can be introduced into an appropriate host material either during the formation of the host material or subsequent to formation of the powder coating. Specifically, selected elements can be introduced at desired amounts by varying the composition of the reactant stream. The conditions in the reactor can also be selected to produce the desired materials. In alternative embodiments, a modifying element is applied to an already formed particle collection or powder coating in proportion to the desired levels for the ultimate composition. Upon heat treatment, the desired composition is formed. Heat treatments to introduce modifying elements are described further below.

Suitable materials for incorporation into an electrochemical cell depend on the specific function intended for the material within the overall structure. The particular suitable material generally is further selected depending on the chemistry employed in the cell, such the particular electrolyte, fuel and the like. For catalytic materials, suitable cathode or anode catalysts for polymer electrolyte membrane fuel cells are generally metals, such as platinum and platinum alloys with ruthenium, rhodium and/or molybdenum. For use in the cathode, doped manganese oxides can be used. For use in molten carbonate fuel cells, the anode catalyst can be nickel and/or cobalt doped-nickel. These materials can be deposited as an oxide and reduced in situ to form the elemental nickel/doped nickel. Similarly, for the cathode in a molten carbonate fuel cell, the catalyst can be nickel oxide or lithium nickel oxide. For solid oxide fuel cells, various materials are suitable for anode catalysts. In particular, composites with yttrium stabilized zirconia (YSZ) can be used in which the YSZ functions as an ion conductor within the electrode. Titania-doped yttria stabilized zirconia can function as an ion conductor and an electrical conductor. Specific suitable composites include, for example, YSZ with Ni or doped nickel with cobalt, molybdenum, iron and/or titanium or YSZ with copper and cerium oxide. Suitable catalytic metal oxides for use in solid oxide fuel cells include, for example, ceria, $La_{1-x}M'_xCr_{1-y}M''_yO_3$, where M' is strontium, yttrium or combinations there of and M" is nickel, lanthanum, manganese, titanium, vanadium or combinations thereof, $La_{1-x}M'_xTi_{1-y}M''_yO_3$, where M' is strontium, yttrium or combinations there of and M" is nickel, lanthanum, manganese, chromium, or combinations thereof, $La_{1-x}M'_xNi_{1-y}M''_yO_3$, where M' is strontium, yttrium or combinations there of and M" is titanium, lanthanum, manganese, chromium, or combinations thereof, $La_{1-x}M'_xCu_{1-y}M''_yO_3$ where M' is strontium, yttrium or combinations there of and M" is nickel, lanthanum, manganese, chromium, or combinations thereof, or $La_{1-x}M'_xFe_{1-y}M''_yO_3$, where M' is strontium, yttrium or combinations there of and M" is molybdenum, nickel, lanthanum, manganese, chromium, or combinations thereof.

With respect to the electrolytes, for polymer electrode membrane fuel cells, a polymer membrane forms the electrolyte. This material can be combined with an electrically insulating structure to form a material suitable for formation by light reactive deposition. For example, a silica or titania porous network can be formed for impregnation with polymer electrolyte. Similarly, a phosphoric acid fuel cell comprises a polymer membrane with phosphoric acid. An electrically insulating porous matrix can be used to support the polymer membrane. For a molten carbonate fuel cell, metal carbonates can be deposited using appropriate precursors and reaction conditions. In particular, alkali carbonate can be codeposited with metal oxides. In particular a mixture of alkali carbonate and $LiAlO_2$ can be deposited using precursors of $LiNO_3$, $KNO_3$ and $Al(NO_3)_2$ in an oxygen environment with the lithium concentration selected to get the carbonate eutectic point. For a solid oxide fuel cell, the electrolyte generally is yttrium stabilized zirconia. Suitable yttrium precursors for light reactive deposition using aerosol delivery include, for example, yttrium chloride ($YCl_3$), yttrium nitrate ($Y(NO_3)_3$) and the like and combinations of any two or more thereof. Suitable zirconium precursors for aerosol delivery comprise, for example, zirconyl chloride ($ZrOCl_2$), zirconyl nitrate ($ZrO(NO_3)_2$), and the like, and combinations of any two or more thereof.

Electrically conductive elements can comprise elemental metals, conductive carbons, conductive metal compounds or a combination thereof. In particular, elemental metal particles, such as elemental copper, silver or gold, can be codeposited within an electrode to increase electrical conductivity. Similarly, graphitic carbon or other conductive carbon can be deposited by light reactive deposition to impart electrical conductivity. These carbon materials can be heated during the subsequent processing as long as no oxygen or other oxidizing agent is present. Furthermore, metal compositions such as doped lanthanum chromite can be used to impart electrical conductivity. Doped lanthanum chromite has been used in solid oxide fuel cell interconnects. Similarly, these materials can be used in interconnects/bipolar plates as coatings or layers with appropriate flow channels. As noted above, a soluble compound can be coated to form flow channels following subsequent dissolving of the compound. For example, a metal chloride or metal nitrate can be deposited using an aerosol without any further reactants so that small particles of unreacted metal compound are deposited in the process. The compound can be patterned as described above.

Various materials have been formed as submicron/nanoscale particles using laser pyrolysis. Some of these materials are described in the following description. Using light reactive deposition, these materials can be formed directly as coatings in the form of powder coatings. Based on the description and examples herein, a range of additional materials can be produced by light reactive deposition. Specifically, suitable approaches for the formation of some improved materials are outlined below.

For example, the production of silicon oxide submicron/nanoscale particles is described in U.S. Patent No. 6,726,990 to Kumar et al., entitled "Silicon Oxide Particles," incorporated herein by reference. This patent application describes the production of amorphous $SiO_2$. The production of titanium oxide submicron/nanoscale particles and crystalline silicon dioxide submicron/nanoscale particles is described in U.S. Pat. No. 6,387,531 to Bi et al., entitled "Metal (Silicon) Oxide/Carbon Composites," incorporated herein by reference. In particular, this application describes the production of anatase and rutile $TiO_2$.

In addition, submicron/nanoscale manganese oxide particles have been formed. The production of these particles is described in U.S. Pat. No. 6,506,493 to Kumar et al., entitled "Metal Oxide Particles," incorporated herein by reference. This application describes the production of MnO, $Mn_2O_3$, $Mn_3O_4$ and $Mn_5O_8$.

Also, the production of vanadium oxide submicron/nanoscale particles is described in U.S. Pat. No. 6,106,798 to Bi et al., entitled "Vanadium Oxide Nanoparticles," incorporated herein by reference. Similarly, silver vanadium oxide submicron/nanoscale particles have been produced, as described in U.S. Pat. No. 6,225,007 to Horne et al., and U.S. Pat. No. 6,394,494 to Reitz et al., both entitled "Metal Vanadium Oxide Particles," and in U.S. Pat. No. 6,503,646 to Ghantous et al., entitled "High Rate Batteries," all three of which are incorporated herein by reference.

Furthermore, lithium manganese oxide submicron/nanoscale particles have been produced by laser pyrolysis along with or without subsequent heat processing, as described in U.S. Pat. No. 6,607,706 to Kumar et al., entitled "Composite Metal Oxide Particles," and Ser. No. 09/334,203, now U.S. Pat. No. 6,482,374 to Kumar et al., entitled "Reaction Methods for Producing Lithium Metal Oxide Particles," and U.S. Pat. No. 6,136,287 to Home et al., entitled "Lithium Manganese Oxides and Batteries," all three of which are incorporated herein by reference. The production of lithium cobalt oxide, lithium nickel oxide, lithium cobalt nickel oxide, lithium titanium oxide and other lithium metal oxides is described in copending and commonly assigned U.S. patent application Ser. No. 09/595,958, now U.S. Pat. No. 6,749,648 to Kumar et al., entitled "Methods For Producing Lithium Mixed-Metal Oxide Particles," incorporated herein by reference.

The production of aluminum oxide submicron/nanoscale particles is described in copending and commonly assigned, U.S. patent application Ser. No. 09/136,483 to Kumar et al., entitled "Aluminum Oxide Particles," incorporated herein by reference. In particular, this application discloses the production of $\gamma\text{-}Al_2O_3$. The formation of delta-$Al_2O_3$ and theta-$Al_2O_3$ by laser pyrolysis/light reactive deposition along with doped-crystalline and amorphous alumina is described in copending and commonly assigned U.S. patent application Ser. No. 09/969,025 to Chiruvolu et al., entitled "Aluminum Oxide Powders," incorporated herein by reference.

In addition, tin oxide submicron/nanoscale particles have been produced by laser pyrolysis, as described in U.S. Pat. No. 6,200,674 to Kumar et al., entitled "Tin Oxide Particles," incorporated herein by reference. The production of zinc oxide submicron/nanoscale particles is described in copending U.S. patent application Ser. No. 09/266,202 to Reitz, entitled "Zinc Oxide Particles," incorporated herein by reference. In particular, the production of ZnO submicron/nanoscale particles is described.

Submicron/nanoscale particles and corresponding coatings of rare earth metal oxide particles, rare earth doped metal/metalloid oxide particles, rare earth metal/metalloid sulfides and rare earth doped metal/metalloid sulfides are described in U.S. Pat. No. 6,692,660 to Kumar et al, entitled "High Luminescence Phosphor Particles," incorporated herein by reference. Suitable host materials for the formation of phosphors comprise ZnO, ZnS, $Zn_2SiO_4$, SrS, $YBO_3$, $Y_2O_3$, $Al_2O_3$, $Y_3Al_5O_{12}$ and $BaMgAl_{14}O_{23}$, and combinations of any two or more thereof. For phosphor applications, the particles are generally crystalline.

The production of iron, iron oxide and iron carbide is described in a publication by Bi et al., entitled "Nanocrystalline $\alpha$-Fe, $Fe_3C$, and $Fe_7C_3$ produced by $CO_2$ laser pyrolysis," J. Mater. Res. Vol. 8, No. 7 1666-1674 (July 1993), incorporated herein by reference. The production of submicron/nanoscale particles of silver metal is described in U.S. Pat. No. 6,394,494 to Reitz et al., entitled "Metal Vanadium Oxide Particles," incorporated herein by reference. Submicron/nanoscale carbon particles produced by laser pyrolysis is described in a reference by Bi et al., entitled "Nanoscale carbon blacks produced by $CO_2$ laser pyrolysis," J. Mater. Res. Vol. 10, No. 11, 2875-2884 (Nov. 1995), incorporated herein by reference.

The production of iron sulfide ($Fe_{1-x}S$) submicron/nanoscale particles by low rate laser pyrolysis is described in Bi et al., Material Research Society Symposium Proceedings, vol. 286, p. 161-166 (1993), incorporated herein by reference. Precursors for laser pyrolysis production of iron sulfide were iron pentacarbonyl ($Fe(CO)_5$) and hydrogen sulfide ($H_2S$). Other suitable gaseous sulfur precursors for vapor delivery comprise, for example, pyrosulfuryl chloride ($S_2O_5Cl_2$), sulfur chloride ($S_2Cl_2$), sulfuryl chloride ($SO_2Cl_2$), thionyl chloride ($SOCl_2$), and the like, and combinations of any two or more thereof. Suitable sulfur precursors for aerosol delivery comprise, for example, ammonium sulfate $((NH_4)_2S)$, sulfuric acid ($H_2SO_4$), and the like, and any combinations thereof, which are soluble in water. Other metal/metalloid sulfide materials can be similarly produced.

Metal borates can be similarly formed using one or more metal precursors and a boron precursor. As a specific example, $TiB_2$ has potential utility in battery applications. Suitable titanium precursors include, for example, titanium tetrachloride ($TiCl_4$), titanium isopropoxide ($Ti[OCH(CH_3)_2]_4$), and the like, and combinations of any two or more thereof. Suitable boron precursors comprise, for example, boron trichloride ($BCl_3$), diborane ($B_2H_6$), $BH_3$, and the like, and combinations of any two or more thereof.

Cerium oxide can be produced using the laser pyrolysis apparatuses described above. Suitable precursors for aerosol delivery comprise, for example, cerous nitrate ($Ce(NO_3)_3$), cerous chloride ($CeCl_3$), cerous oxalate ($Ce_2(C_2O_4)_3$), and the like, and combinations of any two or more thereof. Doped forms of cerium oxide can be formed using the techniques described herein. Similarly, zirconium oxide can be produced using the laser pyrolysis apparatuses described above. Suitable zirconium precursors for aerosol delivery comprise, for example, zirconyl chloride ($ZrOCl_2$), zirconyl nitrate ($ZrO(NO_3)_2$), and the like, and combinations of any two or more thereof.

The deposition of coatings of dielectric materials for chip capacitors is described in copending and commonly assigned U.S. patent application Ser. No. 10/219,019, now U.S. Pat. No. 6,917,511 to Bryan, entitled "Reactive Deposition For The Formation Of Chip Capacitors." incorporated herein by reference. Suitable dielectric materials include a majority of barium titanate ($BaTiO_3$), optionally mixed with other metal oxides. Other dielectric oxides suitable for incorporation into ceramic chip capacitors with appropriate dopant(s)/additive(s) comprise, for example, $SrTiO_3$, $CaTiO_3$, $SrZrO_3$, $CaZrO_3$, $Nd_2O_3$-$2TiO_3$, $La_2O_3$-$2TiO_2$, and the like, and any two or more thereof.

The formation of submicron/nanoscale particles along with coatings of metal/metalloid compositions with complex anions is described in copending and commonly assigned U.S. patent application Ser. No. 09/845,985 to Chaloner-Gill et al., entitled "Phosphate Powder Compositions And Methods For Forming Particles With Complex Anions," incorporated herein by reference. Suitable polyatomic anions comprise, for example, phosphate ($PO_4^{-3}$), sulfate ($SO_4^{-2}$), silicate ($SiO_4^{-4}$), and the like, and combinations of any two or more thereof. Suitable phosphorous precursors for forming the phosphate anion, sulfur precursors for forming the sulfate anion and silicon precursors for forming the silicate anion are discussed above. Suitable cations comprise, for example, metal and metalloid cations. Phosphate glasses can be used in a variety of contexts. Phosphate compositions for glasses comprise, for example, aluminum phosphate ($AlPO_4$), calcium phosphate ($Ca_3(PO_4)_2$), and the like, and combinations of any two or more thereof. Suitable gaseous phosphate precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and combinations of any two or more thereof. Suitable phosphorous precursors for aerosol delivery comprise, for example, $(C_2H_5O)_3P$, $(C_2H_5O)_3$ PO, ammonium phosphate $((NH_4)_3PO_4)$, ammonium phosphate—dibasic $((NH_4)_2HPO_4)$, ammonium phosphate—monobasic $((NH_4)H_2PO_4)$, phosphoric acid $(H_3PO_4)$, and the like, and combinations of any two or more thereof, which are all moderately soluble in water.

The synthesis by laser pyrolysis of silicon carbide and silicon nitride is described in copending and commonly assigned U.S. patent application Ser. No. 09/433,202 to Reitz et al., entitled "Particle Dispersions," incorporated herein by reference. Other metal/metalloid carbides and meta/metalloid nitrides can be similarly produced.

The formation of a powder coating comprising boron and phosphorous doped amorphous silica ($SiO_2$) is described in copending and commonly assigned U.S. patent application Ser. No. 09/715,935 to Bi et al., entitled "Coating Formation By Reactive Deposition," incorporated herein by reference. The doped silica powder coating was consolidated into a glass layer. Rare earth metal and other dopants for amorphous particles and powder coatings as well as complex glass compositions for powder coatings, and in particular, erbium doped aluminum silicate and aluminum-lanthanum-silicate powder coatings and glasses, are described in and commonly assigned U.S. patent application Ser. No. 10/099,597, now U.S. Pat. No. 6,849,334 to Horne et al., filed on Mar. 15, 2002, entitled "Optical Materials And Optical Devices," incorporated herein by reference.

In general, the selection of the composition of particles and/or corresponding powder coatings are based on the intended use of the materials. Similarly, any dopants/additives are similarly selected. The resulting properties of the particles depend on the compositions, including any dopants/additives and the phase(s), e.g., crystallinity or amorphous character, of the particles as well as, in some embodiments, the particle size and particle size distribution. Desirable properties for some applications are described above in some detail either with respect to specific compositions or more generally.

Particle and Coating Properties

Light reactive deposition (as well as laser pyrolysis) is particularly suitable for the formation of highly uniform particles, especially submicron/nanoscale particles. The particles can be directly deposited onto a substrate to form a particle coating. Small particle size and particle uniformity can contribute overall to the uniformity of the resulting coating, for example, with respect to composition as well as the smoothness of the surface and interfaces between materials. In particular, the lack of particles significantly larger than the average can lead to a more uniform coating. With respect to densified or partially densified coatings, the coating after consolidation/densification can have high uniformity with respect to thickness and index-of-refraction both within a layer and between layers formed under equivalent conditions.

A collection of particles of interest generally has an average diameter for the primary particles in the range(s) of less than about 2500 nm, in most embodiments in the range(s) less than about 500 nm, in additional embodiments in the range(s) less than about 250 nm, in other embodiments in the range(s) from about 1 nm to about 100 nm, in some embodiments in the range(s) from about 2 nm to about 95 nm, in further embodiments in the range(s) from about 3 nm to about 75 nm, and still other embodiments in the range(s) from about 5 nm to about 50 nm. A person of ordinary skill in the art will recognize that other average diameter ranges within these specific ranges are also contemplated and are within the present disclosure. Particle diameters generally are evaluated by transmission electron microscopy. Diameter measurements on particles with asymmetries are based on an average of length measurements along the principle axes of the particle. In general, a collection of particles, as described herein, has substantially all primary particles that are not fused, i.e., hard bonded to remove a distinct separable interface, although they can be attracted by electrostatic forces, as described below. Powder coatings, which maintain characteristics of the primary particles, are described further above and below.

Particles refer to dispersable units within the collection of particles. Thus, hard fused primary particles collectively form a particle. Primary particles represent distinguishable units in a transmission electron micrograph, which can be hard fused as indicated by necking or the like in the micrograph.

The primary particles usually have a roughly spherical gross appearance. Upon closer examination, crystalline particles generally have facets corresponding to the underlying crystal lattice, for crystalline particles. Nevertheless, crystalline primary particles tend to exhibit growth in laser pyrolysis that is roughly equal in the three physical dimensions to give a gross spherical appearance. Amorphous particles generally have an even more spherical aspect. In some embodiments, in the range(s) of about 95 percent of the primary particles, and in some embodiments in the range(s) of about 99 percent, have ratios of the dimension along the major axis to the dimension along the minor axis less than about 2.

The primary particles can have a high degree of uniformity in size. Based on an analysis of particles produced under analogous conditions by laser pyrolysis, light reactive deposition, as described above, generally results in particles having a very narrow range of particle diameters. Furthermore, heat processing under suitably mild conditions does not alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system. As determined from examination of transmission electron micrographs, the primary particles generally have a distribution in sizes such that in the range(s) of at least about 80 percent, in other embodiments in the range(s) of at least about 95 percent, and in some embodiments in the range(s) 99 percent, of the primary particles have a diameter greater than about 40 percent of the average diameter and less than about 700 percent of the average diameter. In further embodiments, the primary particles generally have a distribution in sizes such that in the range(s) of at least about 80 percent, in other embodiments in the range(s) of at least about 95 percent, and in some embodiments in the range(s) 99 percent, of the primary particles have a diameter greater than about 40 percent of the average diameter and less than about 300 percent of the average diameter. In alternative or additional embodiments, the primary particles have a distribution of diameters such that in the range(s) of at least about 95 percent, and in further embodiments in the range(s) 99 percent, of the primary particles have a diameter greater than about 45 percent of the average diameter and less than about 200 percent of the average diameter. A person of ordinary skill in the art will recognize that other ranges within these explicit ranges are contemplated and are within the present disclosure.

Furthermore, in some embodiments effectively no primary particles have an average diameter in the range(s) of greater than about 10 times the average diameter, in some embodiments in the range(s) of greater than about 5 times the average diameter, in further embodiments in the range(s) of greater than about 4 times the average diameter, in additional embodiments in the range(s) of greater than about 3 times the average diameter, and in other embodiment in the range(s) greater than about 2 times the average diameter. A person of ordinary skill in the art will recognize that other ranges of distribution cut-offs within these explicit ranges are contemplated and are within the present disclosure. In other words, the particle size distribution effectively does not have a tail indicative of a small number of particles with significantly larger sizes relative to the average size. This cut-off in the particle size distribution is a result of the small reaction zone and corresponding rapid quench of the particles. An effective cut off in the tail of the size distribution indicates that there are less than about 1 particle in $10^6$ that have a diameter greater than a specified cut off value above the average diameter. In some embodiments, the evaluation of the lack of a tail can be performed with computational analysis of transmission electron microscopy micrographs. Narrow size distributions, lack of a tail in the distributions and the roughly spherical morphology can be exploited in a variety of applications.

In addition, the submiron/nanoscale particles generally have a very high purity level. Furthermore, crystalline submicron/nanoscale particles produced by laser pyrolysis can have a high degree of crystallinity. Certain impurities on the surface of the particles may be removed by heating the particles to temperatures below their sintering temperatures to achieve not only high crystalline purity but high purity overall.

When collecting the particles directly onto a substrate surface, the distance from the substrate to the reaction zone and the temperature of the substrate can be adjusted to control the character of the deposit on the substrate surface. The particles on the surface form a powder coating. The powder coating can be in the form of independent primary particles randomly stacked on the surface. The coating of primary particles may only be held together by electromagnetic forces between adjacent and nearby particles. In some embodiments, it may be desirable to form a powder coating with some degree of hard fusing between primary particles. Fusing between primary particles can be achieved by placing the substrate closer to the reaction zone such that the particles are not fully quenched when they strike the substrate surface and/or by heating the substrate, for example, using a heating apparatus, the flame resulting from the reaction of non-particle producing reactants, and/or the gases emanating from the reaction zone during particle production. Even if the primary particles are hard fused, the resulting powder coating maintains characteristics due to the submicron/nanoscale size of the primary particles. In particular, primary particles incorporated into the powder coating may be visible in scanning electron micrographs. In addition, channels between fused particles generally will reflect the submicron/nanoscale of the surrounding fused particles, e.g., by having submicron/nanoscale diameter channels extending into the powder coating. Thus, the submicron/nanoscale character of the primary particles is built into the resulting powder coating formed from the submicron/nanoscale primary particles.

While submicron/nanoscale particles can in principle pack densely on a surface due to their small size, the particles tend to coat a surface as a loose collection due to electrostatic forces between the particles. The relative or apparent density of the powder coating can depend on the particle size, particle composition and the deposition conditions, which may affect particle fusing as well as the forces between the particles and with the surface. The relative density is evaluated relative to the fully densified material of the same composition. In general, the relative density for the powder coating formed from submicron/nanoscale particles is in the range(s) of less than about 0.8, in other embodiments in the range(s) from about 0.02 to about 0.55 and in further embodiments in the range(s) from about 0.05 to about 0.4. A person of ordinary skill in the art will recognize that additional ranges within these specific ranges are contemplated and are within the present disclosure.

To obtain particular objectives, the features of a coating can be varied with respect to composition and/or morphology of layers of the powders as well as location of materials on the substrate. Generally, to form a particular structure, the material can be localized to a particular location on the substrate. In addition, multiple layers of particles can be deposited in a controlled fashion to form layers with different compositions with different fead stock flow and/or changing the reaction conditions. Similarly, the coating can be made a uniform thickness, or different portions of the substrate can be coated with different thicknesses of particles. Different coating thicknesses can be applied such as by varying the sweep speed of the substrate relative to the particle nozzle, by making multiple sweeps of portions of the substrate that receive a thicker particle coating or by patterning the layer, for example, with a mask. Approaches for the selective deposition of particles are described above. Alternatively or additionally, a layer can be contoured by etching or the like following deposition either before or after consolidation into a uniform material.

Thus, layers of materials, as described herein, may comprise particular layers that do not have the same planar extent as other layers. For example, some layers may cover the entire substrate surface or a large fraction thereof while other layers cover a smaller fraction of the substrate surface. In this way, the layers can form one or more localized devices. At any particular point along the planar substrate, a sectional view through the structures may reveal a different number of identifiable layers than at other point along the surface. Generally, for fuel cell applications, the particle layers/coatings have a thickness in the range(s) of at least about 0.05 microns, in other embodiments, in the range(s) of at least about 0.1 microns, in additional embodiments in the range(s) from about 200 nanometers to about 2000 microns and in further embodiments in the range(s) from about 250 nanometers to about 1000 microns. A person of ordinary skill in the art will recognize that additional range(s) within these explicit ranges and subranges are contemplated and are encompassed within the present disclosure.

The approaches described herein provide for the formation of consolidated layers/coatings that have very high uniformity within a layer and between layers formed under equivalent conditions. Thicknesses of a layer can be measured, for example, with a scanning electron microscope (SEM) with the examination of a cross section, such as SEM instuments available from Hitachi, a spectrophotometry-based film analysis apparatus, such as a FilmTek™ 4000 (Scientific Computing International, Carlsbad, Calif.), especially for the glass layers. To measure the thickness variation across a layer, an SEM analysis can be performed on a cross section, for example, at about 10 points along a first direction and about 10 points across the perpendicular direction. With the FilmTek™ spectrophotometry apparatus, the instrument can be automated with take measurements at the number of points desired, generally nine or more, and in further embodiments 10, 20, 30 or more points. The average and standard deviation can be obtained from these measurements. In evaluating thickness and thickness uniformity of a layer, a one centimeter band along the edge can be excluded. In some embodiments, one standard deviation of the thickness on a substrate with an area of at least about 25 square centimeters can be in the range(s) of less than about 0.5 microns, in other embodiments less than about 0.35 microns and in further embodiments from about 0.075 to about 0.25 microns. In addition, the standard deviation of the average thickness between a plurality of substrates coated under equivalent conditions can be less than about 0.1 microns, in other embodiments less than about 0.08 microns and in further embodiments from about 0.04 to about 0.06 microns. A person of ordinary skill in the art will recognize that additional deviations in thickness within a layer and between layers of different platens within the explicit ranges above are contemplated and are within the present disclosure.

Furthermore, very low surface roughness for a layer/coating on a substrate can be achieved. Surface roughness can be evaluated generally with respect to a specific area of the surface for comparison. Different techniques may be particularly suited for the evaluation of surface roughness over particular areas due to time and resolution issues. For example, atomic force microscopy (AFM) can be used to evaluate a root mean square surface roughness over an approximate 20 micron by 20 micron area of a substrate, which is referred to herein as $R_{AFM}$. A suitable AFM instrument includes, for example, a Digital Instruments (Santa Barbara, Calif.) Model Nanoscope® 4. Using the techniques described herein, $R_{AFM}$ values and similarly average roughness values ($R_a$) can be obtained in the ranges of no more than about 0.5 nanometers (nm), and in other embodiments in the ranges from about 0.1 nm to about 0.3 nm. Interferometry can be used to obtain surface roughness measurements over larger areas, such as 480 microns×736 microns. An interferometric profiler is an optical non-contact technique that can measure surface roughness from sub-nanometer to millimeter scales. A suitable interferometric profiler using digital signal processing to obtain surface profile measurement is a Wyko series profiler from Veeco Instruments Inc. (Woodbury, N.Y.). Using light reactive deposition, root mean square surface roughness ($R_{rms}$) values and similarly the average surface roughness ($R_a$) over 480 microns×736 microns can be obtained in the ranges of no more than about 10 nm and in further embodiments from about 1 nm to about 5 nm. A person of ordinary skill in the art will recognize that additional ranges of surface roughness within the explicit ranges are contemplated and are within the present disclosure.

Improved fuel cells can be formed with decrease layer thickness variation and with less surface roughness. In particular thinner layers can be used if they are more uniform without risking shorting of the cell. In particular, improved performance can be obtained through a decrease in electrical resistance, improved reactant flow and more reproducible properties. Similarly, more uniformity of the layer results in less concentration of the current such that the reaction is more uniform across the cell and thermal expansion is more uniform so that stress is reduced and the probablity of fracture is less.

Modifying the Composition of Powder Coatings

While the compositions can be selected during deposition by appropriately introducing elements into the reactant stream for particle production, alternatively or additionally, the powder coating composition can be modified in its entirety or selected areas thereof following formation of the powder coating. The composition modifications of powder coatings may involve introduction of approximately stoichiometric amounts of element(s) and/or dopant(s)/additive(s). Due to the submicron/nanoscale of the primary particles incorporated into the powder coating, the powder coating has a large surface area that facilitates incorporation of the additional element(s) into the initial material. One or more additional elements can be incorporated into the powder coating by a gentle heating at temperatures that do not result in consolidation of the material, or into a densified material during consolidation of the powder coating into a uniform material. The additional element(s) can be applied to the powder coating within the reaction chamber or following removal from the reaction/coating chamber. If the element(s) is applied to the powder coating following removal of the coated substrate from the reaction chamber, the additional element(s) can be applied to powder coating directly or using electro-migration deposition. In some embodiments of these approaches, the powder coating can be partly consolidated prior to initiating the composition introduction process to stabilize the coating, generally without removing all of the submicron/nano-structured character of the coating.

Generally, one or more modifying element is applied as a composition comprising the desired element. Any remaining elements in the compositions generally would volatilize during the heating process, although it is possible that oxygen or other non-metal/metalloid elements from the compositions may also incorporate into the powder coating. For example, metal/metalloid nitrates during the heat treatment can involve the incorporation of the metal/metalloid element into the host material and the removal of nitrogen oxides to remove the counter-ions of the composition. The composition can be applied to the powder coating as a solution, an aerosol, and/or as a powder. In general, the use of a solution can facilitate the even spread of the composition through the powder coating by the flow of the solution over and into the powder coating. The concentration of a solution can be selected to contribute to more even distribution of the composition at desired amounts of modification element through the use of a volume of liquid that appropriately wets the powder coating. Surfactants and/or choice of solvent can be used to reduce surface tension and facilitate substantially even spread of the solution. The solvent can be evaporated prior to and/or during the heat processing of the powder coating to incorporate the modification element into the powder coating. Any surfactants can be selected to volatize, for example by decomposition, during a consolidation step or other heating step.

The reactant delivery system can be used to apply a composition to a powder coating within a reaction chamber. In particular, the composition comprising the modifying element can be applied within the coating apparatus by spraying a solution of the composition through the reactant inlet such that the composition is applied to all or selected portions of the substrate. The composition comprising the modifying element can be applied, for example, as an aerosol using an aerosol delivery system. The radiation beam can be either turned off during spraying of the composition or turned to a very low power to evaporate a portion of the solvent without reacting the composition. The reactant delivery systems described above can be adapted for the delivery of the unreacted composition. The coating process can be used to apply an approximately even coating onto the powder coating, e.g., by sweeping the substrate through a delivery stream of the solution with the modifying element at a constant rate.

Alternatively, the modifying element can be applied to the powder coating following removal of the powder coating from the reaction/coating chamber. The modifying element can be applied, generally in the form of a composition, as a liquid, aerosol and/or a powder, to the powder coating, for example, by spraying, brushing, dipping or the like. As with solutions applied within the reaction chamber, the concentration and other properties of the solution can be selected to obtain even distribution of the modifying element within the powder coating and/or consolidated material. Dip coating of the powder coating can be a convenient approach for obtaining uniform distribution of composition over the powder coating.

Rather than allowing natural migration of the composition with the modifying element over and through the powder coating, an electric field can be used to drive ions of the modifying element(s) into the host matrix. Specifically, modifying element(s) can be introduced into material using electrophoretic or electro-migration deposition. In this approach, an electric field is used to drive ions into the host matrix of the powder coating. A solution containing the host ions is contacted with the powder coating. Generally, an electrode is placed behind the substrate coating while a counter electrode is placed within the solution such that ions driven toward the electrode behind the substrate are driven into the powder coating. More than one electrode of each type can be used, if desired. In addition, multiple modifying elements can be simultaneously or sequentially introduced into the powder coating by electro-migration deposition. Electro-migration deposition into a powder coating is described further in copending and commonly assigned U.S. patent application Ser. No. 10/195,851, entitled "Nanoparticle Production And Corresponding Structures," incorporated herein by reference.

Figure 21:
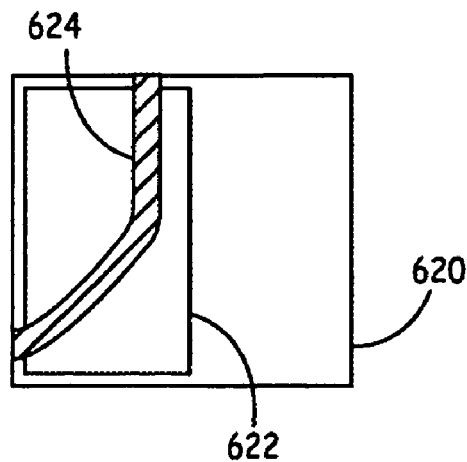
FIG. 21 is a top view of a substrate with a powder coating covered in part with a mask.

The modifying element, e.g., a dopant(s)/additive(s), can be introduced into a selected portion of the powder coating by selectively contacting the solution with only a portion of the powder coating using solution barriers. Alternatively or additionally, a portion of the powder coating can be covered with a mask, such as conventional resist used in electronic processing, to block migration of the modifying element into the masked regions. Referring to an embodiment in FIG. 21, coated substrate 620 is in contact with barrier 622 confining a solution to a portion of the coated substrate. Furthermore, a portion of coated substrate 620 is covered with a mask 624. In this embodiment, the powder coating is doped in un-masked portions in contact with the solution comprising a modifying element. Masking generally is selected to form desired structures within the layer. Multiple modifying elements can be sequentially applied to the same and/or different, although optionally overlapping, portions of a coated substrate by altering the masking between electro-migration deposition of the different modifying elements.

In further embodiments, a composition comprising the desired modifying element, e.g., a dopant(s)/additive(s), is reacted separately in the reaction chamber for coating onto a powder coating. Thus, a separate layer of powder comprising a modifying element can be deposited on top of a host powder. As a particular example, if the host powder is a metal/metalloid oxide, a powder of a modifying metal/metalloid oxide can be formed as a separate powder coating on top of the host powder coating. Upon consolidation, the materials fuse into a uniform composition that can have approximately uniform distribution of modifying element through the material. The amount of powder of the modifying element can be selected to yield the desired levels of the modifying element, e.g., a dopant(s)/additive(s). The coating processes can be repeated to form layers of host powder coating (H) and modifying powder coating (D) in desired proportions—HDHDHD . . . or alternatively HDHDH . . . , with modifying powder coating layers always surrounded by host layers, except if the modified powder coating layer is at the bottom or the top of the multiple layer coating stack where the substrate or surface, respectively, surround one side of the modified layer. Of course, in forming a single host or modifying powder coating layer in some embodiments, multiple coating passes can be used in the coating apparatus with each pass involving a sweep of a substrate through the reactant/product stream. The number of alternating layers can be selected to yield the desired total thickness and modifying element distribution. In particular, thinner host layers and corresponding modifying powder coating layers may result in a more uniform distribution of modifying element within the final consolidated material. In general, the alternating layers comprise at least one host layer and one modifying powder coating layer and in some embodiments in the range(s) of less than about 50 host layers and less than about 50 modifying powder coating layers and in further embodiment in the range(s) from 3 host layers and 2 modifying powder coating layers to less than about 25 host layers and less than about 25 modifying powder coating layers. A person of ordinary skill in the art will recognize that other ranges within these explicit ranges are contemplated and are within the present disclosure.

In general, the various approaches for introducing a modifying element into a powder coating can be combined for the introduction of one or more than one modifying element into a powder coating and, in some embodiments, an ultimate consolidated material. In particular, a method for introducing one or more modifying elements, such as a dopant(s)/additive(s), during formation of a powder coating and methods for introducing modifying elements following deposition of a powder coating are described above. For example, a particular modifying element can be introduced using a plurality of techniques to achieve desired levels of modifying element and/or distributions of modifying element within the powder coating and/or consolidated material. In addition, for the deposition of a plurality of modifying elements, each modifying element can be deposited using one or more of the techniques described above, for convenience of processing and/or to achieve desired properties of the resulting consolidated materials.

Consolidation/Sintering to Form Densified Materials

Heat treatment can sinter the particles and lead to compaction, i.e., densification, of the powders/powder coatings to form the desired material density. This sintering of amorphous particles is generally referred to as consolidation. A partially consolidated or densified material is one in which a pore network remains but the pore size has been reduced and the solid matrix strengthened through the fusing of particles to form rigid interparticle necks. To consolidate, i.e., densify, the materials, the materials can be heated to a temperature above the melting point for crystalline materials or the flow temperature for amorphous materials, e.g., above the glass transition temperature and possibly above the softening point below which a glass is self-supporting, to consolidate the coating into a densified material by forming a viscous liquid. Sintering of particles can be used to form amorphous, crystalline or polycrystalline phases in layers. The sintering of crystalline particles can involve, for example, one or more known sintering mechanisms, such as surface diffusion, lattice diffusion, vapor transportation, grain boundary diffusion, and/or liquid phase diffusion. These layers can be completely or partially densified. In general, consolidation/sintering can be performed before or after patterning of a layer. A preliminary heat treatment can be applied with the reactor flame to reduce dopant(s)/additive(s) migration during the subsequent heating process and to partly densify the material.

Generally, the heating is performed under conditions to lower the viscosity of the material to promote flow. Because of the high viscosity at typical heating temperatures, the material generally does not flow significantly on the substrate surface, although small gaps may fill in. Processing at higher temperatures to reduce the viscosity of the melt can result in undesirable melting of the substrate, migration of compositions between layers or in flow from a selected area of the substrate. The heating and quenching times can be adjusted to change the properties of the consolidated coatings, such as density. While the final densified material may be uniform, the density of the material may vary slightly depending on the processing conditions. In addition, heat treatment can remove undesirable impurities and/or change the stoichiometry and crystal structure of the material, as described further above with respect to modification of composition using heat treatment.

Following deposition of a powder layer, the precursors can be shut off such that the reactant stream only comprises a fuel and an oxygen source that reacts to form gaseous/vapor products without particles. The flame resulting from the reaction of the fuel and oxygen source can be used to heat the coated substrate without depositing any additional materials on the substrate. Such a heating step is observed to reduce dopant(s)/additive(s) migration upon full consolidation of a doped silica glass. A flame heating step can be performed between coating steps for several layers or after deposition of several layer, in which each coating layer may or may not have the same composition as other layers. Generally, after a desired number of layers or quantity of material is deposited, a final heat treatment is performed to densify the material to a desired density.

Suitable processing temperatures and times generally depend on the composition of the particles. Small particles on the submicron/nanometer scale generally can be processed at lower temperatures and/or for shorter times relative to powders with larger particles due to lower melting/softening points, higher atomic mobility, and higher vapor pressure for the submicron/nanoscale particles in comparison with bulk material.

Heat treatments can be performed in a suitable oven. It may be desirable to control the atmosphere in the oven with respect to pressure and/or the composition of the gases. Suitable ovens comprise, for example, an induction furnace, a box furnace or a tube furnace with gas(es) flowing through the space containing the coated substrate. The heat treatment can be performed following removal of the coated substrates from the coating chamber. In alternative embodiments, the heat treatment is integrated into the coating process such that the processing steps can be performed sequentially in the apparatus in an automated fashion.

For many applications, it is desirable to apply multiple particle coatings with different compositions and/or morphology. In general, these multiple particle coatings can be arranged adjacent to each other across the x-y plane of the substrate being coated (e.g., perpendicular to the direction of motion of the substrate relative to the product stream), or stacked one on top of the other across the z plane of the substrate being coated, or in any suitable combination of adjacent domains and stacked layers. Each coating can be applied to a desired thickness.

For some embodiments, different compositions can be deposited adjacent to each other within a layer and/or in adjacent layers. Similarly, distinct layers of different compositions can be deposited in alternating layers. Specifically, two layers with different compositions can be deposited with one on top of the other, and or additionally or alternatively, with one next to the other, such as layer A and layer B formed as AB. In other embodiments, more than two layers each with different compositions can be deposited, such as layer A, layer B and layer C deposited as three sequential (e.g., stacked one on top of the other, or adjacent to the other, or adjacent and stacked) layers ABC. Similarly, alternating sequences of layers with different compositions can be formed, such as ABABAB . . . or ABCABCABC . . . Other combinations of layers with specific compositions and/or properties can be formed as desired.

Individual uniform layers, each of a particular composition, generally have after consolidation an average thickness in the range(s) of no more than 3000 microns, in further embodiments in the range(s) of no more than about 1000 microns, in additional embodiments, in the range(s) of no more than about 250 microns, in some embodiments in the range(s) from about 0.1 micron to about 50 microns, in other embodiments in the range(s) from about 0.2 microns to about 20 microns. A person of skill in the art will recognize that ranges within these specific ranges are contemplated and are within the scope of the present disclosure. Each uniform layer formed from particles with the same composition can be formed from one or more passes through a product flow in a light reactive deposition apparatus. Thickness is measured perpendicular to the projection plane in which the structure has a maximum surface area.

The material with multiple particle coatings can be heat treated after the deposition of each layer or following the deposition of multiple layers or some combination of the two approaches. The optimal processing order generally would depend on the densification mechanisms of the materials. Generally, however, it may be desirable to heat treat and densify a plurality of layers simultaneously. Specifically, densifying multiple layers simultaneously can reduce the time and complexity of the manufacturing process and, thus, reduce manufacturing costs. If the heating temperatures are picked at reasonable values, the heated materials remain sufficiently viscous that the layers do not merge undesirable amounts at the interface. By changing reaction conditions, such as precursor flow or total gas flow, particles can be deposited with changing particle size in the z-direction within a single layer or between layers. Thus, smaller particles can be deposited on top of larger particles and vice versa.

Fuel Cell Structures

A fuel cell generally comprises a stack with a series of individual cells. Each individual cell comprises an anode, a cathode and electrolyte separating the anode and cathode. An electrical interconnect or bipolar plate connects adjacent cells in series and can provide flow channels for reactants to the respective electrodes. The stack is generally in a suitable container that mediates flow of fuel, oxygen/oxidizing agent, heat and waste products, such as water and carbon dioxide. Current collectors at the end of the stack connect the stack to an outside circuit for power delivery. Appropriate control systems can be used to control reactant flow and other features of the fuel cell system.

Figure 22:
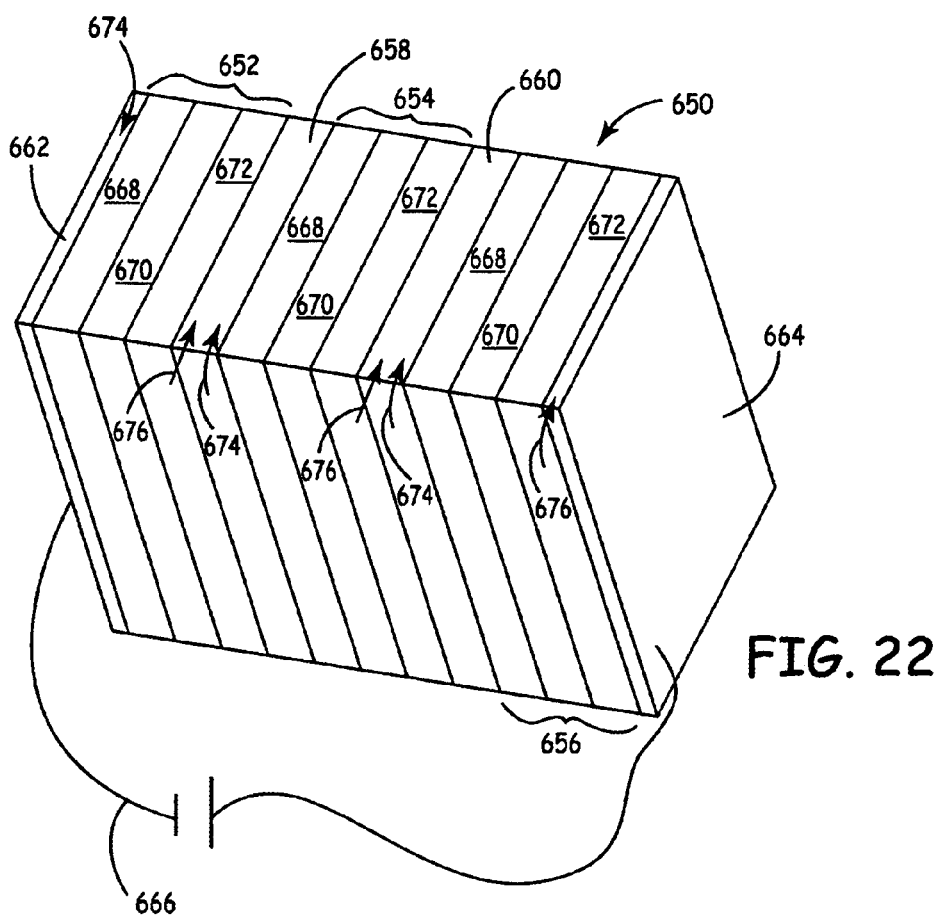
FIG. 22 is a schematic, perspective view of a fuel cell stack.

Referring to FIG. 22, stack 650 has three individual cells 652, 654, 656 separated by interconnects/bipolar plates 658, 660. Current collectors 662, 664 connect to an external circuit 666. Cells 652, 654, 656 each comprise an anode 668, a cathode 670 and electrolyte 672. Interconnects/bipolar plates 658, 660 have distinct flow channels on the front and back surfaces for separate delivery of fuel to an adjacent anode and oxygen/oxidizing agent to an adjacent cathode. In some embodiments, flow channels on opposite sides of an interconnect/bipolar plate are perpendicular (cross-flow) to each other to facilitate connection to a manifold within the fuel cell container, although other structures can be adopted. In co-flow configuration, the two reactant flows are directed in the same direction through the cells, and in counter flow configurations, the reactants flow in opposite directions through the cells to reduce hot spots. Similarly, current collectors 662, 664 each provide for the delivery of a reactant to the adjacent electrode. Delivery of fuel to anodes is indicated schematically with flow lines 674, and delivery of oxygen to a cathode is indicated schematically with flow lines 676.

In proton exchange membrane fuel cells, for hydrogen fuel the half reactions are:

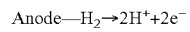

Anode—$H_2 \rightarrow 2H^+ + 2e^-$

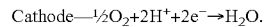

Cathode—$\frac{1}{2}O_2 + 2H^+ + 2e^- \rightarrow H_2O$.

The electrolyte membrane can be a polymer, such as polytetrafluoroethylene modified with sulfonic acid groups, e.g., Nafion®. Similarly, $P_2O_5$—$TiO_2$—$SiO_2$ glasses have also been observed to exhibit high proton conductivities, as described further in Nogami et al., Solid State Ionics, 166: 39-43 (2004), entitled "Proton conductivity in sol-gel-derived $P_2O_5$—$TiO_2$—$SiO_2$ glasses, incorporated herein by reference. In some embodiments, a sheet of polymer can be laminated to an anode and a cathode to form a membrane electrode assembly. As noted above, in alternative embodiments, the polymer is imbibed into porous matrix deposited by light reactive deposition. The porous matrix generally is electrically insulating and does not block or inhibit ionic flow through the electrolyte. In some embodiments, the porous matrix can be formed from a proton conducting ceramic or a hydroscopic solid material. The electrodes can be laminated to the electrolyte before, during or after introduction of the polymer, or the electrodes can be deposited in association with the electrolyte matrix by light reactive deposition. The electrodes would comprise a suitable catalyst material and, if necessary, a suitable electrical conductor. A traditional electrode would comprise platinum powder on a graphite-coated paper, although a variety of variations are known in the art. The polymer can be introduced into the electrolyte matrix and/or an electrode powder coating through contacting the porous matrix material(s) with a polymerizing solution from which the polymer is polymerized, or by dissolving the polymer in a solvent and contacting the solution with the porous matrix, or by melting the polymer and contacting the melt with the porous matrix.

The bipolar plate separating the membrane electrode assemblies can be formed from stainless steel or graphite. However, stainless steel can corrode over time with a resulting loss of fuel cell performance. In addition, graphite can be hard to machine with respect to flow channels and can be relatively expensive. Thus, it can be desirable to coat a stainless steel or other inexpensive metal conductor with a corrosion resistant coating. Suitable coatings include, for example, silver, gold, platinum, palladium, copper, as well as electrically conductive metal compounds, such as TiN. Furthermore, as noted above, the bipolar plate can be also deposited by light reactive deposition of suitable electrically conductive materials. As noted above, the electrically conductive material can be patterned with a soluble material that is dissolved to expose flow channels within the bipolar plate. If desired an entire cell or even a stack of cells can be deposited by light reactive deposition. One or more layers can be densified through a heat treatment. The flow temperatures can be selected to avoid densification of certain layers while providing for the densification of other layers. A person of ordinary skill in the art can select the appropriate processing order to consolidate selected materials, laminate appropriate layers, imbibe a polymer within appropriate structures and dissolve away soluble materials, as appropriate, based on the disclosure herein, for these as well as other fuel cell types described below and above. Proton exchange membrane fuel cells are described further in published U.S. patent application 2004/0038808A to Hampden-Smith et al., entitle "Method of Porducing Membrane Electrode Assemblies for Use in Proton Exchange membrane and Direct Methanol Fuel Cells," incorporated herein by reference.

In a phosphoric acid fuel cell, the electrolyte is phosphoric acid within a composite polytertrfluoroethyene-silicon carbide matrix. A porous silicon carbide powder coating can be deposited using light reactive deposition. This powder coating can be imbibed with the polytetrafluoroethylene to form the matrix for the phosphoric acid. The electrodes and bipolar plates generally are similar to those of a proton exchange membrane fuel cell, as described above. Phosphoric acid fuel cells are described further in U.S. Pat. No. 6,703,152 to Komiya et al., entitled "Method of Operating Phosphoric Acid Fuel Cell," incorporated herein by reference.

In molten carbonate fuel cells, the oxygen is delivered along with carbon dioxide, and the fuel can be hydrogen and/or carbon monoxide. The half reactions are:

Anode: $H_2+CO_3^{-2} \rightarrow H_2O+CO_2+2e^- CO+CO_3^{-2} \rightarrow 2CO_2+2e^-$ Catode: $\frac{1}{2}O_2+CO_2+2e^- \rightarrow Co_3^{-2}$.

The electrolyte is a molten carbonate, such as lithium carbonate, potassium carbonate, or a mixture thereof. The electrolyte can be suspended in an electrically insulating, chemically inert ceramic matrix. The electrolyte and ceramic matrix can be codeposited by light reactive deposition. Due to the higher operating temperatures, the catalyst material can be nickel or a nickel-aluminum alloy for the anode and nickel oxide or other transition metal oxide doped with lithium for the cathode. The porous anode and cathode materials can be deposited as powder coatings without consolidation using light reactive deposition. Molten carbonate fuel cells are described further, for example, in published U.S. patent application 2003/0072989A to Lee et al., entitled "Molten Carbonate Fuel Cell," incorporated herein by reference.

Solid oxide fuel cells present particular opportunities and challenges. These fuel cells use a ceramic, solid electrolyte that reduces corrosion issues and eliminates electrolyte management issues associated with the use of a liquid electrolyte. Generally, oxygen is reduced at the cathode as described above. At the anode, hydrogen, carbon monoxide or methane can be oxidized according to the reactions:

Anode: $H_2+O^{-2} \rightarrow H_2O+2e^-$, $CO+O^{-2} \rightarrow CO_2+2e^-$, $CH_4+4O^{-2} \rightarrow 2H_2O+CO_2+8e^-$.

A solid oxide fuel cell uses an electrolyte that transports oxide ions $O^{-2}$ for ion transport. The electrolyte comprises oxide materials that can effectively transport oxide ions. Suitable electrolyte materials include, for example, yttria stabilized zirconia (with generally at least about 3 mole percent yttria), wherein the yttria stabilizes the cubic phase at room temperature and partially yttria stabilized zirconia having lesser amounts of yttria with a stabilized tetragonal phase. Other suitable oxide materials are described above. The interconnects can be formed from suitable materials that are conductive and stable at the cell operating temperatures. In some embodiments, [ . . . ] Solid oxide fuel cells generally are described further in U.S. Pat. No. 6,558,831 to Doshi et al., entitled "Solid Oxide Fuel Cell," incorporated herein by reference.

Figure 23:
FIG. 23 is a top view of a corrugated platen.

In general, fuel cell electrodes have generally been planar except for certain solid oxide fuel cells. However, the surface area can be increased by making depositing the components along a curved platen, such as a corrugated platen, as shown in FIG. 23. The corrugated platen increases the surface area per unit length. The platen can be metal or other substrate material that is incorporated into the cell or later removed. The electrolyte/separator material can have a larger expanse such that a seal can be contacted with the electrolyte/ separator. This rim can be coated with a sealant material, such as a glass or a meltiple metal oxide ceramic brazing material, that is subsequently fused. In this and other embodiments with a sealing rim, the seal material can be deposited with a mask or with a nozzle sized and positioned to deposit specifically along the rim. Similarly, the material deposited on the face within the rim can be deposited with a mask or with an appropriately sized and shaped nozzle.

Solid oxide fuel cells can be formed with rod shaped electrodes with circular or oval cross sections. Components for these cells can have non-planar shapes. These components can be anodes, cathodes, such as cathodes of porous doped lanthanum manganite, or inert materials onto which an anode or cathode is placed. With a circular electrode, the electrolyte can be placed around the electrode and more complex interconnect configurations can be used to connect the cells in series. Considerations for the formation of the components is cost, strength, durability and conductivity. With a oval electrode, an interconnect can be placed along one side of the oval and an electrolyte and counter electrode can be placed along the opposite side of the oval, such that the cells can be stacked in series similar to structures with planar electrodes. Tubular electrodes for solid oxide fuel cells are described further, for example, in U.S. Pat. No. 6,379,485 to Borglum, entitled "Method of Making Closed End Ceramic Fuel Cell Tubes," incorporated herein by reference.

While in general, desired thickness of particular fuel cell structures depends on the nature and specific design features of a fuel cell, some comments can be made on structural thickness that generally provide desired performance levels.

Thickness referred to here is the final thickness following processing. The as-deposited thickness can be less if subsequent densification is performed. In general, the change in thickness upon further processing is related proportionally to the increase in density. In some embodiments, electrolyte layers can be from about 0.1 microns to about 200 microns and electrodes can be from about 0.5 microns to about 750 microns. The thinner values can in particular be suitable for the formation of micro fuel cells. The electrodes generally are gas porous. To achieve this porosity, the electrode can have an average density from about 50 to about 85 percent of a fully densified material and in other embodiments from about 70 to about 80 percent of the fully densified material. The electrolyte and interconnects/bipolar plates generally are fully densified to prevent flow of gas through them. Thus, the gaseous reactants do not mix. A person of ordinary skill in the art will recognize that additional ranges of thickness and density are contemplated and are within the present disclosure.

Due to the inherently unsymmetrical surrounding environment of an electrode within a fuel cell with an electrolyte on one face and an interconnect/bipolar plate on the other, it may be desirable to form one or both electrodes with more than one layer or using a gradient in composition/properties. Specifically, reactants, which are generally gaseous, flow into the electrode and ions flow into the electrode from the electrolyte, which is generally oriented opposite the fuel flow. Due to the rate limiting nature of ion flow, it can be desirable to place the catalyst near to the electrolyte. Also, if the electrolyte is liquid, a gas permeable liquid impermeable layer is desired, which can be a electrically conductive backing layer on the electrode or a portion of the electrode itself. A fuel reformation catalyst can be placed in the anode on the opposite side of the electrode from the electrolyte to condition the fuel. Certain asymmetric electrode structures are further described in published U.S. patent application 2004/0038808A to Hampden-Smith et al., entitled "Method of Producing Membrane Electrode Assemblies for Use in Proton Exchange Membrane and Direct Methanol Fuel Cells," incorporated herein by reference. The formation of a gradient in reaction catalyst with higher concentrations in the electrode adjacent the electrolyte can be formed using the techniques described above. In particular, the present approaches are useful for forming complex patterns of materials, such as two dimensional variation in composition or more generally variation within a particular layer.

Figure 24:
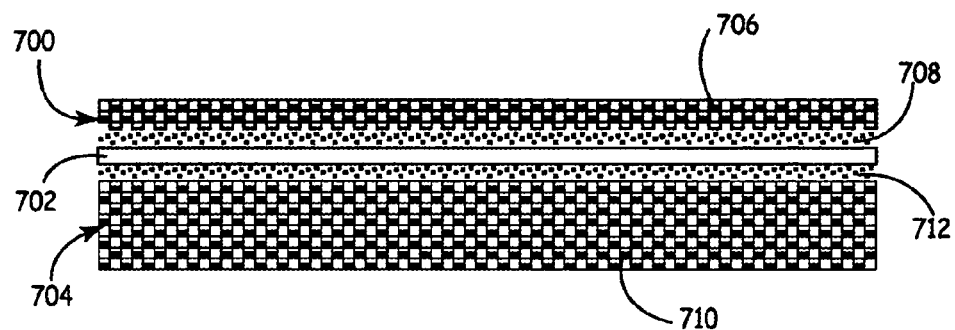
FIG. 24 is a sectional view of a cell with electrodes have layers with different particle sizes.
Figure 26:
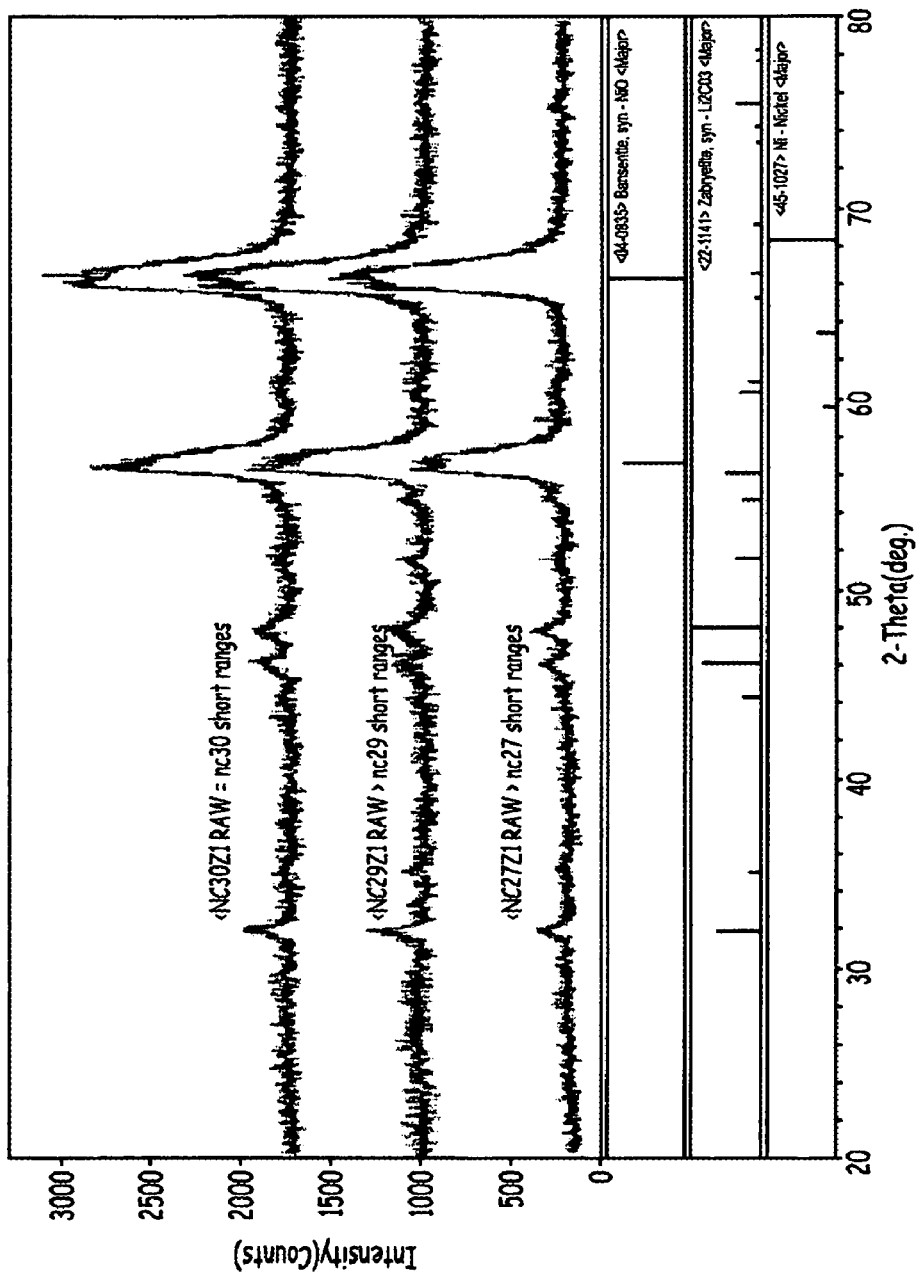
FIG. 26 is an x-ray diffractogram for a sample produced under the conditions specified in column 1 of Table 1.

To facilitate gas flow into the electrode while limiting gas flow reaching the electrolyte, the particle size can be made larger away form the flow to provide for a higher porosity and smaller toward the electrolyte for correspondingly smaller porosity. As shown in FIG. 24, cathode 700, electrolyte 702 and anode 704 are in a cell assembly. Cathode 700 has a first layer 706 comprising larger particles and a second layer 708 comprising smaller particles. Similarly, anode 704 has a first layer 710 comprising larger particles and a second layer 712 comprising smaller particles. It is straightforward to form the different particle sizes using the light reactive deposition approaches described above.

Based on the deposition approaches described above, composition and/or particle morphology can be varied across a layer. As a reactant flows across an electrode, the concentration/activity of the reactant drops. Therefore, it may be desirable to have a higher concentration of catalyst, which can be the electrocatalyst and/or a reformation catalyst, away from the reactant inlet to compensate for the decrease in reactant concentration. This gradient can also be established at an angle to the symmetry axes of the face of the electrode by placing the substrate at a corresponding angle in the coating apparatus. In this way, the current/electrochemical reaction can be more uniform across the cell for improved cell performance. Such a feature is shown schematically in FIG. 25 with an electrode 720 adjacent to electrolyte 722. Flow of reactant is indicated with flow arrow 724, 726. As shown in this figure, there are four stripes with varying catalyst concentration, although other patterns can be used with continuous or stepwise gradients.

In addition to glass and glass-ceramic sealing materials to form ceramic-metal bonds between cells, interconnects, and/or manifolds in fuel cells stacks, laser pyrolysis can be used to synthesize reactive air brazing materials. These materials are typically metal-metal oxide, or cermet, composites, and are advantageous in that a reducing environement is not required to form the seals. Rather, after applying the material to one or both pieces, the seals are formed upon heating in an oxidizing atmosphere. Among compositions shown to form ceramic-metal seals in oxidizing atmospheres are Ag—CuO, Ag—$V_2O_5$, and Pt—$Nb_2O_5$. One or more of these layers can be deposited to create graded seals for improved wetting and thermal expansion matching easily using laser pyrolysis. The thickness of each layer and the overall sealing layer can be easily controlled using principles outlined above/below. Masks or other select area deposition techniques can be used to deposit these layers in sealing regions. Additionally, chemically inert and electrically insulating layers such as $LiAlO_2$ can be first deposited on the cell, interconnect or manifold surfaces to enhance sealing and/or increase seal durability.

The versatility of light reactive deposition processing can be leveraged to obtain desired coating properties, such as number of layers, Cr vapor permeability, electronic conductivity, and adhesion (when thermally cycled) as well as overall compatibility with cathode and anode materials. Coating properties can be selected through their composition and thickness. Base metal thickness can be a useful consideration as there is a trade-off between formability and stability. Thickness on the order of 0.1 to 1 mm are attractive because material costs are reduced, and low-cost manufacturing methods can be employed to form the flow channels. However, thin foils are susceptible to creep, depletion of alloying elements and preferential oxidation.

The structure of the targeted coatings can comprise one or more layers. The target thickness for coatings are from 0.2 to 12 mm. Coating architectures can be selected that prevent Cr vaporization, endure long term exposure and repeated thermal cycling, be compatible with SOFC cathode materials, and maintain a low ASR throughout the required lifetime. The challenge in meeting these requirements in one composition is formidable making a layered approach attractive. The composition of the inner layer at the metal interface can be selected for compatibility with alloying elements and an ability to accommodate any Cr evolved from the alloy without noticeable changes to its electrical conduction or TEC properties, possibly through the use of reactive element dopants such as Y or a conductivity enhancer such as Ni. The outer layer composition can then be optimized for compatibility with LSM, LSF, and LSCF cathodes. Either layer or both can also provide a barrier to Cr vaporization through a combination of composition and thickness. Dopants used for these layers can be transition metals, lanthanides, Y, Nb, Mo, or Zr.

Some specific embodiments are in the following Table.

| variable | proposed range |
| --- | --- |
| base alloy type | ANSI 446, E-brite |
| base alloy thickness | 1 mm |
| number of layers in coating | 1 to 10 |
| barrier layer composition | $(La_{1-x-y}Sr_xMe_y')(Cr_{1-x''-y''}Mn_{x''}Me''_{y''})O_3$ |
| barrier layer thickness | 0.2 to 6 μm |
| interfacial layer composition | $(La_{1-x-y}Sr_xMe_y')(Cr_{1-x''-y''}Me''_{x''}Me'''_{y''})O_3$ |
| interfacial layer thickness | 0.2 to 6 μm |

EXAMPLES

Example 1

Laser Pyrolysis Synthesis of Relevant Powders with Aerosol Precursors

This example demonstrates the synthesis of lithium nickel cobalt oxide by laser pyrolysis with an aerosol. Laser pyrolysis was carried out using a reaction chamber essentially as described above with respect to FIGS. 1, 3 and 4.

Lithium nitrate ($Li(NO_3)$) (99%, 1.1 molar), $(Ni(NO_3) \times 6H_2O)$ (technical grade, 0.7 molar), and $(Co(NO_3) \times 6H_2O)$ (ACS grade, 0.2 molar) precursor was dissolved in deionized water. The aluminum nitrate precursor was obtained from Alfa Aesar, Inc., Ward Hill, Mass. The solution was stirred on a hot plate using a magnetic stirrer. The aqueous metal precursor solutions were carried into the reaction chamber as an aerosol. $C_2H_4$ gas was used as a laser absorbing gas, and nitrogen was used as an inert diluent gas. The reactant mixture containing the metal precursors, $N_2$, $O_2$ and $C_2H_4$ was introduced into the reactant nozzle for injection into the reaction chamber. Additional parameters of the laser pyrolysis synthesis relating to the particles of Example 1 are specified in Table 1.

TABLE 1

| | 1 |
| --- | --- |
| Pressure (Torr) | 180 |
| Nitrogen F.R.-Window (SLM) | 5 |
| Argon F.R.-Shielding (SLM) | 32 |
| Ethylene (SLM) | 2 |
| Diluent Gas (Nitrogen) (SLM) | 11 |
| Oxygen (SLM) | 5 |
| Laser Input (Watts) | 1700 |
| Laser Output (Watts) | 1420 |
| Production Rate (g/hr) | 1.3 |
| Precursor Delivery Rate to Atomizer (ml/min) | 1.6 |
| Surface Area of Powders (m²/g) | 43 |

Figure 25:
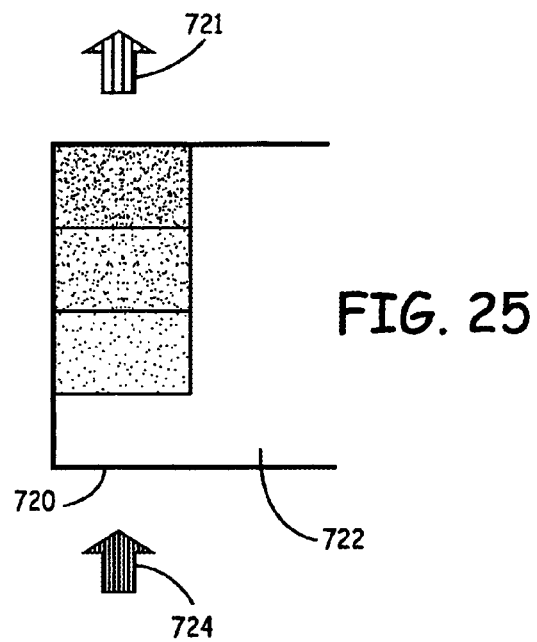
FIG. 25 is a sectional view of a fuel cell electrode and electrolyte layer with the electrode having increasing catalyst concentrations downstream from the reactant flow.

To evaluate the atomic arrangement, the samples were examined by x-ray diffraction using the Cr(Kα) radiation line on a Rigaku Miniflex x-ray diffractometer. X-ray diffractograms for a sample produced under the conditions specified in column 1 of Table 1 are shown in FIG. 25. In each of the samples, crystalline phases were identified that corresponded to $Ni_{1-x}Co_xO$ and $Li_2CO_3$ by comparison with known diffractograms.

Example 2

This example demonstrates the synthesis of aluminum doped lithium manganese oxides and LiAlO2 by laser pyrolysis with an aerosol. Laser pyrolysis was carried out using a reaction chamber essentially as described above with respect to FIGS. 1, 3 and 4.

Lithium nitrate ($Li(NO_3)$) (99%, 2.3 molar or 2.6 M), (Mn ($NO_3$) solution) (50 w/w, 2.3 molar or 1.9 M), and $(Al(NO_3) \times 9H_2O)$ (99.999%, 2.3 molar or 0.1 M) precursor was dissolved in deionized water. The aluminum nitrate precursor was obtained from Alfa Aesar, Inc., Ward Hill, Mass. The solution was stirred on a hot plate using a magnetic stirrer. The aqueous metal precursor solutions were carried into the reaction chamber as an aerosol. $C_2H_4$ gas was used as a laser absorbing gas, and nitrogen was used as an inert diluent gas. The reactant mixture containing the metal precursors, $N_2$, $O_2$ and $C_2H_4$ was introduced into the reactant nozzle for injection into the reaction chamber. Additional parameters of the laser pyrolysis synthesis relating to the particles of Example 1 are specified in Table 2.

TABLE 2

| | 1 | 2 |
| --- | --- | --- |
| Pressure (Torr) | 600 | 150 |
| Nitrogen F.R.-Window (SLM) | 2 | 5 |
| Nitrogen F.R.-Shielding (SLM) | 10 | 20 (Argon) |
| Ethylene (SLM) | 0.8 | 4.8 |
| Diluent Gas (argon) (SLM) | 4.8 | 12 |
| Oxygen (SLM) | 1.4 | 6.3 |
| Laser Input (Watts) | 390 | 1200 |
| Laser Output (Watts) | 330 | 850 |
| Production Rate (g/hr) | 4.9 | 3.0 |
| Precursor Delivery Rate to Atomizer* (ml/min) | 0.44 | 2.13 |

Argon - Win. = argon flow past windows 412.
Argon - Sld. = argon flow through slot 462.
*A majority of the aerosol precursor returns down the nozzle and is recycled.

Figure 27:
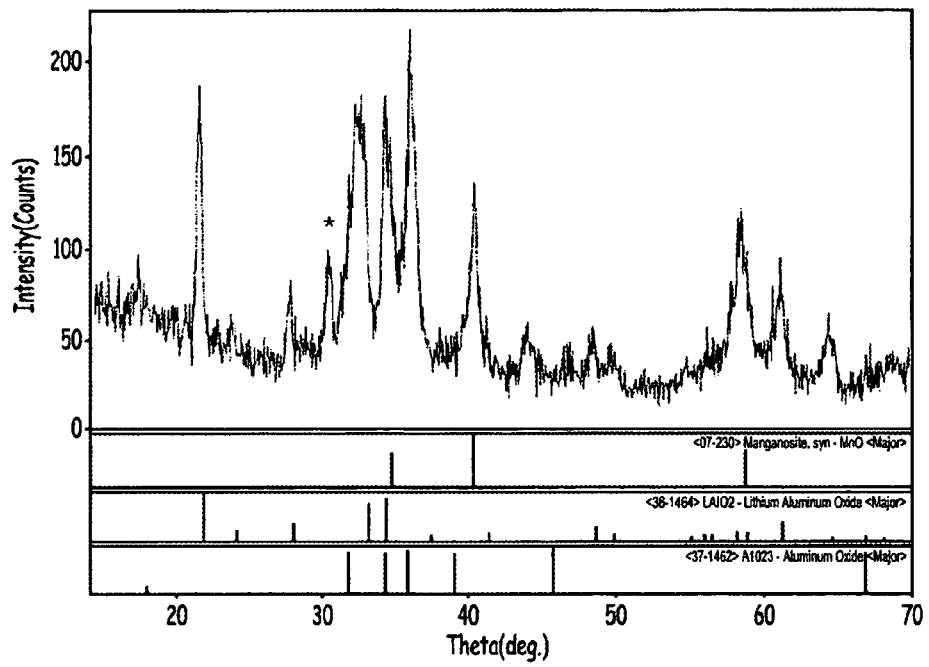
FIG. 27 is an x-ray diffractogram for a sample produced under the conditions specified in column 1 of Table 2.
Figure 28:
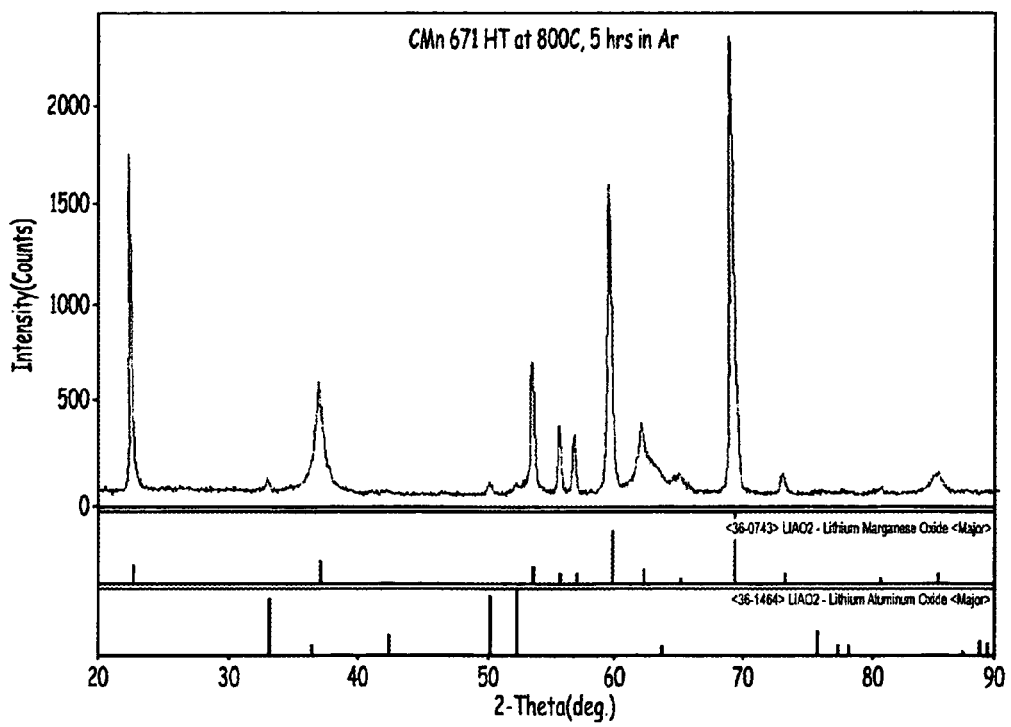
FIG. 28 is an x-ray diffractogram for a sample produced under the conditins specified in column 2 of Table 2.

After synthesis, sample 2 was heat treated at 800° C. for 5 hrs in an Ar atmosphere. To evaluate the atomic arrangement, the samples were examined by x-ray diffraction using the Cr(Kα) radiation line on a Rigaku Miniflex x-ray diffractometer. X-ray diffractograms for a sample produced under the conditions specified in column 1 and 2 of Table 1 are shown in FIG. 27 and 28, respectively noted 1 and 2 corresponding to samples 1 and 2. In each of the samples, crystalline phases were identified that corresponded to MnO, $Li_2CO_3$, gamma-$LiAlO_2$, and orthorhombic $LiMnO_2$, by comparison with known diffractograms.

As utilized herein, the term "in the range(s)" or "between" comprises the range defined by the values listed after the term "in the range(s)" or "between", as well as any and all subranges contained within such range, where each such subrange is defined as having as a first endpoint any value in such range, and as a second endpoint any value in such range that is greater than the first endpoint and that is in such range.

The embodiments described above are intended to be illustrative and not limiting. Additional embodiments are within the claims below. Although the present invention has been described with reference to specific embodiments, workers skilled in the art will recognize that changes may be made in form and detail without departing from the spirit and scope of the invention. In addition, the terms including, comprising and having as used herein are intended to have broad non-limiting scope.

What we claim is:

1. A method for forming an electrochemical cell, the method comprising performing the sequential reactive deposition of an elemental metal or metal alloy, and a metalloid oxide, wherein the reactive deposition comprises moving a substrate or platen relative to a product flow for at least a portion of the time period when deposition is being performed and wherein the sequential reactive depositions are performed with respect to a single reaction zone, wherein a reactant flow intersects with a light beam to drive a reaction that forms the product flow and wherein the reactant flow is generated from an inlet nozzle.

2. The method of claim 1 wherein the metalloid oxide comprises silicon oxide.

3. The method of claim 1 wherein the sequential deposition is performed on a metal support layer.

4. The method of claim 1 wherein the elemental metal or alloy comprises copper.

5. The method of claim 1 wherein the reactant flow comprises an aerosol.

6. A method for forming a fuel cell component, the method comprising contacting a cell assembly with a solvent to dissolve a soluble material and to form reactant flow channels to an electrode wherein the soluble material is deposited from a reactive flow involving a reactant stream that intersects a light beam to form a product flow that intersects with the substrate to deposit a reaction product onto the substrate.

7. The method of claim 6 wherein the soluble material comprises a soluble metal/metalloid composition.

8. A method of sealing fuel cells comprising heating a stack of cells wherein each cell has a rim that contacts the rim of an adjacent cell and wherein a sealing material is deposited along the rim, the sealing material having been deposited from a reactive flow wherein the reactive flow involves a reactant flow that intersects a light beam that drives a reaction to form a product flow that intersects a substrate to deposit the product material.

9. The method of claim 8 wherein the sealing material is a glass.

10. The method of claim 8 wherein the sealing material comprises a metal ceramic.

* * * * *